(12) United States Patent
Emery et al.

(10) Patent No.: US 12,521,574 B2
(45) Date of Patent: Jan. 13, 2026

(54) SYSTEMS AND METHODS FOR ENHANCING EFFICACY OF ULTRASOUND TREATMENT

(71) Applicant: Ulthera, Inc., Mesa, AZ (US)

(72) Inventors: Charles D. Emery, Gilbert, AZ (US); Wohsing P. Chen, Chandler, AZ (US); Robert B. A. Adamson, Halifax (CA); Peeter Hugo Vihvelin, Sambro Creek (CA); Daniel Zaenker, Halifax (CA); Nicholas A. Campbell, Halifax (CA); Matthew A. Wright, Halifax (CA); Jeffrey R. Leadbetter, Halifax (CA); Jeremy A. Brown, Halifax (CA)

(73) Assignee: Ulthera, Inc., Mesa, AZ (US)

( * ) Notice: Subject to any disclaimer, the term of this patent is extended or adjusted under 35 U.S.C. 154(b) by 1073 days.

(21) Appl. No.: 17/297,145

(22) PCT Filed: Nov. 25, 2019

(86) PCT No.: PCT/US2019/063095
§ 371 (c)(1),
(2) Date: May 26, 2021

(87) PCT Pub. No.: WO2020/112688
PCT Pub. Date: Jun. 4, 2020

(65) Prior Publication Data
US 2022/0023670 A1   Jan. 27, 2022

Related U.S. Application Data

(60) Provisional application No. 62/773,948, filed on Nov. 30, 2018.

(51) Int. Cl.
*A61N 7/02* (2006.01)
*A61N 7/00* (2006.01)
(Continued)

(52) U.S. Cl.
CPC .............. *A61N 7/02* (2013.01); *H03F 3/193* (2013.01); *H03F 3/2173* (2013.01);
(Continued)

(58) Field of Classification Search
None
See application file for complete search history.

(56) References Cited

U.S. PATENT DOCUMENTS

| 2,427,348 A | 9/1947 | Bond et al. |
| 2,792,829 A | 5/1957 | Calosi |

(Continued)

FOREIGN PATENT DOCUMENTS

| CN | 2460061 | 11/2001 |
| CN | 1734284 | 12/2009 |

(Continued)

OTHER PUBLICATIONS

US 10,398,895 B2, 09/2019, Schwarz (withdrawn)
(Continued)

*Primary Examiner* — Michael J Carey
*Assistant Examiner* — Marjan Saboktakin
(74) *Attorney, Agent, or Firm* — Knobbe, Martens, Olson & Bear, LLP

(57) ABSTRACT

Embodiments are provided that enhance ultrasound efficacy by for example, high efficiency, signal measurement, calibration, and assurance systems with a control system radio-frequency (RE) driver configured to drive one or more focused ultrasound transducers. The RE driver can comprise one or more power amplifiers including one or more III-V semiconductors, (e.g., gallium nitride GaN, GaAs, GaSb, InP, InAs, InSb, InGaAs, AlSb, AlGaAs, and/or AlGaN) field-effect transistors to efficiently provide high power with distinct narrow-band RE signals over a wide frequency range. The RE driver can include a power measurement
(Continued)

and/or calibration system to monitor the amplitude and phase of the RF signal output from the power amplifier and estimate the amount of RF power delivered to the ultrasound transducers.

19 Claims, 29 Drawing Sheets

(51) Int. Cl.
*B06B 1/02* (2006.01)
*B06B 1/06* (2006.01)
*H03F 1/56* (2006.01)
*H03F 3/193* (2006.01)
*H03F 3/217* (2006.01)

(52) U.S. Cl.
CPC ..... *A61N 2007/0095* (2013.01); *B06B 1/0207* (2013.01); *B06B 1/0644* (2013.01); *B06B 2201/76* (2013.01); *H03F 1/565* (2013.01)

(56) References Cited

U.S. PATENT DOCUMENTS

| | | |
|---|---|---|
| 3,913,386 A | 10/1975 | Saglio |
| 3,965,455 A | 6/1976 | Hurwitz |
| 3,992,925 A | 11/1976 | Perilhou |
| 4,039,312 A | 8/1977 | Patru |
| 4,059,098 A | 11/1977 | Murdock |
| 4,101,795 A | 7/1978 | Fukumoto |
| 4,151,834 A | 5/1979 | Sato et al. |
| 4,166,967 A | 9/1979 | Benes et al. |
| 4,211,948 A | 7/1980 | Smith et al. |
| 4,211,949 A | 7/1980 | Brisken et al. |
| 4,213,344 A | 7/1980 | Rose |
| 4,276,491 A | 6/1981 | Daniel |
| 4,315,514 A | 2/1982 | Drewes et al. |
| 4,325,381 A | 4/1982 | Glenn |
| 4,343,301 A | 8/1982 | Indech |
| 4,372,296 A | 2/1983 | Fahim |
| 4,379,145 A | 4/1983 | Masuho et al. |
| 4,381,007 A | 4/1983 | Doss |
| 4,381,787 A | 5/1983 | Hottinger |
| 4,397,314 A | 8/1983 | Vaguine |
| 4,409,839 A | 10/1983 | Taenzer |
| 4,417,170 A | 11/1983 | Benisncasa |
| 4,431,008 A | 2/1984 | Wanner et al. |
| 4,441,486 A | 4/1984 | Pounds |
| 4,452,084 A | 6/1984 | Taenzer |
| 4,484,569 A | 11/1984 | Driller |
| 4,507,582 A | 3/1985 | Glenn |
| 4,513,749 A | 4/1985 | Kino |
| 4,513,750 A | 4/1985 | Heyman et al. |
| 4,527,550 A | 7/1985 | Ruggera et al. |
| 4,528,979 A | 7/1985 | Marchenko |
| 4,534,221 A | 8/1985 | Fife et al. |
| 4,566,459 A | 1/1986 | Umemura et al. |
| 4,567,895 A | 2/1986 | Putzke |
| 4,586,512 A | 5/1986 | Do-Huu |
| 4,587,971 A | 5/1986 | Stolfi |
| 4,601,296 A | 7/1986 | Yerushalmi |
| 4,620,546 A | 11/1986 | Aida et al. |
| 4,637,256 A | 1/1987 | Sugiyama et al. |
| 4,646,756 A | 3/1987 | Watmough |
| 4,663,358 A | 5/1987 | Hyon |
| 4,668,516 A | 5/1987 | Duraffourd et al. |
| 4,672,591 A | 6/1987 | Breimesser et al. |
| 4,680,499 A | 7/1987 | Umemura et al. |
| 4,697,588 A | 10/1987 | Reichenberger |
| 4,754,760 A | 7/1988 | Fukukita et al. |
| 4,757,820 A | 7/1988 | Itoh |
| 4,771,205 A | 9/1988 | Mequio |
| 4,801,459 A | 1/1989 | Liburdy |
| 4,803,625 A | 2/1989 | Fu et al. |
| 4,807,633 A | 2/1989 | Fry |
| 4,817,615 A | 4/1989 | Fukukita et al. |
| 4,858,613 A | 8/1989 | Fry |
| 4,860,732 A | 8/1989 | Hasegawa et al. |
| 4,865,041 A | 9/1989 | Hassler |
| 4,865,042 A | 9/1989 | Umemura |
| 4,867,169 A | 9/1989 | Machida |
| 4,874,562 A | 10/1989 | Hyon |
| 4,875,487 A | 10/1989 | Seppi |
| 4,881,212 A | 11/1989 | Takeuchi |
| 4,891,043 A | 1/1990 | Zeimer et al. |
| 4,893,624 A | 1/1990 | Lele |
| 4,896,673 A | 1/1990 | Rose |
| 4,900,540 A | 2/1990 | Ryan et al. |
| 4,901,729 A | 2/1990 | Saitoh |
| 4,917,096 A | 4/1990 | Englehart |
| 4,932,414 A | 6/1990 | Coleman et al. |
| 4,938,216 A | 7/1990 | Lele |
| 4,938,217 A | 7/1990 | Lele |
| 4,947,046 A | 8/1990 | Kawabata et al. |
| 4,951,653 A | 8/1990 | Fry |
| 4,955,365 A | 9/1990 | Fry |
| 4,958,626 A | 9/1990 | Nambu |
| 4,976,709 A | 12/1990 | Sand |
| 4,979,501 A | 12/1990 | Valchanov |
| 4,992,989 A | 2/1991 | Watanabe et al. |
| 5,012,797 A | 5/1991 | Liang |
| 5,018,508 A | 5/1991 | Fry et al. |
| 5,030,874 A | 7/1991 | Saito et al. |
| 5,036,855 A | 8/1991 | Fry |
| 5,040,537 A | 8/1991 | Katakura |
| 5,054,310 A | 10/1991 | Flynn |
| 5,054,470 A | 10/1991 | Fry |
| 5,054,491 A | 10/1991 | Saito et al. |
| 5,070,879 A | 12/1991 | Herres |
| 5,088,495 A | 2/1992 | Miyagawa |
| 5,115,814 A | 5/1992 | Griffith |
| 5,117,832 A | 6/1992 | Sanghvi |
| 5,123,418 A | 6/1992 | Saurel |
| 5,142,511 A | 8/1992 | Kanai et al. |
| 5,143,063 A | 9/1992 | Fellner |
| 5,143,074 A | 9/1992 | Dory |
| 5,149,319 A | 9/1992 | Unger |
| 5,150,711 A | 9/1992 | Dory |
| 5,150,714 A | 9/1992 | Green |
| 5,152,294 A | 10/1992 | Mochizuki et al. |
| 5,156,144 A | 10/1992 | Iwasaki |
| 5,158,536 A | 10/1992 | Sekins |
| 5,159,931 A | 11/1992 | Pini |
| 5,163,421 A | 11/1992 | Bernstein |
| 5,163,436 A | 11/1992 | Saitoh et al. |
| 5,178,135 A | 1/1993 | Uchiyama et al. |
| 5,190,518 A | 3/1993 | Takasu |
| 5,190,766 A | 3/1993 | Ishihara |
| 5,191,880 A | 3/1993 | McLeod |
| 5,205,287 A | 4/1993 | Erbel et al. |
| 5,209,720 A | 5/1993 | Unger |
| 5,212,671 A | 5/1993 | Fujii et al. |
| 5,215,680 A | 6/1993 | D'Arrigo |
| 5,224,467 A | 7/1993 | Oku |
| 5,230,334 A | 7/1993 | Klopotek |
| 5,230,338 A | 7/1993 | Allen et al. |
| 5,247,924 A | 9/1993 | Suzuki et al. |
| 5,255,681 A | 10/1993 | Ishimura et al. |
| 5,257,970 A | 11/1993 | Dougherty |
| 5,265,614 A | 11/1993 | Hayakawa |
| 5,267,985 A | 12/1993 | Shimada |
| 5,269,297 A | 12/1993 | Weng |
| 5,282,797 A | 2/1994 | Chess |
| 5,295,484 A | 3/1994 | Marcus |
| 5,295,486 A | 3/1994 | Wollschlager et al. |
| 5,304,169 A | 4/1994 | Sand |
| 5,305,756 A | 4/1994 | Entrekin et al. |
| 5,321,520 A | 6/1994 | Inga et al. |
| 5,323,779 A | 6/1994 | Hardy et al. |
| 5,327,895 A | 7/1994 | Hashimoto et al. |
| 5,329,202 A | 7/1994 | Garlick et al. |
| 5,348,016 A | 9/1994 | Unger et al. |
| 5,358,466 A | 10/1994 | Aida et al. |
| 5,360,268 A | 11/1994 | Hayashi |

(56) References Cited

U.S. PATENT DOCUMENTS

| | | |
|---|---|---|
| 5,370,121 A | 12/1994 | Reichenberger |
| 5,370,122 A | 12/1994 | Kunig |
| 5,371,483 A | 12/1994 | Bhardwaj |
| 5,375,602 A | 12/1994 | Lancee et al. |
| 5,379,773 A | 1/1995 | Hornsby |
| 5,380,280 A | 1/1995 | Peterson |
| 5,380,519 A | 1/1995 | Schneider et al. |
| 5,383,917 A | 1/1995 | Desai et al. |
| 5,391,140 A | 2/1995 | Schaetzle et al. |
| 5,391,197 A | 2/1995 | Burdette et al. |
| 5,392,259 A | 2/1995 | Bolorforosh |
| 5,396,143 A | 3/1995 | Seyed-Bolorforosh et al. |
| 5,398,689 A | 3/1995 | Connor et al. |
| 5,406,503 A | 4/1995 | Williams |
| 5,413,550 A | 5/1995 | Castel |
| 5,417,216 A | 5/1995 | Tanaka |
| 5,419,327 A | 5/1995 | Rohwedder et al. |
| 5,423,220 A | 6/1995 | Finsterwald et al. |
| 5,435,311 A | 7/1995 | Umemura |
| 5,438,998 A | 8/1995 | Hanafy |
| 5,443,068 A | 8/1995 | Cline et al. |
| 5,445,611 A | 8/1995 | Eppstein et al. |
| 5,458,596 A | 10/1995 | Lax |
| 5,460,179 A | 10/1995 | Okunuki et al. |
| 5,460,595 A | 10/1995 | Hall et al. |
| 5,469,854 A | 11/1995 | Unger et al. |
| 5,471,488 A | 11/1995 | Bender |
| 5,472,405 A | 12/1995 | Buchholtz et al. |
| 5,487,388 A | 1/1996 | Rello et al. |
| 5,492,126 A | 2/1996 | Hennige |
| 5,496,256 A | 3/1996 | Bock |
| 5,501,655 A | 3/1996 | Rolt |
| 5,503,152 A | 4/1996 | Oakley et al. |
| 5,503,320 A | 4/1996 | Webster et al. |
| 5,507,790 A | 4/1996 | Weiss |
| 5,511,296 A | 4/1996 | Dias et al. |
| 5,520,188 A | 5/1996 | Hennige |
| 5,522,869 A | 6/1996 | Burdette |
| 5,523,058 A | 6/1996 | Umemura et al. |
| 5,524,620 A | 6/1996 | Rosenchein |
| 5,524,624 A | 6/1996 | Tepper |
| 5,524,625 A | 6/1996 | Okazaki |
| 5,526,624 A | 6/1996 | Berg |
| 5,526,812 A | 6/1996 | Dumoulin et al. |
| 5,526,814 A | 6/1996 | Cline et al. |
| 5,526,815 A | 6/1996 | Granz |
| 5,529,070 A | 6/1996 | Augustine et al. |
| 5,540,235 A | 7/1996 | Wilson |
| 5,558,092 A | 9/1996 | Unger |
| 5,560,362 A | 10/1996 | Sliwa et al. |
| 5,573,497 A | 11/1996 | Chapelon |
| 5,575,291 A | 11/1996 | Hayakawa |
| 5,575,807 A | 11/1996 | Faller |
| 5,577,502 A | 11/1996 | Darrow et al. |
| 5,577,507 A | 11/1996 | Snyder et al. |
| 5,577,991 A | 11/1996 | Akui et al. |
| 5,580,575 A | 12/1996 | Unger et al. |
| 5,601,526 A | 2/1997 | Chapelon |
| 5,603,323 A | 2/1997 | Pflugrath et al. |
| 5,605,154 A | 2/1997 | Ries et al. |
| 5,609,562 A | 3/1997 | Kaali |
| 5,615,091 A | 3/1997 | Palatnik |
| 5,617,858 A | 4/1997 | Taverna et al. |
| 5,618,275 A | 4/1997 | Bock |
| 5,620,479 A | 4/1997 | Diederich |
| 5,622,175 A | 4/1997 | Sudol et al. |
| 5,638,819 A | 6/1997 | Manwaring et al. |
| 5,643,179 A | 7/1997 | Fujimoto |
| 5,644,085 A | 7/1997 | Lorraine et al. |
| 5,647,373 A | 7/1997 | Paltieli |
| 5,655,535 A | 8/1997 | Frlemel et al. |
| 5,655,538 A | 8/1997 | Lorraine |
| 5,657,760 A | 8/1997 | Ying |
| 5,658,328 A | 8/1997 | Johnson |
| 5,660,836 A | 8/1997 | Knowlton |
| 5,662,116 A | 9/1997 | Kondo |
| 5,665,053 A | 9/1997 | Jacobs |
| 5,665,141 A | 9/1997 | Vago |
| 5,671,746 A | 9/1997 | Dreschel et al. |
| 5,673,699 A | 10/1997 | Trahey et al. |
| 5,676,692 A | 10/1997 | Sanghvi |
| 5,685,820 A | 11/1997 | Riek et al. |
| 5,690,608 A | 11/1997 | Watanabe |
| 5,694,936 A | 12/1997 | Fujimoto |
| 5,697,897 A | 12/1997 | Buchholtz |
| 5,701,900 A | 12/1997 | Shehada et al. |
| 5,704,361 A | 1/1998 | Seward et al. |
| 5,706,252 A | 1/1998 | Le Verrier et al. |
| 5,706,564 A | 1/1998 | Rhyne |
| 5,715,823 A | 2/1998 | Wood et al. |
| 5,720,287 A | 2/1998 | Chapelon et al. |
| 5,722,411 A | 3/1998 | Suzuki |
| 5,727,554 A | 3/1998 | Kalend et al. |
| 5,735,280 A | 4/1998 | Sherman et al. |
| 5,740,804 A | 4/1998 | Cerofolini |
| 5,743,863 A | 4/1998 | Chapelon |
| 5,746,005 A | 5/1998 | Steinberg |
| 5,746,762 A | 5/1998 | Bass |
| 5,748,767 A | 5/1998 | Raab |
| 5,749,364 A | 5/1998 | Sliwa et al. |
| 5,755,228 A | 5/1998 | Wilson et al. |
| 5,755,753 A | 5/1998 | Knowlton |
| 5,762,066 A | 6/1998 | Law |
| 5,763,886 A | 6/1998 | Schulte |
| 5,769,790 A | 6/1998 | Watkins |
| 5,779,644 A | 7/1998 | Eberle et al. |
| 5,792,058 A | 8/1998 | Lee |
| 5,795,297 A | 8/1998 | Daigle |
| 5,795,311 A | 8/1998 | Wess |
| 5,810,009 A | 9/1998 | Mine et al. |
| 5,810,888 A | 9/1998 | Fenn |
| 5,814,599 A | 9/1998 | Mitragotri et al. |
| 5,817,013 A | 10/1998 | Ginn et al. |
| 5,817,021 A | 10/1998 | Reichenberger |
| 5,820,564 A | 10/1998 | Slayton |
| 5,823,962 A | 10/1998 | Schaetzle |
| 5,827,204 A | 10/1998 | Grandia et al. |
| 5,840,032 A | 11/1998 | Hatfield et al. |
| 5,844,140 A | 12/1998 | Seale |
| 5,853,367 A | 12/1998 | Chalek et al. |
| 5,866,024 A | 2/1999 | de Villeneuve |
| 5,869,751 A | 2/1999 | Bonin |
| 5,871,524 A | 2/1999 | Knowlton |
| 5,873,902 A | 2/1999 | Sanghvi |
| 5,876,341 A | 3/1999 | Wang et al. |
| 5,879,303 A | 3/1999 | Averkiou et al. |
| 5,882,557 A | 3/1999 | Hayakawa |
| 5,884,627 A | 3/1999 | Wakabayashi et al. |
| 5,891,034 A | 4/1999 | Bucholz |
| 5,895,356 A | 4/1999 | Andrus et al. |
| 5,899,861 A | 5/1999 | Friemel et al. |
| 5,904,659 A | 5/1999 | Duarte |
| 5,919,219 A | 7/1999 | Knowlton |
| 5,923,099 A | 7/1999 | Bili |
| 5,924,989 A | 7/1999 | Polz |
| 5,928,169 A | 7/1999 | Schatzle et al. |
| 5,931,805 A | 8/1999 | Brisken |
| 5,938,606 A | 8/1999 | Bonnefous |
| 5,938,612 A | 8/1999 | Kline-Schoder |
| 5,948,011 A | 9/1999 | Knowlton |
| 5,957,844 A | 9/1999 | Dekel |
| 5,957,882 A | 9/1999 | Nita et al. |
| 5,957,941 A | 9/1999 | Ream |
| 5,964,707 A | 10/1999 | Fenster et al. |
| 5,967,980 A | 10/1999 | Ferre et al. |
| 5,968,034 A | 10/1999 | Fullmer |
| 5,971,949 A | 10/1999 | Levin |
| 5,977,538 A | 11/1999 | Unger et al. |
| 5,984,881 A | 11/1999 | Ishibashi et al. |
| 5,984,882 A | 11/1999 | Rosenchein |
| 5,990,598 A | 11/1999 | Sudol et al. |
| 5,997,471 A | 12/1999 | Gumb et al. |
| 5,997,497 A | 12/1999 | Nita et al. |
| 5,999,843 A | 12/1999 | Anbar |

(56) References Cited

U.S. PATENT DOCUMENTS

| | | |
|---|---|---|
| 6,004,262 A | 12/1999 | Putz et al. |
| 6,007,499 A | 12/1999 | Martin et al. |
| 6,013,032 A | 1/2000 | Savord |
| 6,014,473 A | 1/2000 | Hossack et al. |
| 6,016,255 A | 1/2000 | Bolan et al. |
| 6,019,724 A | 2/2000 | Gronningsaeter et al. |
| 6,022,308 A | 2/2000 | Williams |
| 6,022,317 A | 2/2000 | Cruanas et al. |
| 6,022,327 A | 2/2000 | Chang |
| 6,030,374 A | 2/2000 | McDaniel |
| 6,036,646 A | 3/2000 | Barthe |
| 6,039,048 A | 3/2000 | Silberg |
| 6,039,689 A | 3/2000 | Lizzi |
| 6,042,556 A | 3/2000 | Beach |
| 6,049,159 A | 4/2000 | Barthe |
| 6,050,943 A | 4/2000 | Slayton |
| 6,059,727 A | 5/2000 | Fowlkes |
| 6,071,239 A | 6/2000 | Cribbs |
| 6,080,108 A | 6/2000 | Dunham |
| 6,083,148 A | 7/2000 | Williams |
| 6,086,535 A | 7/2000 | Ishibashi |
| 6,086,580 A | 7/2000 | Mordon et al. |
| 6,090,054 A | 7/2000 | Tagishi |
| 6,093,148 A | 7/2000 | Fujimoto |
| 6,093,883 A | 7/2000 | Sanghvi |
| 6,100,626 A | 8/2000 | Frey et al. |
| 6,101,407 A | 8/2000 | Groezinger |
| 6,106,469 A | 8/2000 | Suzuki et al. |
| 6,113,558 A | 9/2000 | Rosenchein |
| 6,113,559 A | 9/2000 | Klopotek |
| 6,120,452 A | 9/2000 | Barthe |
| 6,123,081 A | 9/2000 | Durette |
| 6,126,619 A | 10/2000 | Peterson et al. |
| 6,135,971 A | 10/2000 | Hutchinson |
| 6,139,499 A | 10/2000 | Wilk |
| 6,159,150 A | 12/2000 | Yale et al. |
| 6,171,244 B1 | 1/2001 | Finger et al. |
| 6,176,840 B1 | 1/2001 | Nishimura |
| 6,183,426 B1 | 2/2001 | Akisada |
| 6,183,502 B1 | 2/2001 | Takeuchi |
| 6,183,773 B1 | 2/2001 | Anderson |
| 6,190,323 B1 | 2/2001 | Dias |
| 6,190,336 B1 | 2/2001 | Duarte |
| 6,193,658 B1 | 2/2001 | Wendelken |
| 6,198,956 B1 | 3/2001 | Dunne |
| 6,210,327 B1 | 4/2001 | Brackett et al. |
| 6,213,948 B1 | 4/2001 | Barthe |
| 6,216,029 B1 | 4/2001 | Paltieli |
| 6,233,476 B1 | 5/2001 | Strommer et al. |
| 6,234,990 B1 | 5/2001 | Rowe et al. |
| 6,241,753 B1 | 6/2001 | Knowlton |
| 6,246,898 B1 | 6/2001 | Vesely et al. |
| 6,251,074 B1 | 6/2001 | Averkiou et al. |
| 6,251,088 B1 | 6/2001 | Kaufman et al. |
| 6,268,405 B1 | 7/2001 | Yao |
| 6,273,864 B1 | 8/2001 | Duarte |
| 6,280,402 B1 | 8/2001 | Ishibashi et al. |
| 6,287,257 B1 | 9/2001 | Matichuk |
| 6,287,304 B1 | 9/2001 | Eggers et al. |
| 6,296,619 B1 | 10/2001 | Brisken |
| 6,301,989 B1 | 10/2001 | Brown et al. |
| 6,307,302 B1 | 10/2001 | Toda |
| 6,309,355 B1 | 10/2001 | Cain et al. |
| 6,311,090 B1 | 10/2001 | Knowlton |
| 6,315,741 B1 | 11/2001 | Martin |
| 6,322,509 B1 | 11/2001 | Pan et al. |
| 6,322,532 B1 | 11/2001 | D'Sa |
| 6,325,540 B1 | 12/2001 | Lounsberry et al. |
| 6,325,758 B1 | 12/2001 | Carol et al. |
| 6,325,769 B1 | 12/2001 | Klopotek |
| 6,325,798 B1 | 12/2001 | Edwards et al. |
| 6,338,716 B1 | 1/2002 | Hossack |
| 6,350,276 B1 | 2/2002 | Knowlton |
| 6,356,780 B1 | 3/2002 | Licato et al. |
| 6,361,531 B1 | 3/2002 | Hissong |
| 6,370,411 B1 | 4/2002 | Osadchy et al. |
| 6,375,672 B1 | 4/2002 | Aksan |
| 6,377,854 B1 | 4/2002 | Knowlton |
| 6,377,855 B1 | 4/2002 | Knowlton |
| 6,381,497 B1 | 4/2002 | Knowlton |
| 6,381,498 B1 | 4/2002 | Knowlton |
| 6,387,380 B1 | 5/2002 | Knowlton |
| 6,390,982 B1 | 5/2002 | Bova et al. |
| 6,405,090 B1 | 6/2002 | Knowlton |
| 6,409,720 B1 | 6/2002 | Hissong |
| 6,413,216 B1 | 7/2002 | Cain et al. |
| 6,413,253 B1 | 7/2002 | Koop |
| 6,413,254 B1 | 7/2002 | Hissong |
| 6,419,648 B1 | 7/2002 | Vitek |
| 6,423,007 B2 | 7/2002 | Lizzi et al. |
| 6,425,865 B1 | 7/2002 | Salcudean |
| 6,425,867 B1 | 7/2002 | Vaezy |
| 6,425,912 B1 | 7/2002 | Knowlton |
| 6,428,477 B1 | 8/2002 | Mason |
| 6,428,532 B1 | 8/2002 | Doukas |
| 6,430,446 B1 | 8/2002 | Knowlton |
| 6,432,057 B1 | 8/2002 | Mazess et al. |
| 6,432,067 B1 | 8/2002 | Martin |
| 6,432,101 B1 | 8/2002 | Weber |
| 6,436,061 B1 | 8/2002 | Costantino |
| 6,438,424 B1 | 8/2002 | Knowlton |
| 6,440,071 B1 | 8/2002 | Slayton |
| 6,440,121 B1 | 8/2002 | Weber |
| 6,443,914 B1 | 9/2002 | Costantino |
| 6,447,443 B1 | 9/2002 | Keogh et al. |
| 6,450,979 B1 | 9/2002 | Miwa et al. |
| 6,451,013 B1 | 9/2002 | Bays et al. |
| 6,453,202 B1 | 9/2002 | Knowlton |
| 6,461,304 B1 | 10/2002 | Tanaka et al. |
| 6,461,378 B1 | 10/2002 | Knowlton |
| 6,470,216 B1 | 10/2002 | Knowlton |
| 6,485,420 B1 | 11/2002 | Bullis |
| 6,488,626 B1 | 12/2002 | Lizzi |
| 6,491,657 B2 | 12/2002 | Rowe |
| 6,500,121 B1 | 12/2002 | Slayton |
| 6,500,141 B1 | 12/2002 | Irion |
| 6,506,171 B1 | 1/2003 | Vitek et al. |
| 6,508,774 B1 | 1/2003 | Acker |
| 6,511,427 B1 | 1/2003 | Sliwa, Jr. et al. |
| 6,511,428 B1 | 1/2003 | Azuma |
| 6,514,244 B2 | 2/2003 | Pope |
| 6,517,484 B1 | 2/2003 | Wilk |
| 6,524,250 B1 | 2/2003 | Weber |
| 6,540,679 B2 | 4/2003 | Slayton |
| 6,540,685 B1 | 4/2003 | Rhoads et al. |
| 6,540,700 B1 | 4/2003 | Fujimoto et al. |
| 6,547,788 B1 | 4/2003 | Maguire et al. |
| 6,554,771 B1 | 4/2003 | Buil et al. |
| 6,569,099 B1 | 5/2003 | Babaev |
| 6,569,108 B2 | 5/2003 | Sarvazyan et al. |
| 6,572,552 B2 | 6/2003 | Fukukita |
| 6,575,956 B1 | 6/2003 | Brisken et al. |
| 6,595,934 B1 | 7/2003 | Hissong |
| 6,599,256 B1 | 7/2003 | Acker |
| 6,605,043 B1 | 8/2003 | Dreschel |
| 6,605,080 B1 | 8/2003 | Altshuler et al. |
| 6,607,498 B2 | 8/2003 | Eshel |
| 6,618,620 B1 | 9/2003 | Freundlich et al. |
| 6,623,430 B1 | 9/2003 | Slayton |
| 6,626,854 B2 | 9/2003 | Friedman |
| 6,626,855 B1 | 9/2003 | Weng |
| 6,638,226 B2 | 10/2003 | He et al. |
| 6,645,145 B1 | 11/2003 | Dreschel et al. |
| 6,645,150 B2 | 11/2003 | Angelsen et al. |
| 6,645,162 B2 | 11/2003 | Friedman |
| 6,662,054 B2 | 12/2003 | Kreindel |
| 6,663,627 B2 | 12/2003 | Francischelli |
| 6,665,806 B1 | 12/2003 | Shimizu |
| 6,666,835 B2 | 12/2003 | Martin |
| 6,669,638 B1 | 12/2003 | Miller |
| 6,673,017 B1 | 1/2004 | Jackson |
| 6,685,639 B1 | 2/2004 | Wang et al. |
| 6,685,640 B1 | 2/2004 | Fry |
| 6,692,450 B1 | 2/2004 | Coleman |

(56) References Cited

U.S. PATENT DOCUMENTS

| | | |
|---|---|---|
| 6,699,237 B2 | 3/2004 | Weber |
| 6,716,184 B2 | 4/2004 | Vaezy et al. |
| 6,719,449 B1 | 4/2004 | Laughlin |
| 6,719,694 B2 | 4/2004 | Weng |
| 6,726,627 B1 | 4/2004 | Lizzi et al. |
| 6,733,449 B1 | 5/2004 | Krishnamurthy et al. |
| 6,749,624 B2 | 6/2004 | Knowlton |
| 6,772,490 B2 | 8/2004 | Toda |
| 6,773,409 B2 | 8/2004 | Truckai et al. |
| 6,775,404 B1 | 8/2004 | Pagoulatos et al. |
| 6,790,187 B2 | 9/2004 | Thompson et al. |
| 6,824,516 B2 | 11/2004 | Batten et al. |
| 6,825,176 B2 | 11/2004 | White et al. |
| 6,835,940 B2 | 12/2004 | Morikawa et al. |
| 6,846,290 B2 | 1/2005 | Lizzi et al. |
| 6,875,176 B2 | 4/2005 | Mourad et al. |
| 6,882,884 B1 | 4/2005 | Mosk et al. |
| 6,887,239 B2 | 5/2005 | Elstrom |
| 6,887,260 B1 | 5/2005 | McDaniel |
| 6,889,089 B2 | 5/2005 | Behl |
| 6,896,657 B2 | 5/2005 | Willis |
| 6,902,536 B2 | 6/2005 | Manna |
| 6,905,466 B2 | 6/2005 | Salgo |
| 6,918,907 B2 | 7/2005 | Kelly |
| 6,920,883 B2 | 7/2005 | Bessette |
| 6,921,371 B2 | 7/2005 | Wilson |
| 6,932,771 B2 | 8/2005 | Whitmore |
| 6,932,814 B2 | 8/2005 | Wood |
| 6,936,044 B2 | 8/2005 | McDaniel |
| 6,936,046 B2 | 8/2005 | Hissong |
| 6,945,937 B2 | 9/2005 | Culp et al. |
| 6,948,843 B2 | 9/2005 | Laugharn et al. |
| 6,953,941 B2 | 10/2005 | Nakano et al. |
| 6,958,043 B2 | 10/2005 | Hissong |
| 6,971,994 B1 | 12/2005 | Young et al. |
| 6,974,417 B2 | 12/2005 | Lockwood |
| 6,976,492 B2 | 12/2005 | Ingle |
| 6,992,305 B2 | 1/2006 | Maezawa et al. |
| 6,997,923 B2 | 2/2006 | Anderson |
| 7,006,874 B2 | 2/2006 | Knowlton |
| 7,020,528 B2 | 3/2006 | Neev |
| 7,022,089 B2 | 4/2006 | Ooba |
| 7,058,440 B2 | 6/2006 | Heuscher et al. |
| 7,063,666 B2 | 6/2006 | Weng |
| 7,070,565 B2 | 7/2006 | Vaezy et al. |
| 7,074,218 B2 | 7/2006 | Washington et al. |
| 7,094,252 B2 | 8/2006 | Koop |
| 7,108,663 B2 | 9/2006 | Talish et al. |
| 7,115,123 B2 | 10/2006 | Knowlton |
| 7,122,029 B2 | 10/2006 | Koop et al. |
| 7,142,905 B2 | 11/2006 | Slayton |
| 7,165,451 B1 | 1/2007 | Brooks et al. |
| 7,179,238 B2 | 2/2007 | Hissong |
| 7,189,230 B2 | 3/2007 | Knowlton |
| 7,229,411 B2 | 6/2007 | Slayton |
| 7,235,592 B2 | 6/2007 | Muratoglu |
| 7,258,674 B2 | 8/2007 | Cribbs |
| 7,273,459 B2 | 9/2007 | Desilets |
| 7,294,125 B2 | 11/2007 | Phalen et al. |
| 7,297,117 B2 | 11/2007 | Trucco |
| 7,303,555 B2 | 12/2007 | Makin et al. |
| 7,311,679 B2 | 12/2007 | Desilets et al. |
| 7,327,071 B2 | 2/2008 | Nishiyama et al. |
| 7,331,951 B2 | 2/2008 | Eshel et al. |
| 7,332,985 B2 | 2/2008 | Larson et al. |
| 7,338,434 B1 | 3/2008 | Haarstad et al. |
| 7,347,855 B2 | 3/2008 | Eshel |
| RE40,403 E | 6/2008 | Cho et al. |
| 7,393,325 B2 | 7/2008 | Barthe |
| 7,398,116 B2 | 7/2008 | Edwards |
| 7,399,279 B2 | 7/2008 | Abend et al. |
| 7,491,171 B2 | 2/2009 | Barthe et al. |
| 7,507,235 B2 | 3/2009 | Keogh et al. |
| 7,510,536 B2 | 3/2009 | Foley et al. |
| 7,517,315 B2 | 4/2009 | Willis |
| 7,530,356 B2 | 5/2009 | Slayton |
| 7,530,958 B2 | 5/2009 | Slayton |
| 7,532,201 B2 | 5/2009 | Quistgaard et al. |
| 7,571,336 B2 | 8/2009 | Barthe |
| 7,601,120 B2 | 10/2009 | Moilanen et al. |
| 7,615,015 B2 | 11/2009 | Coleman |
| 7,615,016 B2 | 11/2009 | Barthe |
| 7,652,411 B2 | 1/2010 | Crunkilton et al. |
| 7,662,114 B2 | 2/2010 | Seip et al. |
| 7,674,257 B2 | 3/2010 | Pless et al. |
| 7,686,763 B2 | 3/2010 | Vaezy et al. |
| 7,694,406 B2 | 4/2010 | Wildes et al. |
| 7,695,437 B2 | 4/2010 | Quistgaard et al. |
| 7,713,203 B2 | 5/2010 | Lacoste et al. |
| 7,727,156 B2 | 6/2010 | Angelsen et al. |
| 7,734,321 B2 | 6/2010 | White |
| 7,758,524 B2 | 7/2010 | Barthe |
| 7,766,848 B2 | 8/2010 | Desilets et al. |
| 7,789,841 B2 | 9/2010 | Huckle et al. |
| 7,806,839 B2 | 10/2010 | Mast et al. |
| 7,815,570 B2 | 10/2010 | Eshel et al. |
| 7,819,826 B2 | 10/2010 | Diederich et al. |
| 7,824,348 B2 | 11/2010 | Barthe |
| 7,828,734 B2 | 11/2010 | Azhari et al. |
| 7,833,162 B2 | 11/2010 | Hasegawa et al. |
| 7,841,984 B2 | 11/2010 | Cribbs et al. |
| 7,846,096 B2 | 12/2010 | Mast et al. |
| 7,857,773 B2 | 12/2010 | Desilets et al. |
| 7,875,023 B2 | 1/2011 | Eshel et al. |
| 7,901,359 B2 | 3/2011 | Mandrusov et al. |
| 7,905,007 B2 | 3/2011 | Calisti et al. |
| 7,905,844 B2 | 3/2011 | Desilets et al. |
| 7,914,453 B2 | 3/2011 | Slayton et al. |
| 7,914,469 B2 | 3/2011 | Torbati |
| 7,955,262 B2 | 6/2011 | Rosenberg |
| 7,955,281 B2 | 6/2011 | Pedersen et al. |
| 7,967,764 B2 | 6/2011 | Lidgren et al. |
| 7,967,839 B2 | 6/2011 | Flock et al. |
| 7,993,289 B2 | 8/2011 | Quistgaard et al. |
| 7,993,331 B2 | 8/2011 | Barzilay et al. |
| 8,057,389 B2 | 11/2011 | Barthe et al. |
| 8,057,465 B2 | 11/2011 | Sliwa, Jr. et al. |
| 8,066,641 B2 | 11/2011 | Barthe et al. |
| 8,123,707 B2 | 2/2012 | Huckle et al. |
| 8,128,618 B2 | 3/2012 | Gliklich et al. |
| 8,133,180 B2 | 3/2012 | Slayton et al. |
| 8,133,191 B2 | 3/2012 | Rosenberg et al. |
| 8,142,200 B2 | 3/2012 | Crunkilton et al. |
| 8,152,904 B2 | 4/2012 | Slobodzian et al. |
| 8,162,858 B2 | 4/2012 | Manna et al. |
| 8,166,332 B2 | 4/2012 | Barthe et al. |
| 8,182,428 B2 | 5/2012 | Angelsen et al. |
| 8,192,362 B2 | 6/2012 | Kolios et al. |
| 8,197,409 B2 | 6/2012 | Foley et al. |
| 8,206,299 B2 | 6/2012 | Foley et al. |
| 8,208,346 B2 | 6/2012 | Crunkilton |
| 8,211,017 B2 | 7/2012 | Foley et al. |
| 8,262,591 B2 | 9/2012 | Pedersen et al. |
| 8,262,650 B2 | 9/2012 | Zanelli et al. |
| 8,264,126 B2 | 9/2012 | Toda et al. |
| 8,273,037 B2 | 9/2012 | Kreindel et al. |
| 8,282,554 B2 | 10/2012 | Makin et al. |
| 8,292,835 B1 | 10/2012 | Cimino |
| 8,298,144 B2 | 10/2012 | Burcher |
| 8,298,163 B1 | 10/2012 | Cimino |
| 8,328,722 B2 | 12/2012 | Bernstein |
| 8,333,700 B1 | 12/2012 | Barthe et al. |
| 8,334,637 B2 | 12/2012 | Crunkilton et al. |
| 8,337,407 B2 | 12/2012 | Quistgaard et al. |
| 8,343,051 B2 | 1/2013 | Desilets et al. |
| 8,366,622 B2 | 2/2013 | Slayton et al. |
| 8,388,535 B2 | 3/2013 | Weng et al. |
| 8,398,549 B2 | 3/2013 | Palmeri et al. |
| 8,409,097 B2 | 4/2013 | Slayton et al. |
| 8,425,435 B2 | 4/2013 | Wing et al. |
| 8,444,562 B2 | 5/2013 | Barthe et al. |
| 8,454,540 B2 | 6/2013 | Eshel et al. |
| 8,460,193 B2 | 6/2013 | Barthe et al. |
| 8,480,585 B2 | 7/2013 | Slayton et al. |

(56) References Cited

U.S. PATENT DOCUMENTS

| | | |
|---|---|---|
| 8,486,001 B2 | 7/2013 | Weyant |
| 8,506,486 B2 | 8/2013 | Slayton et al. |
| 8,512,250 B2 | 8/2013 | Quistgaard et al. |
| 8,523,775 B2 | 9/2013 | Barthe et al. |
| 8,523,849 B2 | 9/2013 | Liu et al. |
| 8,535,228 B2 | 9/2013 | Slayton et al. |
| 8,570,837 B2 | 10/2013 | Toda et al. |
| 8,573,392 B2 | 11/2013 | Bennett et al. |
| 8,579,835 B2 | 11/2013 | Britva et al. |
| 8,583,211 B2 | 11/2013 | Salomir et al. |
| 8,585,618 B2 | 11/2013 | Hunziker et al. |
| 8,604,672 B2 | 12/2013 | Toda et al. |
| 8,622,937 B2 | 1/2014 | Weng et al. |
| 8,636,665 B2 | 1/2014 | Slayton et al. |
| 8,641,622 B2 | 2/2014 | Barthe et al. |
| 8,663,112 B2 | 3/2014 | Slayton et al. |
| 8,672,848 B2 | 3/2014 | Slayton et al. |
| 8,679,039 B2 | 3/2014 | Tieu et al. |
| 8,690,778 B2 | 4/2014 | Slayton et al. |
| 8,690,779 B2 | 4/2014 | Slayton et al. |
| 8,690,780 B2 | 4/2014 | Slayton et al. |
| 8,708,935 B2 | 4/2014 | Barthe et al. |
| 8,715,186 B2 | 5/2014 | Slayton et al. |
| 8,726,781 B2 | 5/2014 | Eckhoff et al. |
| 8,728,071 B2 | 5/2014 | Lischinsky et al. |
| 8,753,278 B2 | 6/2014 | Stoll |
| 8,753,295 B2 | 6/2014 | Thierman |
| 8,758,253 B2 | 6/2014 | Sano et al. |
| 8,761,862 B2 | 6/2014 | Ridley et al. |
| 8,836,203 B2 | 9/2014 | Nobles et al. |
| 8,857,438 B2 | 10/2014 | Barthe et al. |
| 8,858,471 B2 | 10/2014 | Barthe et al. |
| 8,915,853 B2 | 12/2014 | Barthe et al. |
| 8,915,854 B2 | 12/2014 | Slayton et al. |
| 8,915,870 B2 | 12/2014 | Barthe et al. |
| 8,920,320 B2 | 12/2014 | Stecco et al. |
| 8,920,324 B2 | 12/2014 | Slayton et al. |
| 8,926,533 B2 | 1/2015 | Bockenstedt et al. |
| 8,932,224 B2 | 1/2015 | Barthe et al. |
| 8,932,238 B2 | 1/2015 | Wing et al. |
| 8,968,205 B2 | 3/2015 | Zeng et al. |
| 9,011,336 B2 | 4/2015 | Slayton et al. |
| 9,039,617 B2 | 5/2015 | Slayton et al. |
| 9,039,619 B2 | 5/2015 | Barthe et al. |
| 9,050,116 B2 | 6/2015 | Homer |
| 9,061,131 B2 | 6/2015 | Jahnke et al. |
| 9,095,697 B2 | 8/2015 | Barthe et al. |
| 9,107,798 B2 | 8/2015 | Azhari et al. |
| 9,114,247 B2 | 8/2015 | Barthe et al. |
| 9,180,314 B2 | 11/2015 | Desilets et al. |
| 9,211,106 B2 | 12/2015 | Berard-Andersen et al. |
| 9,216,276 B2 | 12/2015 | Slayton et al. |
| 9,220,915 B2 | 12/2015 | Liu et al. |
| 9,272,162 B2 | 3/2016 | Slayton et al. |
| 9,283,409 B2 | 3/2016 | Slayton et al. |
| 9,283,410 B2 | 3/2016 | Slayton et al. |
| 9,295,607 B2 | 3/2016 | Rosenberg |
| 9,308,390 B2 | 4/2016 | Youngquist |
| 9,308,391 B2 | 4/2016 | Liu et al. |
| 9,314,650 B2 | 4/2016 | Rosenberg et al. |
| 9,320,537 B2 | 4/2016 | Slayton et al. |
| 9,345,909 B2 | 5/2016 | Feferberg |
| 9,345,910 B2 | 5/2016 | Slayton et al. |
| 9,421,029 B2 | 8/2016 | Barthe et al. |
| 9,427,600 B2 | 8/2016 | Barthe et al. |
| 9,427,601 B2 | 8/2016 | Barthe et al. |
| 9,433,803 B2 | 9/2016 | Lin et al. |
| 9,440,093 B2 | 9/2016 | Homer |
| 9,440,096 B2 | 9/2016 | Barthe et al. |
| 9,492,645 B2 | 11/2016 | Zhou et al. |
| 9,492,686 B2 | 11/2016 | Da Silva |
| 9,498,651 B2 | 11/2016 | Sapozhnikov et al. |
| 9,510,802 B2 | 12/2016 | Barthe et al. |
| 9,522,290 B2 | 12/2016 | Slayton et al. |
| 9,532,832 B2 | 1/2017 | Ron Edoute et al. |
| 9,533,174 B2 | 1/2017 | Barthe et al. |
| 9,533,175 B2 | 1/2017 | Slayton et al. |
| 9,545,529 B2 | 1/2017 | Britva et al. |
| 9,566,454 B2 | 2/2017 | Barthe et al. |
| 9,623,267 B2 | 4/2017 | Ulric et al. |
| 9,642,593 B2 | 5/2017 | Sarnow et al. |
| 9,694,211 B2 | 7/2017 | Barthe et al. |
| 9,694,212 B2 | 7/2017 | Barthe et al. |
| 9,700,340 B2 | 7/2017 | Barthe et al. |
| 9,707,412 B2 | 7/2017 | Slayton et al. |
| 9,710,607 B2 | 7/2017 | Ramdas et al. |
| 9,713,731 B2 | 7/2017 | Slayton et al. |
| 9,802,063 B2 | 10/2017 | Barthe et al. |
| 9,827,449 B2 | 11/2017 | Barthe et al. |
| 9,827,450 B2 | 11/2017 | Slayton et al. |
| 9,833,639 B2 | 12/2017 | Slayton et al. |
| 9,833,640 B2 | 12/2017 | Barthe et al. |
| 9,895,560 B2 | 2/2018 | Barthe et al. |
| 9,907,535 B2 | 3/2018 | Barthe et al. |
| 9,919,167 B2 | 3/2018 | Domankevitz |
| 9,974,982 B2 | 5/2018 | Slayton et al. |
| 9,993,664 B2 | 6/2018 | Aviad et al. |
| 10,010,721 B2 | 7/2018 | Slayton et al. |
| 10,010,724 B2 | 7/2018 | Barthe et al. |
| 10,010,725 B2 | 7/2018 | Slayton et al. |
| 10,010,726 B2 | 7/2018 | Barthe et al. |
| 10,016,626 B2 | 7/2018 | Zovrin et al. |
| 10,028,700 B2 | 7/2018 | Sarnow et al. |
| 10,046,181 B2 | 8/2018 | Barthe et al. |
| 10,046,182 B2 | 8/2018 | Barthe et al. |
| 10,065,050 B2 | 9/2018 | Lee |
| 10,070,883 B2 | 9/2018 | Barthe et al. |
| 10,143,861 B2 | 12/2018 | Slayton et al. |
| 10,183,183 B2 | 1/2019 | Burdette |
| 10,226,645 B2 | 3/2019 | Barthe |
| 10,238,849 B2 | 3/2019 | Britva et al. |
| 10,238,894 B2 | 3/2019 | Slayton et al. |
| 10,245,450 B2 | 4/2019 | Slayton et al. |
| 10,252,086 B2 | 4/2019 | Barthe et al. |
| 10,265,550 B2 | 4/2019 | Barthe et al. |
| 10,272,272 B2 | 4/2019 | Lee et al. |
| 10,300,308 B2 | 5/2019 | Seip et al. |
| 10,328,289 B2 | 6/2019 | Barthe et al. |
| 10,363,440 B2 | 7/2019 | Cho et al. |
| 10,406,383 B2 | 9/2019 | Luebcke |
| 10,420,960 B2 | 9/2019 | Emery |
| 10,420,961 B2 | 9/2019 | Lacoste |
| 10,449,348 B2 | 10/2019 | Paunescu et al. |
| 10,485,573 B2 | 11/2019 | Clark, III et al. |
| 10,492,862 B2 | 12/2019 | Domankevitz |
| 10,525,277 B1 | 1/2020 | Chau |
| 10,525,288 B2 | 1/2020 | Slayton et al. |
| 10,532,230 B2 | 1/2020 | Barthe et al. |
| 10,537,304 B2 | 1/2020 | Barthe et al. |
| 10,556,123 B2 | 2/2020 | Altshuler et al. |
| 10,561,862 B2 | 2/2020 | Slayton |
| 10,583,287 B2 | 3/2020 | Schwarz |
| 10,603,519 B2 | 3/2020 | Slayton et al. |
| 10,603,521 B2 | 3/2020 | Emery et al. |
| 10,603,523 B2 | 3/2020 | Slayton et al. |
| 10,610,705 B2 | 4/2020 | Barthe et al. |
| 10,610,706 B2 | 4/2020 | Barthe et al. |
| 10,639,006 B2 | 5/2020 | Choi et al. |
| 10,639,504 B2 | 5/2020 | Kim |
| 10,751,246 B2 | 8/2020 | Kaila |
| 10,772,646 B2 | 9/2020 | Lu et al. |
| 10,780,298 B2 | 9/2020 | Cain et al. |
| 10,856,842 B2 | 12/2020 | Park et al. |
| 10,888,715 B2 | 1/2021 | Cioanta et al. |
| 10,888,716 B2 | 1/2021 | Slayton et al. |
| 10,888,717 B2 | 1/2021 | Slayton et al. |
| 10,888,718 B2 | 1/2021 | Barthe et al. |
| 10,960,235 B2 | 3/2021 | Barthe et al. |
| 10,960,236 B2 | 3/2021 | Slayton et al. |
| 11,027,149 B2 | 6/2021 | Fishman |
| 11,083,619 B2 | 8/2021 | Hall et al. |
| 11,096,658 B2 | 8/2021 | Sarnow et al. |
| 11,103,213 B2 | 8/2021 | Burnside et al. |
| 11,123,039 B2 | 9/2021 | Barthe et al. |

(56) References Cited

U.S. PATENT DOCUMENTS

| | | |
|---|---|---|
| 11,123,577 B2 | 9/2021 | Blanche et al. |
| 11,147,534 B2 | 10/2021 | Arai et al. |
| 11,167,155 B2 | 11/2021 | Barthe et al. |
| 11,179,580 B2 | 11/2021 | Slayton et al. |
| 11,191,523 B2 | 12/2021 | Ogura et al. |
| 11,207,547 B2 | 12/2021 | Slayton et al. |
| 11,207,548 B2 | 12/2021 | Barthe et al. |
| 11,224,769 B2 | 1/2022 | Jeong |
| 11,224,895 B2 | 1/2022 | Brown et al. |
| 11,235,179 B2 | 2/2022 | Barthe et al. |
| 11,235,180 B2 | 2/2022 | Slayton et al. |
| 11,241,218 B2 | 2/2022 | Emery et al. |
| 11,278,745 B2 | 3/2022 | Britva et al. |
| 11,400,319 B2 | 8/2022 | Barthe et al. |
| 11,413,018 B2 | 8/2022 | Southard et al. |
| 11,471,705 B2 | 10/2022 | Ha |
| 11,491,351 B2 | 11/2022 | Zawada et al. |
| 11,524,183 B1 | 12/2022 | Garcia et al. |
| 11,638,841 B2 | 5/2023 | Nazer et al. |
| 11,642,551 B2 | 5/2023 | Britva et al. |
| 11,684,338 B2 | 6/2023 | Gautam et al. |
| 11,697,033 B2 | 7/2023 | Barthe et al. |
| 11,701,092 B2 | 7/2023 | Kruger et al. |
| 11,751,932 B2 | 9/2023 | Slayton et al. |
| 11,944,488 B2 | 4/2024 | Yang et al. |
| 11,948,324 B2 | 4/2024 | Iseri et al. |
| 11,969,609 B2 | 4/2024 | Emery |
| 12,023,525 B1 | 7/2024 | Kang |
| 12,029,924 B2 | 7/2024 | Kim et al. |
| 12,048,586 B2 | 7/2024 | Peterson et al. |
| 12,053,652 B2 | 8/2024 | Peters et al. |
| 12,059,370 B2 | 8/2024 | Hall et al. |
| 12,076,591 B2 | 9/2024 | Emery |
| 12,102,473 B2 | 10/2024 | Barthe et al. |
| 12,109,441 B2 | 10/2024 | Nazer et al. |
| 12,133,763 B2 | 11/2024 | Burns |
| 12,138,487 B2 | 11/2024 | Capelli et al. |
| 12,194,320 B2 | 1/2025 | Slayton et al. |
| 2001/0009997 A1 | 7/2001 | Pope |
| 2001/0009999 A1 | 7/2001 | Kaufman et al. |
| 2001/0014780 A1 | 8/2001 | Martin |
| 2001/0014819 A1 | 8/2001 | Ingle |
| 2001/0031922 A1 | 10/2001 | Weng |
| 2001/0039380 A1 | 11/2001 | Larson et al. |
| 2001/0041880 A1 | 11/2001 | Brisken |
| 2002/0000763 A1 | 1/2002 | Jones |
| 2002/0002345 A1 | 1/2002 | Marlinghaus |
| 2002/0040199 A1 | 4/2002 | Klopotek |
| 2002/0040442 A1 | 4/2002 | Ishidera |
| 2002/0055702 A1 | 5/2002 | Atala |
| 2002/0062077 A1 | 5/2002 | Emmenegger |
| 2002/0062142 A1 | 5/2002 | Knowlton |
| 2002/0072691 A1 | 6/2002 | Thompson et al. |
| 2002/0082528 A1 | 6/2002 | Friedman |
| 2002/0082529 A1 | 6/2002 | Suorsa et al. |
| 2002/0082589 A1 | 6/2002 | Friedman |
| 2002/0087080 A1 | 7/2002 | Slayton |
| 2002/0095143 A1 | 7/2002 | Key |
| 2002/0099094 A1 | 7/2002 | Anderson |
| 2002/0111569 A1 | 8/2002 | Rosenschien et al. |
| 2002/0115917 A1 | 8/2002 | Honda et al. |
| 2002/0128639 A1 | 9/2002 | Pless et al. |
| 2002/0128648 A1 | 9/2002 | Weber |
| 2002/0143252 A1 | 10/2002 | Dunne et al. |
| 2002/0156400 A1 | 10/2002 | Babaev |
| 2002/0161357 A1 | 10/2002 | Anderson |
| 2002/0165529 A1 | 11/2002 | Danek |
| 2002/0168049 A1 | 11/2002 | Schriever |
| 2002/0169394 A1 | 11/2002 | Eppstein et al. |
| 2002/0169442 A1 | 11/2002 | Neev |
| 2002/0173721 A1 | 11/2002 | Grunwald et al. |
| 2002/0193784 A1 | 12/2002 | McHale et al. |
| 2002/0193831 A1 | 12/2002 | Smith |
| 2003/0009153 A1 | 1/2003 | Brisken et al. |
| 2003/0014039 A1 | 1/2003 | Barzell et al. |
| 2003/0018255 A1 | 1/2003 | Martin |
| 2003/0018270 A1 | 1/2003 | Makin et al. |
| 2003/0023283 A1 | 1/2003 | McDaniel |
| 2003/0028111 A1 | 2/2003 | Vaezy et al. |
| 2003/0028113 A1 | 2/2003 | Gilbert et al. |
| 2003/0032900 A1 | 2/2003 | Ella |
| 2003/0036706 A1 | 2/2003 | Slayton et al. |
| 2003/0040739 A1 | 2/2003 | Koop |
| 2003/0050678 A1 | 3/2003 | Sierra |
| 2003/0055308 A1 | 3/2003 | Friemel et al. |
| 2003/0055417 A1 | 3/2003 | Truckai et al. |
| 2003/0060736 A1 | 3/2003 | Martin et al. |
| 2003/0065313 A1 | 4/2003 | Koop |
| 2003/0066708 A1 | 4/2003 | Allison et al. |
| 2003/0073907 A1 | 4/2003 | Taylor |
| 2003/0074023 A1 | 4/2003 | Kaplan |
| 2003/0083536 A1 | 5/2003 | Eshel |
| 2003/0092988 A1 | 5/2003 | Makin |
| 2003/0097071 A1 | 5/2003 | Halmann et al. |
| 2003/0099383 A1 | 5/2003 | Lefebvre |
| 2003/0125629 A1 | 7/2003 | Ustuner |
| 2003/0130657 A1 | 7/2003 | Tom |
| 2003/0135135 A1 | 7/2003 | Miwa et al. |
| 2003/0139790 A1 | 7/2003 | Ingle et al. |
| 2003/0149366 A1 | 8/2003 | Stringer et al. |
| 2003/0153961 A1 | 8/2003 | Babaev |
| 2003/0171678 A1 | 9/2003 | Batten et al. |
| 2003/0171701 A1 | 9/2003 | Babaev |
| 2003/0176790 A1 | 9/2003 | Slayton |
| 2003/0191396 A1 | 10/2003 | Sanghvi |
| 2003/0199794 A1 | 10/2003 | Sakurai et al. |
| 2003/0200481 A1 | 10/2003 | Stanley |
| 2003/0212129 A1 | 11/2003 | Liu et al. |
| 2003/0212351 A1 | 11/2003 | Hissong |
| 2003/0212393 A1 | 11/2003 | Knowlton |
| 2003/0216648 A1 | 11/2003 | Lizzi et al. |
| 2003/0216795 A1 | 11/2003 | Harth |
| 2003/0220536 A1 | 11/2003 | Hissong |
| 2003/0220585 A1 | 11/2003 | Hissong |
| 2003/0229331 A1 | 12/2003 | Brisken et al. |
| 2003/0233085 A1 | 12/2003 | Giammarusti |
| 2003/0236487 A1 | 12/2003 | Knowlton |
| 2004/0000316 A1 | 1/2004 | Knowlton |
| 2004/0001809 A1 | 1/2004 | Brisken |
| 2004/0002658 A1 | 1/2004 | Marian, Jr. |
| 2004/0002705 A1 | 1/2004 | Knowlton |
| 2004/0010222 A1 | 1/2004 | Nunomura et al. |
| 2004/0015079 A1 | 1/2004 | Berger et al. |
| 2004/0015106 A1 | 1/2004 | Coleman |
| 2004/0030227 A1 | 2/2004 | Littrup |
| 2004/0030268 A1 | 2/2004 | Weng et al. |
| 2004/0039312 A1 | 2/2004 | Hillstead |
| 2004/0039418 A1 | 2/2004 | Elstrom |
| 2004/0041563 A1 | 3/2004 | Lewin et al. |
| 2004/0041880 A1 | 3/2004 | Ikeda et al. |
| 2004/0042168 A1 | 3/2004 | Yang et al. |
| 2004/0044375 A1 | 3/2004 | Diederich et al. |
| 2004/0049134 A1 | 3/2004 | Tosaya et al. |
| 2004/0049734 A1 | 3/2004 | Tosaya et al. |
| 2004/0059266 A1 | 3/2004 | Fry |
| 2004/0068186 A1 | 4/2004 | Ishida et al. |
| 2004/0073079 A1 | 4/2004 | Altshuler et al. |
| 2004/0073113 A1 | 4/2004 | Salgo |
| 2004/0073115 A1 | 4/2004 | Horzewski et al. |
| 2004/0073116 A1 | 4/2004 | Smith |
| 2004/0073204 A1 | 4/2004 | Ryan et al. |
| 2004/0077977 A1 | 4/2004 | Ella et al. |
| 2004/0082857 A1 | 4/2004 | Schonenberger |
| 2004/0082859 A1 | 4/2004 | Schaer |
| 2004/0102697 A1 | 5/2004 | Evron |
| 2004/0105559 A1 | 6/2004 | Aylward et al. |
| 2004/0106867 A1 | 6/2004 | Eshel et al. |
| 2004/0122323 A1 | 6/2004 | Vortman et al. |
| 2004/0122493 A1 | 6/2004 | Ishibashi et al. |
| 2004/0143297 A1 | 7/2004 | Ramsey |
| 2004/0152982 A1 | 8/2004 | Hwang et al. |
| 2004/0158150 A1 | 8/2004 | Rabiner et al. |
| 2004/0186535 A1 | 9/2004 | Knowlton |
| 2004/0189155 A1 | 9/2004 | Funakubo |

(56) References Cited

U.S. PATENT DOCUMENTS

| | | |
|---|---|---|
| 2004/0206365 A1 | 10/2004 | Knowlton |
| 2004/0210214 A1 | 10/2004 | Knowlton |
| 2004/0217675 A1 | 11/2004 | Desilets |
| 2004/0249318 A1 | 12/2004 | Tanaka |
| 2004/0254620 A1 | 12/2004 | Lacoste |
| 2004/0267252 A1 | 12/2004 | Washington et al. |
| 2005/0007879 A1 | 1/2005 | Nishida |
| 2005/0033201 A1 | 2/2005 | Takahashi |
| 2005/0033316 A1 | 2/2005 | Kertz |
| 2005/0038340 A1 | 2/2005 | Vaezy et al. |
| 2005/0055018 A1 | 3/2005 | Kreindel |
| 2005/0055073 A1 | 3/2005 | Weber |
| 2005/0061834 A1 | 3/2005 | Garcia et al. |
| 2005/0070961 A1 | 3/2005 | Maki |
| 2005/0074407 A1 | 4/2005 | Smith |
| 2005/0080469 A1 | 4/2005 | Larson |
| 2005/0085731 A1 | 4/2005 | Miller et al. |
| 2005/0091770 A1 | 5/2005 | Mourad et al. |
| 2005/0096542 A1 | 5/2005 | Weng |
| 2005/0104690 A1 | 5/2005 | Larson et al. |
| 2005/0113689 A1 | 5/2005 | Gritzky |
| 2005/0131302 A1 | 6/2005 | Poland |
| 2005/0137656 A1 | 6/2005 | Malak |
| 2005/0143677 A1 | 6/2005 | Young et al. |
| 2005/0154313 A1 | 7/2005 | Desilets |
| 2005/0154314 A1 | 7/2005 | Quistgaard |
| 2005/0154332 A1 | 7/2005 | Zanelli |
| 2005/0154431 A1 | 7/2005 | Quistgaard |
| 2005/0187495 A1 | 8/2005 | Quistgaard |
| 2005/0191252 A1 | 9/2005 | Mitsui |
| 2005/0193451 A1 | 9/2005 | Quistgaard |
| 2005/0193820 A1 | 9/2005 | Sheljaskow et al. |
| 2005/0197681 A1 | 9/2005 | Barolet et al. |
| 2005/0228281 A1 | 10/2005 | Nefos |
| 2005/0240127 A1 | 10/2005 | Seip et al. |
| 2005/0240170 A1 | 10/2005 | Zhang et al. |
| 2005/0251120 A1 | 11/2005 | Anderson et al. |
| 2005/0251125 A1 | 11/2005 | Pless et al. |
| 2005/0256406 A1 | 11/2005 | Barthe |
| 2005/0261584 A1 | 11/2005 | Eshel |
| 2005/0261585 A1 | 11/2005 | Makin et al. |
| 2005/0267454 A1 | 12/2005 | Hissong |
| 2005/0288748 A1 | 12/2005 | Li et al. |
| 2006/0004306 A1 | 1/2006 | Altshuler |
| 2006/0020260 A1 | 1/2006 | Dover et al. |
| 2006/0025756 A1 | 2/2006 | Francischelli |
| 2006/0042201 A1 | 3/2006 | Curry |
| 2006/0058664 A1 | 3/2006 | Barthe |
| 2006/0058671 A1 | 3/2006 | Vitek et al. |
| 2006/0058707 A1 | 3/2006 | Barthe |
| 2006/0058712 A1 | 3/2006 | Altshuler et al. |
| 2006/0074309 A1 | 4/2006 | Bonnefous |
| 2006/0074313 A1 | 4/2006 | Slayton et al. |
| 2006/0074314 A1 | 4/2006 | Slayton |
| 2006/0074355 A1 | 4/2006 | Slayton |
| 2006/0079816 A1 | 4/2006 | Barthe |
| 2006/0079868 A1 | 4/2006 | Makin |
| 2006/0084891 A1 | 4/2006 | Barthe |
| 2006/0089632 A1 | 4/2006 | Barthe |
| 2006/0089688 A1 | 4/2006 | Panescu |
| 2006/0094988 A1 | 5/2006 | Tosaya |
| 2006/0106325 A1 | 5/2006 | Perrier |
| 2006/0111744 A1 | 5/2006 | Makin |
| 2006/0116583 A1 | 6/2006 | Ogasawara et al. |
| 2006/0116671 A1 | 6/2006 | Slayton |
| 2006/0122508 A1 | 6/2006 | Slayton |
| 2006/0122509 A1 | 6/2006 | Desilets |
| 2006/0161062 A1 | 7/2006 | Arditi et al. |
| 2006/0184069 A1 | 8/2006 | Vaitekunas |
| 2006/0184071 A1 | 8/2006 | Klopotek |
| 2006/0189972 A1 | 8/2006 | Grossman |
| 2006/0206105 A1 | 9/2006 | Chopra |
| 2006/0224090 A1 | 10/2006 | Ostrovsky et al. |
| 2006/0229514 A1 | 10/2006 | Wiener |
| 2006/0238068 A1 | 10/2006 | May et al. |
| 2006/0241440 A1 | 10/2006 | Eshel |
| 2006/0241442 A1 | 10/2006 | Barthe |
| 2006/0241470 A1 | 10/2006 | Novak et al. |
| 2006/0241576 A1 | 10/2006 | Diederich et al. |
| 2006/0250046 A1 | 11/2006 | Koizumi et al. |
| 2006/0282691 A1 | 12/2006 | Barthe |
| 2006/0291710 A1 | 12/2006 | Wang et al. |
| 2007/0016039 A1 | 1/2007 | Vortman et al. |
| 2007/0032784 A1 | 2/2007 | Gilklich et al. |
| 2007/0035201 A1 | 2/2007 | Desilets |
| 2007/0055154 A1 | 3/2007 | Torbati |
| 2007/0055155 A1 | 3/2007 | Owen et al. |
| 2007/0055156 A1 | 3/2007 | Desilets et al. |
| 2007/0065420 A1 | 3/2007 | Johnson |
| 2007/0078290 A1 | 4/2007 | Esenaliev |
| 2007/0083120 A1 | 4/2007 | Cain et al. |
| 2007/0087060 A1 | 4/2007 | Dietrich |
| 2007/0088245 A1 | 4/2007 | Babaev et al. |
| 2007/0088346 A1 | 4/2007 | Mirizzi et al. |
| 2007/0161902 A1 | 7/2007 | Dan |
| 2007/0166357 A1 | 7/2007 | Shaffer et al. |
| 2007/0167709 A1 | 7/2007 | Slayton |
| 2007/0185553 A1 | 8/2007 | Kennedy |
| 2007/0208253 A1 | 9/2007 | Slayton |
| 2007/0219448 A1 | 9/2007 | Seip et al. |
| 2007/0219604 A1 | 9/2007 | Yaroslavsky et al. |
| 2007/0219605 A1 | 9/2007 | Yaroslavsky et al. |
| 2007/0238994 A1 | 10/2007 | Stecco et al. |
| 2007/0239075 A1 | 10/2007 | Rosenberg |
| 2007/0239077 A1 | 10/2007 | Azhari et al. |
| 2007/0239079 A1 | 10/2007 | Manstein et al. |
| 2007/0239142 A1 | 10/2007 | Altshuler |
| 2008/0015435 A1 | 1/2008 | Cribbs et al. |
| 2008/0027328 A1 | 1/2008 | Klopotek |
| 2008/0033458 A1 | 2/2008 | McLean et al. |
| 2008/0039724 A1 | 2/2008 | Seip et al. |
| 2008/0071255 A1 | 3/2008 | Barthe |
| 2008/0086054 A1 | 4/2008 | Slayton |
| 2008/0086056 A1 | 4/2008 | Chang et al. |
| 2008/0097214 A1 | 4/2008 | Meyers et al. |
| 2008/0097253 A1 | 4/2008 | Pedersen et al. |
| 2008/0114251 A1 | 5/2008 | Weymer |
| 2008/0139943 A1 | 6/2008 | Deng et al. |
| 2008/0139974 A1 | 6/2008 | Da Silva |
| 2008/0146970 A1 | 6/2008 | Litman et al. |
| 2008/0167556 A1 | 7/2008 | Thompson |
| 2008/0183077 A1 | 7/2008 | Moreau-Gobard et al. |
| 2008/0183110 A1 | 7/2008 | Davenport et al. |
| 2008/0188745 A1 | 8/2008 | Chen et al. |
| 2008/0194964 A1 | 8/2008 | Randall et al. |
| 2008/0195000 A1 | 8/2008 | Spooner et al. |
| 2008/0200810 A1 | 8/2008 | Buchalter |
| 2008/0200813 A1 | 8/2008 | Quistgaard |
| 2008/0214966 A1 | 9/2008 | Slayton |
| 2008/0214988 A1 | 9/2008 | Altshuler et al. |
| 2008/0221491 A1 | 9/2008 | Slayton |
| 2008/0223379 A1 | 9/2008 | Stuker |
| 2008/0242991 A1 | 10/2008 | Moon et al. |
| 2008/0243035 A1 | 10/2008 | Crunkilton |
| 2008/0269608 A1 | 10/2008 | Anderson et al. |
| 2008/0275342 A1 | 11/2008 | Barthe |
| 2008/0281206 A1 | 11/2008 | Bartlett et al. |
| 2008/0281236 A1 | 11/2008 | Eshel et al. |
| 2008/0281237 A1 | 11/2008 | Slayton |
| 2008/0281255 A1 | 11/2008 | Slayton |
| 2008/0294072 A1 | 11/2008 | Crutchfield, III |
| 2008/0294073 A1 | 11/2008 | Barthe |
| 2008/0319356 A1 | 12/2008 | Cain |
| 2009/0005680 A1 | 1/2009 | Jones et al. |
| 2009/0012394 A1 | 1/2009 | Hobelsberger et al. |
| 2009/0043198 A1 | 2/2009 | Milner et al. |
| 2009/0043293 A1 | 2/2009 | Pankratov et al. |
| 2009/0048514 A1 | 2/2009 | Azhari et al. |
| 2009/0069677 A1 | 3/2009 | Chen et al. |
| 2009/0093737 A1 | 4/2009 | Chomas et al. |
| 2009/0156969 A1 | 6/2009 | Santangelo |
| 2009/0163807 A1 | 6/2009 | Sliwa |
| 2009/0171252 A1 | 7/2009 | Bockenstedt et al. |
| 2009/0171266 A1 | 7/2009 | Harris |

(56) References Cited

U.S. PATENT DOCUMENTS

| | | |
|---|---|---|
| 2009/0177122 A1 | 7/2009 | Peterson |
| 2009/0177123 A1 | 7/2009 | Peterson |
| 2009/0182231 A1 | 7/2009 | Barthe et al. |
| 2009/0198157 A1 | 8/2009 | Babaev et al. |
| 2009/0216159 A1 | 8/2009 | Slayton et al. |
| 2009/0226424 A1 | 9/2009 | Hsu |
| 2009/0227910 A1 | 9/2009 | Pedersen et al. |
| 2009/0230820 A1 | 9/2009 | Nudelman |
| 2009/0230823 A1 | 9/2009 | Kushculey et al. |
| 2009/0240146 A1 | 9/2009 | Bockenstedt et al. |
| 2009/0253988 A1 | 10/2009 | Slayton et al. |
| 2009/0281463 A1 | 11/2009 | Chapelon et al. |
| 2009/0312693 A1 | 12/2009 | Thapliyal et al. |
| 2009/0318909 A1 | 12/2009 | Debenedictis et al. |
| 2009/0326420 A1 | 12/2009 | Moonen et al. |
| 2010/0011236 A1 | 1/2010 | Barthe et al. |
| 2010/0022919 A1 | 1/2010 | Peterson |
| 2010/0022921 A1 | 1/2010 | Seip et al. |
| 2010/0022922 A1 | 1/2010 | Barthe et al. |
| 2010/0030076 A1 | 2/2010 | Vortman et al. |
| 2010/0042020 A1 | 2/2010 | Ben-Ezra |
| 2010/0049178 A1 | 2/2010 | Deem et al. |
| 2010/0056925 A1 | 3/2010 | Zhang et al. |
| 2010/0056962 A1 | 3/2010 | Vortman et al. |
| 2010/0100014 A1 | 4/2010 | Eshel et al. |
| 2010/0113983 A1 | 5/2010 | Heckerman et al. |
| 2010/0130891 A1 | 5/2010 | Taggart et al. |
| 2010/0160782 A1 | 6/2010 | Slayton et al. |
| 2010/0160837 A1 | 6/2010 | Hunziker et al. |
| 2010/0168576 A1 | 7/2010 | Poland et al. |
| 2010/0191120 A1 | 7/2010 | Kraus et al. |
| 2010/0241035 A1 | 9/2010 | Barthe et al. |
| 2010/0249602 A1 | 9/2010 | Buckley et al. |
| 2010/0249669 A1 | 9/2010 | Ulric et al. |
| 2010/0256489 A1 | 10/2010 | Pedersen et al. |
| 2010/0274161 A1 | 10/2010 | Azhari et al. |
| 2010/0280420 A1 | 11/2010 | Barthe et al. |
| 2010/0286518 A1 | 11/2010 | Lee et al. |
| 2010/0312150 A1 | 12/2010 | Douglas et al. |
| 2010/0331715 A1 | 12/2010 | Addison et al. |
| 2011/0040171 A1 | 2/2011 | Foley et al. |
| 2011/0040190 A1 | 2/2011 | Jahnke et al. |
| 2011/0040213 A1 | 2/2011 | Dietz et al. |
| 2011/0040214 A1 | 2/2011 | Foley et al. |
| 2011/0066084 A1 | 3/2011 | Desilets et al. |
| 2011/0072970 A1 | 3/2011 | Slobodzian et al. |
| 2011/0077514 A1 | 3/2011 | Ulric et al. |
| 2011/0079083 A1 | 4/2011 | Yoo et al. |
| 2011/0087099 A1 | 4/2011 | Eshel et al. |
| 2011/0087255 A1 | 4/2011 | McCormack et al. |
| 2011/0112405 A1 | 5/2011 | Barthe et al. |
| 2011/0144490 A1 | 6/2011 | Davis et al. |
| 2011/0178444 A1 | 7/2011 | Slayton et al. |
| 2011/0178541 A1 | 7/2011 | Azhari |
| 2011/0190745 A1 | 8/2011 | Uebelhoer et al. |
| 2011/0201976 A1 | 8/2011 | Sanghvi et al. |
| 2011/0251524 A1 | 10/2011 | Azhari et al. |
| 2011/0251527 A1 | 10/2011 | Kushculey et al. |
| 2011/0270137 A1 | 11/2011 | Goren et al. |
| 2011/0319793 A1 | 12/2011 | Henrik et al. |
| 2011/0319794 A1 | 12/2011 | Gertner |
| 2012/0004549 A1 | 1/2012 | Barthe et al. |
| 2012/0016239 A1 | 1/2012 | Barthe et al. |
| 2012/0029353 A1 | 2/2012 | Slayton et al. |
| 2012/0035473 A1 | 2/2012 | Sanghvi et al. |
| 2012/0035475 A1 | 2/2012 | Barthe et al. |
| 2012/0035476 A1 | 2/2012 | Barthe et al. |
| 2012/0046547 A1 | 2/2012 | Barthe et al. |
| 2012/0053458 A1 | 3/2012 | Barthe et al. |
| 2012/0059288 A1 | 3/2012 | Barthe et al. |
| 2012/0111339 A1 | 5/2012 | Barthe et al. |
| 2012/0123304 A1 | 5/2012 | Rybyanets et al. |
| 2012/0136280 A1 | 5/2012 | Rosenberg et al. |
| 2012/0136282 A1 | 5/2012 | Rosenberg et al. |
| 2012/0143056 A1 | 6/2012 | Slayton et al. |
| 2012/0143100 A1 | 6/2012 | Jeong et al. |
| 2012/0165668 A1 | 6/2012 | Slayton et al. |
| 2012/0165848 A1 | 6/2012 | Slayton et al. |
| 2012/0191019 A1 | 7/2012 | Desilets et al. |
| 2012/0191020 A1 | 7/2012 | Vitek et al. |
| 2012/0197120 A1 | 8/2012 | Makin et al. |
| 2012/0197121 A1 | 8/2012 | Slayton et al. |
| 2012/0203108 A1 | 8/2012 | Tsujita |
| 2012/0209150 A1 | 8/2012 | Zeng et al. |
| 2012/0215105 A1 | 8/2012 | Slayton et al. |
| 2012/0271202 A1 | 10/2012 | Wisdom |
| 2012/0271294 A1 | 10/2012 | Barthe et al. |
| 2012/0277587 A1 | 11/2012 | Adanny et al. |
| 2012/0277639 A1 | 11/2012 | Pollock et al. |
| 2012/0296240 A1 | 11/2012 | Azhari et al. |
| 2012/0302883 A1 | 11/2012 | Kong et al. |
| 2012/0316426 A1 | 12/2012 | Foley et al. |
| 2012/0330197 A1 | 12/2012 | Makin et al. |
| 2012/0330222 A1 | 12/2012 | Makin et al. |
| 2012/0330223 A1 | 12/2012 | Makin et al. |
| 2012/0330283 A1 | 12/2012 | Hyde et al. |
| 2012/0330284 A1 | 12/2012 | Hyde et al. |
| 2013/0012755 A1 | 1/2013 | Slayton |
| 2013/0012816 A1 | 1/2013 | Slayton et al. |
| 2013/0012838 A1 | 1/2013 | Jaeger et al. |
| 2013/0012842 A1 | 1/2013 | Barthe |
| 2013/0018285 A1 | 1/2013 | Park et al. |
| 2013/0018286 A1 | 1/2013 | Slayton et al. |
| 2013/0046209 A1 | 2/2013 | Slayton et al. |
| 2013/0051178 A1 | 2/2013 | Rybyanets |
| 2013/0060170 A1 | 3/2013 | Lee et al. |
| 2013/0066208 A1 | 3/2013 | Barthe et al. |
| 2013/0066237 A1 | 3/2013 | Smotrich et al. |
| 2013/0072826 A1 | 3/2013 | Slayton et al. |
| 2013/0073001 A1 | 3/2013 | Campbell |
| 2013/0096471 A1 | 4/2013 | Slayton et al. |
| 2013/0096596 A1 | 4/2013 | Schafer |
| 2013/0190659 A1 | 7/2013 | Slayton et al. |
| 2013/0211293 A1 | 8/2013 | Auboiroux et al. |
| 2013/0225994 A1 | 8/2013 | Hsu et al. |
| 2013/0268032 A1 | 10/2013 | Neev |
| 2013/0274603 A1 | 10/2013 | Barthe et al. |
| 2013/0278111 A1 | 10/2013 | Sammoura |
| 2013/0281853 A1 | 10/2013 | Slayton et al. |
| 2013/0281891 A1 | 10/2013 | Slayton et al. |
| 2013/0294203 A1 | 11/2013 | Goodman et al. |
| 2013/0296697 A1 | 11/2013 | Slayton et al. |
| 2013/0296700 A1 | 11/2013 | Slayton et al. |
| 2013/0296743 A1 | 11/2013 | Lee et al. |
| 2013/0303904 A1 | 11/2013 | Barthe et al. |
| 2013/0303905 A1 | 11/2013 | Barthe et al. |
| 2013/0310714 A1 | 11/2013 | Eshel et al. |
| 2013/0310863 A1 | 11/2013 | Makin et al. |
| 2013/0345562 A1 | 12/2013 | Barthe et al. |
| 2014/0024974 A1 | 1/2014 | Slayton et al. |
| 2014/0050054 A1 | 2/2014 | Toda et al. |
| 2014/0081300 A1 | 3/2014 | Melodelima et al. |
| 2014/0082907 A1 | 3/2014 | Barthe et al. |
| 2014/0117814 A1 | 5/2014 | Toda et al. |
| 2014/0142430 A1 | 5/2014 | Slayton et al. |
| 2014/0148834 A1 | 5/2014 | Barthe et al. |
| 2014/0155747 A1 | 6/2014 | Bennett |
| 2014/0180174 A1 | 6/2014 | Slayton et al. |
| 2014/0187944 A1 | 7/2014 | Slayton et al. |
| 2014/0188015 A1 | 7/2014 | Slayton et al. |
| 2014/0188145 A1 | 7/2014 | Slayton et al. |
| 2014/0194723 A1 | 7/2014 | Herzog et al. |
| 2014/0208856 A1 | 7/2014 | Schmid |
| 2014/0221823 A1 | 8/2014 | Keogh et al. |
| 2014/0236049 A1 | 8/2014 | Barthe et al. |
| 2014/0236061 A1 | 8/2014 | Lee et al. |
| 2014/0243713 A1 | 8/2014 | Slayton et al. |
| 2014/0257145 A1 | 9/2014 | Emery |
| 2014/0276055 A1 | 9/2014 | Barthe et al. |
| 2014/0316269 A1 | 10/2014 | Zhang et al. |
| 2015/0000674 A1 | 1/2015 | Barthe et al. |
| 2015/0025420 A1 | 1/2015 | Slayton et al. |
| 2015/0031995 A1 | 1/2015 | Guracar |
| 2015/0064165 A1 | 3/2015 | Perry et al. |

(56) References Cited

U.S. PATENT DOCUMENTS

| | | |
|---|---|---|
| 2015/0080723 A1 | 3/2015 | Barthe et al. |
| 2015/0080771 A1 | 3/2015 | Barthe et al. |
| 2015/0080874 A1 | 3/2015 | Slayton et al. |
| 2015/0088182 A1 | 3/2015 | Slayton et al. |
| 2015/0141734 A1 | 5/2015 | Chapelon et al. |
| 2015/0164734 A1 | 6/2015 | Slayton et al. |
| 2015/0165238 A1 | 6/2015 | Slayton et al. |
| 2015/0165243 A1 | 6/2015 | Slayton et al. |
| 2015/0174388 A1 | 6/2015 | Slayton |
| 2015/0202468 A1 | 7/2015 | Slayton et al. |
| 2015/0217141 A1 | 8/2015 | Barthe et al. |
| 2015/0238258 A1 | 8/2015 | Palero et al. |
| 2015/0297188 A1 | 10/2015 | Konofagou |
| 2015/0321026 A1 | 11/2015 | Branson et al. |
| 2015/0360058 A1 | 12/2015 | Barthe et al. |
| 2015/0374333 A1 | 12/2015 | Barthe et al. |
| 2015/0375014 A1 | 12/2015 | Slayton et al. |
| 2016/0001097 A1 | 1/2016 | Cho et al. |
| 2016/0016015 A1 | 1/2016 | Slayton et al. |
| 2016/0027994 A1 | 1/2016 | Toda et al. |
| 2016/0151618 A1 | 6/2016 | Powers et al. |
| 2016/0158580 A1 | 6/2016 | Slayton et al. |
| 2016/0175619 A1 | 6/2016 | Lee et al. |
| 2016/0206335 A1 | 7/2016 | Slayton |
| 2016/0206341 A1 | 7/2016 | Slayton |
| 2016/0256675 A1 | 9/2016 | Slayton |
| 2016/0296769 A1 | 10/2016 | Barthe et al. |
| 2016/0310444 A1 | 10/2016 | Dobak, III |
| 2016/0361571 A1 | 12/2016 | Bernabei |
| 2016/0361572 A1 | 12/2016 | Slayton |
| 2017/0028227 A1 | 2/2017 | Emery et al. |
| 2017/0043190 A1 | 2/2017 | Barthe et al. |
| 2017/0050019 A1 | 2/2017 | Ron Edoute et al. |
| 2017/0080257 A1 | 3/2017 | Paunescu et al. |
| 2017/0090507 A1 | 3/2017 | Weiner et al. |
| 2017/0100585 A1 | 4/2017 | Hall et al. |
| 2017/0119345 A1 | 5/2017 | Levien et al. |
| 2017/0136263 A1 | 5/2017 | Rei |
| 2017/0209201 A1 | 7/2017 | Slayton et al. |
| 2017/0209202 A1* | 7/2017 | Friedrichs .............. A61B 18/14 |
| 2017/0304654 A1 | 10/2017 | Blanche et al. |
| 2017/0368574 A1 | 12/2017 | Sammoura |
| 2018/0001113 A1 | 1/2018 | Streeter |
| 2018/0015308 A1 | 1/2018 | Reed et al. |
| 2018/0043147 A1 | 2/2018 | Slayton |
| 2018/0099162 A1 | 4/2018 | Bernabei |
| 2018/0099163 A1 | 4/2018 | Bernabei |
| 2018/0126190 A1 | 5/2018 | Aviad et al. |
| 2018/0154184 A1 | 6/2018 | Kong et al. |
| 2018/0177912 A1 | 6/2018 | Kaioptas et al. |
| 2018/0207450 A1 | 7/2018 | Sanchez et al. |
| 2018/0236270 A1 | 8/2018 | Hananel et al. |
| 2018/0272156 A1 | 9/2018 | Slayton et al. |
| 2018/0272157 A1 | 9/2018 | Barthe et al. |
| 2018/0272158 A1 | 9/2018 | Barthe et al. |
| 2018/0272159 A1 | 9/2018 | Slayton et al. |
| 2018/0317884 A1 | 11/2018 | Chapelon et al. |
| 2018/0333595 A1 | 11/2018 | Barthe et al. |
| 2018/0360420 A1 | 12/2018 | Vortman et al. |
| 2019/0000498 A1 | 1/2019 | Barthe et al. |
| 2019/0009110 A1 | 1/2019 | Gross et al. |
| 2019/0009111 A1 | 1/2019 | Myhr et al. |
| 2019/0022405 A1 | 1/2019 | Greenbaum et al. |
| 2019/0038921 A1 | 2/2019 | Domankevitz |
| 2019/0060675 A1 | 2/2019 | Krone et al. |
| 2019/0091490 A1 | 3/2019 | Alexander et al. |
| 2019/0142380 A1 | 5/2019 | Emery et al. |
| 2019/0143148 A1 | 5/2019 | Slayton |
| 2019/0184202 A1 | 6/2019 | Zereshkian et al. |
| 2019/0184203 A1 | 6/2019 | Slayton et al. |
| 2019/0184205 A1 | 6/2019 | Slayton et al. |
| 2019/0184207 A1 | 6/2019 | Barthe et al. |
| 2019/0184208 A1 | 6/2019 | Barthe et al. |
| 2019/0224501 A1 | 7/2019 | Burdette |
| 2019/0262634 A1 | 8/2019 | Barthe et al. |
| 2019/0282834 A1 | 9/2019 | Zawada et al. |
| 2019/0290939 A1 | 9/2019 | Watson et al. |
| 2019/0350562 A1 | 11/2019 | Slayton et al. |
| 2019/0366126 A1 | 12/2019 | Pahk et al. |
| 2019/0366127 A1 | 12/2019 | Emery |
| 2019/0366128 A1 | 12/2019 | Slayton et al. |
| 2020/0008779 A1 | 1/2020 | Göksel et al. |
| 2020/0094083 A1 | 3/2020 | Slayton et al. |
| 2020/0100762 A1 | 4/2020 | Barthe et al. |
| 2020/0129759 A1 | 4/2020 | Schwarz |
| 2020/0171330 A1 | 6/2020 | Barthe et al. |
| 2020/0179727 A1 | 6/2020 | Slayton et al. |
| 2020/0179729 A1 | 6/2020 | Slayton et al. |
| 2020/0188703 A1 | 6/2020 | Barthe et al. |
| 2020/0188704 A1 | 6/2020 | Barthe et al. |
| 2020/0188705 A1 | 6/2020 | Emery et al. |
| 2020/0206072 A1 | 7/2020 | Capelli et al. |
| 2020/0222728 A1 | 7/2020 | Khokhlova et al. |
| 2021/0038925 A1 | 2/2021 | Emery |
| 2021/0093895 A1 | 4/2021 | Kim et al. |
| 2021/0378630 A1 | 12/2021 | Slayton et al. |
| 2021/0393992 A1 | 12/2021 | Ji et al. |
| 2022/0000707 A1 | 1/2022 | Kim et al. |
| 2022/0006428 A1* | 1/2022 | Shepphard ................ H03F 1/56 |
| 2022/0008705 A1 | 1/2022 | Kim et al. |
| 2022/0062093 A1 | 3/2022 | Blanche |
| 2022/0062660 A1 | 3/2022 | Verner et al. |
| 2022/0175340 A1 | 6/2022 | Xu et al. |
| 2022/0226672 A1 | 7/2022 | Chen et al. |
| 2022/0273259 A1 | 9/2022 | He et al. |
| 2022/0288426 A1 | 9/2022 | Slayton |
| 2022/0331613 A1 | 10/2022 | Sullivan |
| 2022/0387826 A1 | 12/2022 | Pahk et al. |
| 2022/0401062 A1 | 12/2022 | Naidu et al. |
| 2022/0409511 A1 | 12/2022 | Sweis et al. |
| 2023/0040937 A1 | 2/2023 | Saenz et al. |
| 2023/0107629 A1 | 4/2023 | Sowards et al. |
| 2023/0218930 A1 | 7/2023 | Stopek et al. |
| 2023/0240651 A1 | 8/2023 | Schärfe Baltzer-Thomsen |
| 2023/0301626 A1 | 9/2023 | Howell |
| 2023/0338730 A1 | 10/2023 | Kim et al. |
| 2023/0347184 A1 | 11/2023 | Zawada et al. |
| 2024/0009489 A1 | 1/2024 | Cho |
| 2024/0065676 A1 | 2/2024 | Kim et al. |
| 2024/0074735 A1 | 3/2024 | Jokerst et al. |
| 2024/0090871 A1 | 3/2024 | Dixon et al. |
| 2024/0090874 A1 | 3/2024 | Lindsey et al. |
| 2024/0115885 A1 | 4/2024 | Slayton et al. |
| 2024/0131365 A1 | 4/2024 | Britva et al. |
| 2024/0149079 A1 | 5/2024 | Ko |
| 2024/0157176 A1 | 5/2024 | Bonutti et al. |
| 2024/0173576 A1 | 5/2024 | Lee |
| 2024/0181277 A1 | 6/2024 | Peters et al. |
| 2024/0198140 A1 | 6/2024 | Pooth et al. |
| 2024/0207655 A1 | 6/2024 | Ko et al. |
| 2024/0226961 A1 | 7/2024 | Brown et al. |
| 2024/0245936 A1 | 7/2024 | Chang et al. |
| 2024/0293291 A1 | 9/2024 | Danto |
| 2024/0325793 A1 | 10/2024 | Peters et al. |
| 2024/0359038 A1 | 10/2024 | Li et al. |
| 2024/0366970 A1 | 11/2024 | Li et al. |

FOREIGN PATENT DOCUMENTS

| | | |
|---|---|---|
| CN | 102112059 | 6/2011 |
| CN | 102573648 | 7/2012 |
| CN | 104027893 | 9/2014 |
| CN | 106994041 | 8/2017 |
| CN | 108023552 | 5/2018 |
| CN | 119455281 | 2/2025 |
| DE | 4029175 | 3/1992 |
| DE | 10140064 | 3/2003 |
| DE | 10219297 | 11/2003 |
| DE | 10219217 | 12/2004 |
| DE | 20314479 | 12/2004 |
| EP | 0142215 | 5/1984 |
| EP | 0344773 | 12/1989 |
| EP | 1479412 | 11/1991 |
| EP | 0473553 | 4/1992 |

(56) References Cited

FOREIGN PATENT DOCUMENTS

| | | |
|---|---|---|
| EP | 670147 | 2/1995 |
| EP | 0661029 | 7/1995 |
| EP | 724894 | 2/1996 |
| EP | 763371 | 11/1996 |
| EP | 1044038 | 10/2000 |
| EP | 1050322 | 11/2000 |
| EP | 1234566 | 8/2002 |
| EP | 1262160 | 12/2002 |
| EP | 0659387 | 4/2003 |
| EP | 1374944 | 1/2004 |
| EP | 1028660 | 1/2008 |
| EP | 1874241 | 1/2008 |
| EP | 1362223 | 5/2008 |
| EP | 1750804 | 7/2008 |
| EP | 1283690 | 11/2008 |
| EP | 1811901 | 4/2009 |
| EP | 1785164 | 8/2009 |
| EP | 2230904 | 9/2010 |
| EP | 1501331 | 6/2011 |
| EP | 2066405 | 11/2011 |
| EP | 2474050 | 7/2012 |
| EP | 2527828 | 11/2012 |
| EP | 2709726 | 11/2015 |
| EP | 1538980 | 1/2017 |
| EP | 3124047 | 1/2017 |
| EP | 2897547 | 11/2017 |
| EP | 2173261 B1 | 8/2018 |
| EP | 3417911 | 12/2018 |
| FR | 2532851 | 9/1983 |
| FR | 2685872 | 1/1992 |
| FR | 2672486 | 8/1992 |
| FR | 2703254 | 3/1994 |
| GB | 2113099 | 8/1983 |
| IL | 102516 | 1/1996 |
| IL | 112369 | 8/1999 |
| IL | 120079 | 3/2001 |
| JP | 63036171 | 2/1988 |
| JP | 03048299 | 3/1991 |
| JP | 3123559 | 5/1991 |
| JP | 03136642 | 6/1991 |
| JP | 4089058 | 3/1992 |
| JP | 04150847 | 5/1992 |
| JP | 7080087 | 3/1995 |
| JP | 07505793 | 6/1995 |
| JP | 7184907 | 7/1995 |
| JP | 7222782 | 8/1995 |
| JP | 09047458 | 2/1997 |
| JP | 9108288 | 4/1997 |
| JP | 9503926 | 4/1997 |
| JP | 3053069 | 10/1998 |
| JP | 11123226 | 5/1999 |
| JP | 11505440 | 5/1999 |
| JP | 11506636 | 6/1999 |
| JP | 10248850 | 9/1999 |
| JP | 2000126310 | 5/2000 |
| JP | 2000166940 | 6/2000 |
| JP | 2000233009 | 8/2000 |
| JP | 2001-46387 | 2/2001 |
| JP | 2001136599 A | 5/2001 |
| JP | 2001170068 | 6/2001 |
| JP | 2002505596 | 2/2002 |
| JP | 2002078764 | 3/2002 |
| JP | 2002515786 | 5/2002 |
| JP | 2002537013 | 5/2002 |
| JP | 2002521118 | 7/2002 |
| JP | 2002537939 | 11/2002 |
| JP | 2003-000592 | 1/2003 |
| JP | 2003050298 | 7/2003 |
| JP | 2003204982 | 7/2003 |
| JP | 2004-504898 | 2/2004 |
| JP | 2004-507280 | 3/2004 |
| JP | 2004154256 | 3/2004 |
| JP | 2004-509671 | 4/2004 |
| JP | 2004-512856 | 4/2004 |
| JP | 2004130145 | 4/2004 |
| JP | 2004147719 | 5/2004 |
| JP | 2005503388 | 2/2005 |
| JP | 2005527336 | 9/2005 |
| JP | 2005323213 | 11/2005 |
| JP | 2006520247 | 9/2006 |
| JP | 2008515559 | 5/2008 |
| JP | 2009518126 | 5/2009 |
| JP | 2010517695 | 5/2010 |
| JP | 2010-178525 | 8/2010 |
| JP | 2010-187467 | 8/2010 |
| KR | 2001-0019317 | 3/2001 |
| KR | 1020010024871 | 3/2001 |
| KR | 2002-0038547 | 5/2002 |
| KR | 100400870 | 10/2003 |
| KR | 20060121267 | 11/2006 |
| KR | 1020060113930 | 11/2006 |
| KR | 1020070065332 | 6/2007 |
| KR | 1020070070161 | 7/2007 |
| KR | 1020070098856 | 10/2007 |
| KR | 1020070104878 | 10/2007 |
| KR | 1020070114105 | 11/2007 |
| KR | 101027600 | 4/2011 |
| KR | 101075536 | 10/2011 |
| KR | 101075878 | 10/2011 |
| KR | 101118480 | 3/2012 |
| KR | 1020000059516 | 4/2012 |
| KR | 101154520 | 6/2012 |
| KR | 10-2013-0124598 | 11/2013 |
| KR | 10-1365946 | 2/2014 |
| TW | 386883 | 9/2000 |
| TW | 201208734 A | 3/2012 |
| WO | WO9312742 | 7/1993 |
| WO | WO9524159 | 9/1995 |
| WO | WO9625888 | 8/1996 |
| WO | WO9634568 | 11/1996 |
| WO | WO9639079 | 12/1996 |
| WO | WO9735518 | 10/1997 |
| WO | WO9832379 | 7/1998 |
| WO | WO9852465 | 11/1998 |
| WO | WO9933520 | 7/1999 |
| WO | WO9939677 | 8/1999 |
| WO | WO9949788 | 10/1999 |
| WO | WO200006032 | 2/2000 |
| WO | WO0015300 | 3/2000 |
| WO | WO0021612 | 4/2000 |
| WO | WO0048518 | 8/2000 |
| WO | WO0053113 | 9/2000 |
| WO | WO200071021 | 11/2000 |
| WO | WO0128623 | 4/2001 |
| WO | WO001045550 | 6/2001 |
| WO | WO0182777 | 11/2001 |
| WO | WO0182778 | 11/2001 |
| WO | WO0187161 | 11/2001 |
| WO | WO01080709 | 11/2001 |
| WO | WO2001087161 | 11/2001 |
| WO | WO0209812 | 2/2002 |
| WO | WO0209813 | 2/2002 |
| WO | WO02015768 | 2/2002 |
| WO | WO0224050 | 3/2002 |
| WO | WO200149194 | 7/2002 |
| WO | WO2002054018 | 7/2002 |
| WO | WO02092168 | 11/2002 |
| WO | WO03053266 | 7/2003 |
| WO | WO03065347 | 8/2003 |
| WO | WO03070105 | 8/2003 |
| WO | WO03077833 | 9/2003 |
| WO | WO03086215 | 10/2003 |
| WO | WO03096883 | 11/2003 |
| WO | WO03099177 | 12/2003 |
| WO | WO03099382 | 12/2003 |
| WO | WO03101530 | 12/2003 |
| WO | WO2004000116 | 12/2003 |
| WO | WO 2004035138 | 4/2004 |
| WO | WO2004080147 | 9/2004 |
| WO | WO2004110558 | 12/2004 |
| WO | WO2005/011804 | 2/2005 |
| WO | WO2005065408 | 7/2005 |
| WO | WO2005065409 | 7/2005 |
| WO | WO2005090978 | 9/2005 |

(56) References Cited

FOREIGN PATENT DOCUMENTS

| | | |
|---|---|---|
| WO | WO2005113068 | 12/2005 |
| WO | WO2006/042163 | 4/2006 |
| WO | WO2006036870 | 4/2006 |
| WO | WO2006042168 | 4/2006 |
| WO | WO2006042201 | 4/2006 |
| WO | WO2006065671 | 6/2006 |
| WO | WO2006082573 | 8/2006 |
| WO | WO2006104568 | 10/2006 |
| WO | WO2006110388 | 10/2006 |
| WO | WO2007067563 | 6/2007 |
| WO | WO2008036479 | 3/2008 |
| WO | WO2008036622 | 3/2008 |
| WO | WO2008144274 | 11/2008 |
| WO | WO2009013729 | 1/2009 |
| WO | WO2009149390 | 10/2009 |
| WO | WO2010006293 | 1/2010 |
| WO | WO2010102128 | 9/2010 |
| WO | WO2012134645 | 10/2012 |
| WO | WO2013048912 | 4/2013 |
| WO | WO2013178830 | 12/2013 |
| WO | WO2014043206 | 3/2014 |
| WO | WO2014045216 | 3/2014 |
| WO | WO2014055708 | 4/2014 |
| WO | WO2014057388 | 4/2014 |
| WO | WO2014127091 | 8/2014 |
| WO | WO2014137835 | 9/2014 |
| WO | WO2015160708 | 10/2015 |
| WO | WO2016054155 | 4/2016 |
| WO | WO2016115363 | 7/2016 |
| WO | WO2017127328 | 7/2017 |
| WO | WO2017149506 | 9/2017 |
| WO | WO2017165595 | 9/2017 |
| WO | WO 2017/212489 | 12/2017 |
| WO | WO2017223312 | 12/2017 |
| WO | WO2018035012 | 2/2018 |
| WO | WO2018158355 | 9/2018 |
| WO | WO2019008573 | 1/2019 |
| WO | WO 2019147596 | 8/2019 |
| WO | WO2019164836 | 8/2019 |
| WO | WO2020009324 | 1/2020 |
| WO | WO2020075906 | 4/2020 |
| WO | WO2020080730 | 4/2020 |
| WO | WO2020121307 | 6/2020 |
| WO | WO2020198666 | 10/2020 |
| WO | WO2022240843 | 11/2022 |
| WO | WO2024137052 | 6/2024 |

OTHER PUBLICATIONS

Ultrasonic generator for surgical applications and non-invasive cancer treatment by high intensity focused ultrasound, M.S. theses, Université Paris-Saclay, (2016) (Year: 2016).*
PCT/US2019/63095 International Search Report mailed Mar. 31, 2020, 27 pages.
Adams et al., "High Intensity Focused Ultrasound Ablation of Rabbit Kidney Tumors" Sonablate High-Intensity Focused Ultrasound device; Journal of Endourology vol. 10, No. 1, (Feb. 1996).
Agren, Magnus S. et al., Collagenase in Wound Healing: Effect of Wound Age and Type. The Journal of Investigative Dermatology, vol. 99/No. 6, (Dec. 1992).
Alam, M., "The future of noninvasive procedural dermatology". Semin Cutan Med Surg. Mar. 2013; 32(1):59-61.
Alam, M., et al., "Ultrasound tightening of facial and neck skin: a rater-blinded prospective cohort study". J Am Acad Dermatol, 2010. 62(2): p. 262-9.
Alexiades-Armenakas, M., "Ultrasound Technologies for Dermatologic Techniques". J Drugs Derm. 2014. 12 (11): p. 1305.
Alster, T.S., et al., "Noninvasive lifting of arm, thigh, and knee skin with transcutaneous intense focused ultrasound". Dermatol Surg, 2012. 38(5): p. 754-9.
Alster, Tinas S., Tanzi, Elizabeth L., "Cellulite Treatment using a Novel Combination Radiofrequency, Infrared Light, and Mechanical Tissue Manipulation Device," Journal of Cosmetic & Laser Therapy, Jun. 2005, vol. 7, Issue 2, pp. 81-85.
Arosarena, O., "Options and Challenges for Facial Rejuvenation in Patients With Higher Fitzpatrick Skin Phototypes". JAMA Facial Plastic Surgery, 2015.
Arthur et al., "Non-invasive estimation of hyperthermia temperatures with ultrasound," Int. J. Hyperthermia, Sep. 2005, 21(6), pp. 589-600.
Barthe et al., "Ultrasound therapy system and ablation results utilizing miniature imaging/therapy arrays," Ultrasonics Symposium, 2004 IEEE, Aug. 23, 2004, pp. 1792-1795, vol. 3.
Bozec, Laurent et al., Thermal Denaturation Studies of Collagen by Microthermal Analysis and Atomic Force Microscopy, Biophysical Journal, vol. 101, pp. 228-236. (Jul. 2001).
Brobst, R.W., et al., "Noninvasive Treatment of the Neck". Facial Plast Surg Clin North Am, 2014. 22(2): p. 191-202.
Brobst, R.W., et., al., "Ulthera: initial and six month results". Facial Plast Surg Clin North Am, 2012. 20(2): p. 163-76.
Brown J A et al: "Fabrication and performance of 40-60 MHz annular arrays", 2003 IEEE Ultrasonics Symposium Proceedings. Honolulu, Hawaii, Oct. 5-8, 2003; [IEEE Ultrasonics Symposium Proceedings], New York, NY : IEEE, US, vol. 1, Oct. 5, 2003 (Oct. 5, 2003), pp. 869-872.
Calderhead et al., "One Mechanism Behind LED Photo-Therapy for Wound Healing and Skin Rejuvenation: Key Role of the Mast Cell" Laser Therapy 17.3: 141-148 (2008).
Carruthers et al., "Consensus Recommendations for Combined Aesthetic Interventions in the Face Using Botulinum Toxin, Fillers, and Energy-Based Devices" Dermatol Surg 2016 (pp. 1-12).
Casabona, G., et al., "Microfocused Ultrasound with Visualization and Calcium Hydroxylapatite for Improving Skin Laxity and Cellulite Appearance"; Plast Reconstr Surg Glob Open. Jul. 25, 2017;5(7):e1388, 8 pages.
Casabona, G., et al., "Microfocused Ultrasound With Visualization and Fillers for Increased Neocollagenesis: Clinical and Histological Evaluation". Dermatol Surg 2014;40:S194-S198.
Chan, N.P., et al., "Safety study of transcutaneous focused ultrasound for non-invasive skin tightening in Asians". Lasers Surg Med, 2011. 43(5): p. 366-75.
Chapelon et al., "Effects of Cavitation in the High Intensity Therapeutic Ultrasound", Ultrasonics Symposium—1357 (1991).
Chapelon, et al., "Thresholds for Tissue Ablation by Focused Ultrasound" (1990).
Chen, L. et al., "Effect of Blood Perfusion on the ablation of liver parenchyma with high intensity focused ultrasound," Phys. Med. Biol; 38:1661-1673; 1993b.
Coon, Joshua et al., "Protein identification using sequential ion/ion reactions and tandem mass spectrometry" Proceedings of the National Academy of Sciences of the USA, vol. 102, No. 27, Jul. 27, 2005, pp. 9463-9468.
Corry, Peter M., et al., "Human Cancer Treatment with Ultrasound", IEEE Transactions on Sonics and Ultrasonics, vol. SU-31, No. 5, Sep. 1984, pp. 444, 456.
Damianou et al., "Application of the Thermal Dose Concept for Predicting the Necrosed Tissue Volume During Ultrasound Surgery," 1993 IEEE Ultrasound Symposium, pp. 1199-1202.
Daum et al., Design and Evaluation of a Feedback Based Phased Array System for Ultrasound Surgery, IEEE Transactions on Ultrasonics, Ferroelectrics, and Frequency Control, vol. 45, No. 2, Mar. 1998, pp. 431-438.
Davis, Brian J., et al., "An Acoustic Phase Shift Technique for the Non-Invasive Measurement of Temperature Changes in Tissues", 1985 Ultrasonics Symposium, pp. 921-924.
Dayan, S.H., et al., "Prospective, Multi-Center, Pivotal Trial Evaluating the Safety and Effectiveness of Micro-Focused Ultrasound with Visualization (MFU_V) for Improvement in Lines and Wrinkles of the Décolletage". Plast Reconstr Surg. Oct. 2014; 134 (4 Suppl 1):123-4.
Decision of the Korean Intellectual Property Tribunal dated Jun. 28, 2013 regarding Korean Patent No. 10-1142108, which is related to the pending application and/or an application identified in the Table

(56) References Cited

OTHER PUBLICATIONS on pp. 1-4 of the Information Disclosure Statement herein (English translation, English translation certification, and Korean decision included).
Delon Martin, C., et al., "Venous Thrombosis Generation By Means of High-Intensity Focused Ultrasound" Ultrasound in Med. & Biol., vol. 21, No. 1, pp. 113-119 (1995).
Dierickx, Christine C., "The Role of Deep Heating for Noninvasive Skin Rejuvenation" Lasers in Surgery and Medicine 38:799-807 (2006).
Dobke, M.K., et al., "Tissue restructuring by energy-based surgical tools". Clin Plast Surg, 2012. 39(4): p. 399-408.
Dong, Yuan-Lin et al., "Effect of Ibuprofen on the Inflammatory Response to Surgical Wounds" The Journal of Trauma, vol. 35, No. 3. (1993).
Driller et al., "Therapeutic Applications of Ultrasound: A Review" IEEE Engineering in Medicine and Biology; (Dec. 1987) pp. 33-40.
Dvivedi, Sanjay, et al. "Effect of Ibuprofen and diclofenac sodium on experimental wound healing" Indian Journal of Experimental Biology, vol. 35, pp. 1243-1245. (Nov. 1997).
Fabi, S.G., "Microfocused Ultrasound With Visualization for Skin Tightening and Lifting: My Experience and a Review of the Literature". Dermatol Surg. Dec. 2014; 40 Suppl 12:S164-7.
Fabi, S.G., "Noninvasive skin tightening: focus on new ultrasound techniques". Clin Cosmet Investig Dermatol. Feb. 5, 2015; 8:47-52.
Fabi, S.G., et. al., "A prospective multicenter pilot study of the safety and efficacy of microfocused ultrasound with visualization for improving lines and wrinkles of the décolleté". Dermatol Surg. Mar. 2015; 41(3):327-35.
Fabi, S.G., et. al., "Evaluation of microfocused ultrasound with visualization for lifting, tightening, and wrinkle reduction of the decolletage". J Am Acad Dermatol, 2013. 69(6): p. 965-71.
Fabi, S.G., et. al., "Future directions in cutaneous laser surgery". Dermatol Clin, 2014. 32(1): p. 61-9.
Fabi, S.G., et. al., "Retrospective Evaluation of Micro-focused Ultrasound for Lifting and Tightening the Face and Neck". Dermatol Surg, 2014.
Friedmann D.P., "Comments on evaluation of microfocused ultrasound system for improving skin laxity and tightening in the lower face". Aesthet Surg J. Mar. 2015;35(3):NP81-2.
Friedmann, D.P., et. al., "Combination of intense pulsed light, Sculptra, and Ultherapy for treatment of the aging face". J Cosmet Dermatol, 2014. 13(2): p. 109-18.
Fry, W.J. et al., "Production of Focal Destructive Lesions in the Central Nervous System with Ultrasound," J. Neurosurg., 11:471-478; 1954.
Fujimoto, et al., "A New Cavitation Suppression Technique for Local Ablation Using High-Intensity Focused Ultrasound" Ultrasonics Symposium—1629 (1995).
Gliklich et al., Clinical Pilot Study of Intense Ultrasound therapy to Deep Dermal Facial Skin and Subcutaneous Tissues, Arch Facial Plastic Surgery, Mar. 1, 2007, vol. 9, No. 1.
Gold, M.H., et. al., "Use of Micro-Focused Ultrasound with Visualization to Lift and Tighten Lax Knee Skin". J Cosmet Laser Ther, 2014: p. 1-15.
Goldberg, D.J., et. al., "Safety and Efficacy of Microfocused Ultrasound to Lift, Tighten, and Smooth the Buttocks". Dermatol Surg 2014; 40:1113-1117.
Greene, R.M., et al., "Skin tightening technologies". Facial Plast Surg. Feb. 2014; 30(1):62-7.
Greenhalgh, David G., "Wound healing and diabetes mellitus" Clinics in Plastic Surgery 30; 37-45. (2003).
Guo, S. et al., "Factors Affecting Wound Healing" Critical Reviews in Oral Biology & Medicine, J Dent Res 89(3), pp. 219-229. (2010).
Haar, G.R. et al., "Tissue Destruction with Focused Ultrasound in Vivo," Eur. Urol. 23 (suppl. 1):8-11; 1993.
Hantash, Basil M. et al., "Bipolar Fractional Radiofrequency Treatment Induces Neoelastogenesis and Neocollagenesis" Lasers in Surgery and Medicine 41:1-9 (2009).
Hantash, Basil M. et al., "In Vivo Histological Evaluation of a Novel Ablative Fractional Resurfacing Device" Lasers in Surgery and Medicine 39:96-107 (2007).
Harris, M.O., "Safety of Microfocused Ultrasound With Visualization in Patients With Fitzpatrick Skin Phototypes III to VI". JAMA Facial Plast. Surg, 2015.
Hart, et. al., "Current Concepts in the Use of PLLA: Clinical Synergy Noted with Combined Use of Microfocused Ultrasound and Poly-I-Lactic Acid on the Face, Neck, and Décolletage". Amer. Soc. Plast. Surg. 2015. 136; 180-187S.
Hassan et al., "Structure and Applications of Poly(vinyl alcohol) Hydrogels Produced by Conventional Crosslinking or by Freezing/Thawing Methods," advanced in Polymer Science, 2000, pp. 37-65, vol. 153.
Hassan et al., "Structure and Morphology of Freeze/Thawed PVA Hydrogels," Macromolecules, Mar. 11, 2000, pp. 2472-2479, vol. 33, No. 7.
Hexsel et al., "A Validated Photonumeric Cellulite Severity Scale"; J Eur Acad Dermatol Venereol. May 2009; 23(5):523-8, 6 pages.
Hitchcock, T.M. et. al., "Review of the safety profile for microfocused ultrasound with Visualization". Journal of Cosmetic Dermatology, 13, 329-335. (2014).
Husseini et al, "The Role of Cavitation in Acoustically Activated Drug Delivery," J. Control Release, Oct. 3, 2005, pp. 253-261, vol. 107(2).
Husseini et al. "Investigating the mechanism of acoustically activated uptake of drugs from Pluronic micelles," BMD Cancer 2002, 2:20k, Aug. 30, 2002, pp. 1-6.
Hynynen et al., Temperature Distributions During Local Ultrasound Induced Hyperthermia in Vivo, Ultrasonics Symposium—745 (1982).
Jeffers et al., "Evaluation of the Effect of Cavitation Activity on Drug-Ultrasound Synergisms," 1993 IEEE Ultrasonics Symposium, pp. 925-928.
Jenne, J., et al., "Temperature Mapping for High Energy US-Therapy", 1994 Ultrasonics Symposium, pp. 1879-1882.
Jeong, K.H., et al., "Neurologic complication associated with intense focused ultrasound". J Cosmet Laser Ther, 2013.
Johnson, S.A., et al., "Non-Intrusive Measurement of Microwave and Ultrasound-Induced Hyperthermia by Acoustic Temperature Tomography", Ultrasonics Symposium Proceedings, pp. 977-982. (1977).
Ketterling J. A. et al.: "Design and fabrication of a 40-MHz annular array transducer", IEEE Transactions on Ultrasonics, Ferroelectrics and Frequency Control, IEEE, US, vol. 52, No. 4, Apr. 1, 2005 (Apr. 1, 2005), pp. 672-681.
Kim, H.J., et al., "Coagulation and ablation patterns of high-intensity focused ultrasound on a tissue mimicking phantom and cadaveric skin". Laser Med Sci. Sep. 4, 2015.
Kornstein, A.N., "Ulthera for silicone lip correction". Plast Reconstr Surg, 2012. 129(6): p. 1014e-1015e.
Kornstein, A.N., "Ultherapy shrinks nasal skin after rhinoplasty following failure of conservative measures". Plast Reconstr Surg, 2013. 131(4): p. 664e-6e.
Krischak, G.D., et al., "The effects of non-steroidal anti-inflammatory drug application on incisional wound healing in rats" Journal of Wound Care, vol. 6, No. 2, (Feb. 2007).
Laubach, H.J., et. al., "Confined Thermal Damage with Intense Ultrasound (IUS)" [abstr.] American Society for Laser Medicine and Surgery Abstracts, p. 15 #43 (Apr. 2006).
Laubach, H.J., et. al., "Intense focused ultrasound: evaluation of a new treatment modality for precise microcoagulation within the skin". Dermatol Surg, 2008. 34(5): p. 727-34.
Lee, H.J., et. al., "The efficacy and safety of intense focused ultrasound in the treatment of enlarged facial pores in Asian skin". J Dermatolog Treat, 2014.
Lee, H.S., et. al., "Multiple Pass Ultrasound Tightening of Skin Laxity of the Lower Face and Neck". Dermatol Surg, 2011.
Lin, Sung-Jan, et al., "Monitoring the thermally induced structural transitions of collagen by use of second-harmonic generation microscopy" Optics Letters, vol. 30, No. 6, (Mar. 15, 2005).
Macgregor J.L., et al., "Microfocused Ultrasound for Skin Tightening". Semin Cutan Med Surg 32:18-25. (2013).

(56) References Cited

OTHER PUBLICATIONS

Madersbacher, S. et al., "Tissue Ablation in Benign Prostatic Hyperplasia with High Intensity Focused Ultrasound," Dur. Urol., 23 (suppl. 1):39-43; 1993.

Makin et al, "B-Scan Imaging and Thermal Lesion Monitoring Using Miniaturized Dual-Functionality Ultrasound Arrays," Ultrasonics Symposium, 2004 IEEE, Aug. 23, 2004, pp. 1788-1791, vol. 3.

Makin et al, "Confirmed Bulk Ablation and Therapy Monitoring Using Intracorporeal Image-Treat Ultrasound Arrays," 4th International Symposium on Therapeutic Ultrasound, Sep. 19, 2004.

Makin et al., "Miniaturized Ultrasound Arrays for Interstitial Ablation and Imaging," UltraSound Med. Biol. 2005, Nov. 1, 2005, pp. 1539-1550, vol. 31(11).

Manohar et al, "Photoacoustic mammography laboratory prototype: imaging of breast tissue phantoms," Journal of Biomedical Optics, Nov./Dec. 2004, pp. 1172-1181, vol. 9, No. 6.

Mast et al, "Bulk Ablation of Soft Tissue with Intense Ultrasound; Modeling and Experiments," J. Acoust. Soc. Am., Oct. 1, 2005, pp. 2715-2724, vol. 118(4).

Meshkinpour, Azin, et al., "Treatment of Hypertrophic Scars and Keloids With a Radiofrequency Device: A Study of Collagen Effects" Lasers in Surgery and Medicine 37:343-349 (2005).

Microchip microID 125 KHz RFID System Design Guide, Microchip Technology Inc. (2004).

Minkis, K., et. al., "Ultrasound skin tightening". Dermatol Clin, 2014. 32(1): p. 71-7.

Mitragotri, S., "Healing sound: the use of ultrasound in drug delivery and other therapeutic applications," Nature Reviews; Drug Delivery, pp. 255-260, vol. 4 (Mar. 2005).

Mosser, David M. et al., "Exploring the full spectrum of macrophage activation" Nat Rev Immunol; 8(12): 958-969. (Dec. 2008).

Murota, Sei-Itsu, et al., "Stimulatory Effect of Prostaglandins on the Production of Hexosamine-Containing Substances by Cultured Fibroblasts (3) Induction of Hyaluronic Acid Synthetase by Prostaglandin" Department of Pharmacology, Tokyo Metropolitan Institute of Gerontology, Itabashiku, Tokyo-173, Japan. (Nov. 1977, vol. 14, No. 5).

Murota, Sei-Itsu, et al., "The Stimulatory Effect of Prostaglandins on Production of Hexosamine-Containing Substances by Cultured Fibroblasts" Department of Pharmacology, Tokyo Metropolitan Institute of Gerontology, Itabashiku, Tokyo-173, Japan. (Aug. 1976, vol. 12, No. 2).

Nestor, M.S. et. al., "Safety and Efficacy of Micro-focused Ultrasound Plus Visualization for the Treatment of Axillary Hyperhidrosis". J Clin Aesthet Dermatol, 2014. 7(4): p. 14-21.

Oni, G., et. al. "Response to 'comments on evaluation of microfocused ultrasound system for improving skin laxity and tightening in the lower face'". Aesthet Surg J. Mar. 2015;35(3):NP83-4.

Oni, G., et. al., "Evaluation of a Microfocused Ultrasound System for Improving Skin Laxity and Tightening in the Lower Face". Aesthet Surg J, 2014. 38:861-868.

Pak, C.S., et. al., "Safety and Efficacy of Ulthera in the Rejuvenation of Aging Lower Eyelids: A Pivotal Clinical Trial". Aesthetic Plast Surg, 2014.

Paradossi et al., "Poly(vinyl alcohol) as versatile biomaterial for potential biomedical applications," Journal of Materials Science: Materials in Medicine, 2003, pp. 687-691, vol. 14.

Pritzker, R.N., et. al., "Updates in noninvasive and minimally invasive skin tightening". Semin Cutan Med Surg. Dec. 2014;33(4):182-7.

Pritzker, R.N., et. al., "Comparison of different technologies for noninvasive skin tightening". Journal of Cosmetic Dermatology, 13, 315-323. (2014).

Rappolee, Daniel A., et al., "Wound Macrophages Express TGF and Other Growth Factors in Vivo: Analysis by mRNA Phenotyping" Science, vol. 241, No. 4866 (Aug. 1988).

Reid, Gavin, et al., "Tandem Mass spectrometry of ribonuclease A and B: N-linked glycosylation site analysis of whole protein ions," Analytical Chemistry. Feb. 1, 2002, vol. 74, No. 3, pp. 577-583.

Righetti et al, "Elastographic Characterization of HIFU-Induced Lesions in Canine Livers," 1999, Ultrasound in Med & Bio, vol. 25, No. 7, pp. 1099-1113.

Rokhsar, C., et al., "Safety and efficacy of microfocused ultrasound in tightening of lax elbow skin". Dermatol Surg. 2015; 41(7):821-6.

Rosenberg, Carol S. "Wound Healing in the Patient with Diabetes Mellitus" Nursing Clinics of North America, vol. 25, No. 1, (Mar. 1990).

Saad et al., "Ultrasound-Enhanced Effects of Adriamycin Against Murine Tumors," Ultrasound in Med. & Biol. vol. 18, No. 8, pp. 715-723 (1992).

Sabet-Peyman, E.J. et al., "Complications Using Intense Ultrasound Therapy to Treat Deep Dermal Facial Skin and Subcutaneous Tissues". Dermatol Surg 2014; 40:1108-1112.

Sandulache, Vlad C. et al., "Prostaglandin E2 inhibition of keloid fibroblast migration, contraction, and transforming growth factor (TGF)—B1—induced collagen synthesis" Wound Rep Reg 15 122-133, 2007. (2007).

Sanghvi, N.T., et al., "Transrectal Ablation of Prostate Tissue Using Focused Ultrasound," 1993 Ultrasonics Symposium, IEEE, pp. 1207-1210.

Sasaki, G.H. et. al., "Clinical Efficacy and Safety of Focused-Image Ultrasonography: A 2-Year Experience". Aesthet Surg J, 2012.

Sasaki, G.H. et. al., "Microfocused Ultrasound for Nonablative Skin and Subdermal Tightening to the Periorbitum and Body Sites: Preliminary Report on Eighty-Two Patients". Journal of Cosmetics, Dermatological Sciences and Applications, 2012, 2, 108-116.

Sassen, Sander, "ATI's R520 architecture, the new king of the hill?" http://www.hardwareanalysis.com/content/article/1813, Sep. 16, 2005, 2 pages.

Seip, Ralf, et al., "Noninvasive Detection of Thermal Effects Due to Highly Focused Ultrasonic Fields," IEEE Symposium, pp. 1229-1232, vol. 2, Oct. 3-Nov. 1993.

Seip, Ralf, et al., "Noninvasive Estimation of Tissue Temperature Response to Heating Fields Using Diagnostic Ultrasound," IEEE Transactions on Biomedical Engineering, vol. 42, No. 8, Aug. 1995, pp. 828-839.

Simon et al., "Applications of Lipid-Coated Microbubble Ultrasonic Contrast to Tumor Therapy," Ultrasound in Med. & Biol. vol. 19, No. 2, pp. 123-125 (1993).

Sklar, L.R., et. al., "Use of transcutaneous ultrasound for lipolysis and skin tightening: a review". Aesthetic Plast Surg, 2014. 38(2): p. 429-41.

Smith, Nadine Barrie, et al., "Non-invasive in Vivo Temperature Mapping of Ultrasound Heating Using Magnetic Resonance Techniques", 1994 Ultrasonics Symposium, pp. 1829-1832, vol. 3.

Sonocare, Inc. Therapeutic Ultrasound System Model CST-100 Instruction Manual (1985).

Suh, D.H., et. al., "A intense-focused ultrasound tightening for the treatment of infraorbital laxity". J Cosmet Laser Ther, 2012. 14(6): p. 290-5.

Suh, D.H., et. al., "Comparative histometric analysis of the effects of high-intensity focused ultrasound and radiofrequency on skin". J Cosmet Laser Ther. Mar. 24, 2015:1-7.

Suh, D.H., et. al., "Intense Focused Ultrasound Tightening in Asian Skin: Clinical and Pathologic Results" American Society for Dermatologic Surgery, Inc.; 37:1595-1602. (2011).

Surry et al., "Poly(vinyl alcohol) cryogel phantoms for use in ultrasound and MR imaging," Phys. Med. Biol., Dec. 6, 2004, pp. 5529-5546, vol. 49.

Syka J. E. P. et al., "Peptide and Protein Sequence Analysis by Electron Transfer Dissociation Mass Spectrometry," Proceedings of the National Academy of Sciences of USA, National Academy of Science, Washington, DC, vol. 101, No. 26, Jun. 29, 2004, pp. 9528-9533.

Talbert, D. G., "An Add-On Modification for Linear Array Real-Time Ultrasound Scanners to Produce 3D Displays," UTS Int'l 1977 Brighton, England (Jun. 28-30, 1977) pp. 57-67.

Tata et al., "Interaction of Ultrasound and Model Membrane Systems: Analyses and Predictions," American Chemical Society, Phys. Chem. 1992, 96, pp. 3548-3555.

Ueno, S., et al., "Ultrasound Thermometry in Hyperthermia", 1990 Ultrasonic Symposium, pp. 1645-1652.

(56) References Cited

OTHER PUBLICATIONS

Verhofstad, Michiel H.J. et al., "Collagen Synthesis in rat skin and ileum fibroblasts is affected differently by diabetes-related factors" Int. J. Exp. Path. (1998), 79, 321-328.
Wang, H., et al., "Limits on Focused Ultrasound for Deep Hyperthermia", 1994 Ultrasonic Symposium, Nov. 1-4, 1994, pp. 1869-1872, vol. 3.
Wasson, Scott, "NVIDIA's GeForce 7800 GTX graphics processor Power MADD," http://techreport.com/reviews/2005q2/geforce-7800gtx/index.x?pg=1, Jun. 22, 2005, 4 pages.
Webster et al. "The role of ultrasound-induced cavitation in the 'in vitro' stimulation of collagen synthesis in human fibroblasts"; Ultrasonics pp. 33-37(Jan. 1980).
Weiss, M., "Commentary: noninvasive skin tightening: ultrasound and other technologies: where are we in 2011?" Dermatol Surg, 2012. 38(1): p. 28-30.
White et al "Selective Creating of Thermal Injury Zones in the Superficial Musculoaponeurotic System Using Intense Ultrasound Therapy," Arch Facial Plastic Surgery, Jan./Feb. 2007, vol. 9, No. 1 (pp. 22-29).
White, W. M., et al., "Selective Transcutaneous Delivery of Energy to Facial Subdermal Tissues Using the Ultrasound Therapy System" [abstr]. American Society for Laser Medicine and Surgery Abstracts, p. 37 #113 (Apr. 2006).
White, W. Matthew, et al., "Selective Transcutaneous Delivery of Energy to Porcine Soft Tissues Using Intense Ultrasound (IUS)" Lasers in Surgery and Medicine 40:67-75 (2008).
Woodward, J.A., et. al. "Safety and Efficacy of Combining Microfocused Ultrasound With Fractional CO2 Laser Resurfacing for Lifting and Tightening the Face and Neck". Dermatol Surg, Dec. 2014 40:S190-S193.
Zelickson, Brian D. et al., "Histological and Ultrastructural Evaluation of the Effects of a Radiofrequency-Based Nonablative Dermal Remodeling Device, A Pilot Study" Arch Dermatol, vol. 140, (Feb. 2004).
U.S. Appl. No. 12/996,616, filed Jan. 12, 2011, Hand Wand for Ultrasonic Cosmetic Treatment and Imaging.
U.S. Appl. No. 16/703,019, filed Dec. 6, 2019, System and Method for Ultrasound Treatment.
U.S. Appl. No. 13/245,822, filed Sep. 26, 2011, System and Method for Cosmetic Treatment.
U.S. Appl. No. 13/245,852, filed Sep. 26, 2011, Systems for Cosmetic Treatment.
U.S. Appl. No. 13/245,864, filed Sep. 27, 2011, Methods for Non-Invasive Cosmetic Treatment of the Eye Region.
U.S. Appl. No. 13/246,117, filed Sep. 27, 2011, Methods for Non-Invasive Lifting and Tightening of the Lower Face and Neck.
U.S. Appl. No. 13/246,112, filed Sep. 27, 2011, Tissue Imaging and Treatment Method.
U.S. Appl. No. 14/193,234, filed Feb. 28, 2014, Devices and Methods for Multi-Focus Ultrasound Therapy.
U.S. Appl. No. 16/541,476, filed Aug. 15, 2019, Devices and Methods for Multi-Focus Ultrasound Therapy.
U.S. Appl. No. 15/302,436, filed Oct. 6, 2016, Band Transducer Ultrasound Therapy.
U.S. Appl. No. 15/855,949, filed Dec. 27, 2017, Band Transducer Ultrasound Therapy.
U.S. Appl. No. 16/797,393, filed Feb. 21, 2020, Band Transducer Ultrasound Therapy.
U.S. Appl. No. 15/562,384, filed Oct. 27, 2017, Systems and Methods for Cosmetic Ultrasound Treatment of Skin.
U.S. Appl. No. 16/069,319, filed Jul. 11, 2018, Compact ultrasound device having annular ultrasound array peripherally electrically connected to flexible printed circuit board and method of assembly thereof.
U.S. Appl. No. 16/964,914, filed Jul. 24, 2020, Systems and Methods for Simultaneous Multi-Focus Ultrasound Therapy in Multiple Dimensions.
U.S. Appl. No. 16/970,772, filed Aug. 18, 2020, Systems and Methods for Combined Cosmetic Treatment of Cellulite With Ultrasound.
U.S. Appl. No. 17/297,145, filed May 26, 2021, Systems and Methods for Enhancing Efficacy of Ultrasound Treatment.
U.S. Appl. No. 08/950,353, filed Oct. 14, 1997, Imaging, Therapy and Temperature Monitoring Ultrasonic System.
U.S. Appl. No. 09/502,174, filed Feb. 10, 2000, Imaging, Therapy and Temperature Monitoring Ultrasonic System.
U.S. Appl. No. 10/193,419, filed Jul. 10, 2002, Imaging, Therapy and Temperature Monitoring Ultrasonic System.
U.S. Appl. No. 10/944,499, filed Sep. 16, 2004, Method and System for Ultrasound Treatment With a Multi-Directional Transducer.
U.S. Appl. No. 11/163,177, filed Oct. 7, 2005, Method and System for Treating Acne and Sebaceous Glands.
U.S. Appl. No. 10/950,112, filed Sep. 24, 2004, Method and System for Combined Ultrasound Treatment.
U.S. Appl. No. 11/163,178, filed Oct. 7, 2005, Method and System for Treating Stretch Marks.
U.S. Appl. No. 11/245,999, filed Oct. 6, 2005, System and Method for Ultra-High Frequency Ultrasound Treatment.
U.S. Appl. No. 10/944,500, filed Sep. 16, 2004, System and Method for Variable Depth Ultrasound Treatment.
U.S. Appl. No. 11/744,655, filed May 4, 2007, Imaging, Therapy and Temperature Monitoring Ultrasonic System.
U.S. Appl. No. 13/937,190, filed Jul. 8, 2013, Imaging, Therapy and Temperature Monitoring Ultrasonic System.
U.S. Appl. No. 12/135,962, filed Jun. 9, 2008, Method and System for Ultrasound Treatment With a Multi-Directional Transducer.
U.S. Appl. No. 12/792,934, filed Jun. 3, 2010, System and Method for Ultra-High Frequency Ultrasound Treatment.
U.S. Appl. No. 13/914,945, filed Jun. 11, 2013, System and Method for Ultra-High Frequency Ultrasound Treatment.
U.S. Appl. No. 12/834,754, filed Jul. 12, 2010, System and Method for Variable Depth Ultrasound Treatment.
U.S. Appl. No. 14/264,732, filed Apr. 29, 2014, System and Method for Variable Depth Ultrasound Treatment.
U.S. Appl. No. 11/126,760, filed May 11, 2005, Method and System for Three-Dimensional Scanning and Imaging.
U.S. Appl. No. 13/564,552, filed Aug. 1, 2012, Method and System for Controlled Scanning, Imaging and/or Therapy.
U.S. Appl. No. 12/437,726, filed May 8, 2009, Method and System for Combined Ultrasound Treatment.
U.S. Appl. No. 11/163,148, filed Oct. 6, 2005, Method and System for Controlled Thermal Injury of Human Superficial Tissue.
U.S. Appl. No. 13/444,688, filed Apr. 11, 2012, Customized Cosmetic Treatment.
U.S. Appl. No. 16/427,969, filed May 31, 2019, Customized Cosmetic Treatment.
U.S. Appl. No. 11/163,152, filed Oct. 6, 2005, Method and System for Treatment of Sweat Glands.
U.S. Appl. No. 13/444,485, filed Apr. 11, 2012, Methods for Treatment of Sweat Glands.
U.S. Appl. No. 13/603,159, filed Sep. 4, 2012, Methods for Treatment of Hyperhidrosis.
U.S. Appl. No. 13/603,279, filed Sep. 4, 2012, Energy Based Hyperhidrosis Treatment.
U.S. Appl. No. 13/950,728, filed Jul. 25, 2013, Energy Based Hyperhidrosis Treatment.
U.S. Appl. No. 14/571,835, filed Dec. 16, 2014, Energy Based Hyperhidrosis Treatment.
U.S. Appl. No. 15/243,081, filed Aug. 22, 2016, Energy Based Hyperhidrosis Treatment.
U.S. Appl. No. 16/049,364, filed Jul. 30, 2018, Energy Based Hyperhidrosis Treatment.
U.S. Appl. No. 17/209,808, filed Mar. 23, 2021, Energy Based Skin Gland Treatment.
U.S. Appl. No. 11/163,151, filed Oct. 6, 2005, Method and System for Noninvasive Face Lifts and Deep Tissue Tightening.
U.S. Appl. No. 13/444,336, filed Apr. 11, 2012, Treatment of Sub-Dermal Regions for Cosmetic Effects.
U.S. Appl. No. 13/679,430, filed Nov. 16, 2012, Ultrasound Treatment of Sub-Dermal Tissue for Cosmetic Effects.

(56) References Cited

OTHER PUBLICATIONS

U.S. Appl. No. 13/924,376, filed Jun. 21, 2013, Noninvasive Tissue Tightening for Cosmetic Effects.
U.S. Appl. No. 13/924,355, filed Jun. 21, 2013, Noninvasive Aesthetic Treatment for Tightening Tissue.
U.S. Appl. No. 13/924,323, filed Jun. 21, 2013, Energy-Based Tissue Tightening.
U.S. Appl. No. 14/200,852, filed Mar. 7, 2014, Noninvasive Tissue Tightening System.
U.S. Appl. No. 14/200,961, filed Mar. 7, 2014, Energy-Based Tissue Tightening System.
U.S. Appl. No. 16/543,137, filed Aug. 16, 2019, Noninvasive Tissue Tightening System.
U.S. Appl. No. 12/028,636, filed Feb. 8, 2008, Method and System for Noninvasive Face Lifts and Deep Tissue Tightening.
U.S. Appl. No. 13/964,820, filed Aug. 12, 2013, Methods for Noninvasive Skin Tightening.
U.S. Appl. No. 14/201,256, filed Mar. 7, 2014, System for Noninvasive Skin Tightening.
U.S. Appl. No. 15/098,139, filed Apr. 13, 2016, System and Method for Noninvasive Skin Tightening.
U.S. Appl. No. 15/958,939, filed Apr. 20, 2018, System and Method for Noninvasive Skin Tightening.
U.S. Appl. No. 16/698,122, filed Nov. 27, 2019, System and Method for Noninvasive Skin Tightening.
U.S. Appl. No. 17/209,912, filed Mar. 23, 2021, System and Method for Noninvasive Skin Tightening.
U.S. Appl. No. 14/685,390, filed Apr. 13, 2015, Energy-Based Tissue Tightening System.
U.S. Appl. No. 11/163,150, filed Oct. 6, 2005, Method and System for Photoaged Tissue.
U.S. Appl. No. 13/230,498, filed Sep. 12, 2011, Method and System for Photoaged Tissue.
U.S. Appl. No. 14/169,709, filed Jan. 31, 2014, Methods for Treating Skin Laxity.
U.S. Appl. No. 14/692,114, filed Apr. 21, 2015, Systems for Treating Skin Laxity.
U.S. Appl. No. 15/248,407, filed Aug. 26, 2016, Systems for Treating Skin Laxity.
U.S. Appl. No. 15/625,700, filed Jun. 16, 2017, Systems for Treating Skin Laxity.
U.S. Appl. No. 15/821,070, filed Nov. 22, 2017, Ultrasound Probe for Treating Skin Laxity.
U.S. Appl. No. 15/996,255, filed Jun. 1, 2018, Ultrasound Probe for Treating Skin Laxity.
U.S. Appl. No. 16/284,907, filed Feb. 25, 2019, Ultrasound Probe for Treating Skin Laxity.
U.S. Appl. No. 16/797,362, filed Feb. 21, 2020, Ultrasound Probe for Treating Skin Laxity.
U.S. Appl. No. 17/127,721, filed Dec. 18, 2020, Ultrasound Probe for Treating Skin Laxity.
U.S. Appl. No. 11/163,176, filed Oct. 7, 2005, Method and System for Treating Blood Vessel Disorders.
U.S. Appl. No. 13/601,742, filed Aug. 31, 2012, Method and System for Treating Blood Vessel Disorders.
U.S. Appl. No. 12/574,512, filed Oct. 6, 2009, Method and System for Treating Stretch Marks.
U.S. Appl. No. 14/554,668, filed Nov. 26, 2014, Method and System for Treating Stretch Marks.
U.S. Appl. No. 15/260,825, filed Sep. 12, 2016, Method and System for Ultrasound Treatment of Skin.
U.S. Appl. No. 15/625,818, filed Jun. 16, 2017, Method and System for Ultrasound Treatment of Skin.
U.S. Appl. No. 15/829,182, filed Dec. 1, 2017, Ultrasound Probe for Treatment of Skin.
U.S. Appl. No. 15/996,263, filed Jun. 1, 2018, Ultrasound Probe for Treatment of Skin.
U.S. Appl. No. 16/284,920, filed Feb. 25, 2019, Ultrasound Probe for Treatment of Skin.
U.S. Appl. No. 16/797,387, filed Feb. 21, 2020, Ultrasound Probe for Treatment of Skin.
U.S. Appl. No. 11/857,989, filed Sep. 19, 2007, Method and System for Treating Muscle, Tendon, Ligament and Cartilage Tissue.
U.S. Appl. No. 13/494,856, filed Jun. 12, 2012, Method and System for Treating Muscle, Tendon, Ligament and Cartilage Tissue.
U.S. Appl. No. 13/835,635, filed Mar. 15, 2013, Methods for Face and Neck Lifts.
U.S. Appl. No. 13/965,741, filed Aug. 13, 2013, Methods for Preheating Tissue for Cosmetic Treatment of the Face and Body.
U.S. Appl. No. 14/740,092, filed Jun. 15, 2015, Methods for Rejuvenating Skin By Heating Tissue for Cosmetic Treatment of the Face and Body.
U.S. Appl. No. 15/862,400, filed Jan. 4, 2018, Rejuvenating Skin By Heating Tissue for Cosmetic Treatment of the Face and Body.
U.S. Appl. No. 16/409,678, filed May 10, 2019, Rejuvenating Skin By Heating Tissue for Cosmetic Treatment of the Face and Body.
U.S. Appl. No. 17/081,754, filed Oct. 27, 2020, Rejuvenating Skin By Heating Tissue for Cosmetic Treatment of the Face and Body.
U.S. Appl. No. 14/628,198, filed Feb. 20, 2015, System and Method for Treating Cartilage and Injuries to Joints and Connective Tissue.
U.S. Appl. No. 14/554,571, filed Nov. 26, 2014, Methods for Face and Neck Lifts.
U.S. Appl. No. 15/248,454, filed Aug. 26, 2016, Methods for Face and Neck Lifts.
U.S. Appl. No. 16/049,293, filed Jul. 30, 2018, Methods for Face and Neck Lifts.
U.S. Appl. No. 16/697,970, filed Nov. 27, 2019, Methods for Lifting Skin Tissue.
U.S. Appl. No. 12/954,484, filed Nov. 24, 2010, Methods and Systems for Generating Thermal Bubbles for Improved Ultrasound Imaging and Therapy.
U.S. Appl. No. 12/350,383, filed Jan. 8, 2009, Method and System for Treating Acne and Sebaceous Glands.
U.S. Appl. No. 12/116,845, filed May 7, 2008, Method and System for Combined Energy Profile.
U.S. Appl. No. 14/643,749, filed Mar. 10, 2015, Method and System for Combined Energy Profile.
U.S. Appl. No. 08/766,083, filed Dec. 16, 1996, Method and Apparatus for Surface Ultrasound Imaging.
U.S. Appl. No. 09/113,227, filed Jul. 10, 1998, Method and Apparatus for Three Dimensional Ultrasound Imaging.
U.S. Appl. No. 08/944,261, filed Oct. 6, 1997, Wideband Acoustic Transducer.
U.S. Appl. No. 09/434,078, filed Nov. 5, 1999, Method and Apparatus for Three Dimensional Ultrasound Imaging.
U.S. Appl. No. 09/523,890, filed Mar. 13, 2000, Method and Apparatus for Three Dimensional Ultrasound Imaging.
U.S. Appl. No. 09/419,543, filed Oct. 18, 1999, Peripheral Ultrasound Imaging System.
U.S. Appl. No. 09/750,816, filed Dec. 28, 2000, Visual Imaging System for Ultrasonic Probe.
U.S. Appl. No. 10/358,110, filed Feb. 4, 2003, Visual Imaging System for Ultrasonic Probe.
U.S. Appl. No. 11/380,161, filed Apr. 25, 2006, Method and System for Enhancing Computer Peripheral Safety.
U.S. Appl. No. 11/554,272, filed Oct. 30, 2006, Visual Imaging System for Ultrasonic Probe.
U.S. Appl. No. 13/071,298, filed Mar. 24, 2011, Visual Imaging System for Ultrasonic Probe.
U.S. Appl. No. 13/854,936, filed Mar. 25, 2013, Visual Imaging System for Ultrasonic Probe.
U.S. Appl. No. 12/509,254, filed Jul. 24, 2009, Method and System for Enhancing Computer Peripheral Safety.
U.S. Appl. No. 13/453,847, filed Apr. 23, 2012, Method and System for Enhancing Computer Peripheral Safety.
U.S. Appl. No. 11/538,794, filed Oct. 4, 2006, Ultrasound System and Method for Imaging and/or Measuring Displacement of Moving Tissue and Fluid.
U.S. Appl. No. 09/502,175, filed Feb. 10, 2000, Method and Apparatus for Safely Delivering Medicants to a Region of Tissue, Using Imaging, Therapy and Temperature Monitoring.

(56) References Cited

OTHER PUBLICATIONS

U.S. Appl. No. 08/943,728, filed Oct. 3, 1997, Method and Apparatus for Safely Delivering Medicants to a Region of Tissue Using Ultrasound.
U.S. Appl. No. 12/415,945, filed Mar. 31, 2009, Method and System for Noninvasive Mastopexy.
U.S. Appl. No. 11/163,155, filed Oct. 6, 2005, Method and System for Noninvasive Mastopexy.
U.S. Appl. No. 11/163,154, filed Oct. 6, 2005, Method and System for Treatment of Cellulite.
U.S. Appl. No. 13/356,405, filed Jan. 23, 2012, Method and System for Treatment of Cellulite.
U.S. Appl. No. 13/789,562, filed Mar. 7, 2013, Method and System for Ultrasound Treatment of Fat.
U.S. Appl. No. 14/164,598, filed Jan. 27, 2013, Method for Fat and Cellulite Reduction.
U.S. Appl. No. 14/550,720, filed Nov. 21, 2014, System and Method for Fat and Cellulite Reduction.
U.S. Appl. No. 15/041,829, filed Feb. 11, 2016, System and Method for Fat and Cellulite Reduction.
U.S. Appl. No. 15/374,918, filed Dec. 9, 2016, System and Method for Fat and Cellulite Reduction.
U.S. Appl. No. 15/650,246, filed Jul. 14, 2017, System and Method for Fat and Cellulite Reduction.
U.S. Appl. No. 15/821,281, filed Nov. 22, 2017, Ultrasound Probe for Fat and Cellulite Reduction.
U.S. Appl. No. 15/996,295, filed Jun. 1, 2018, Ultrasound Probe for Fat and Cellulite Reduction.
U.S. Appl. No. 16/272,453, filed Feb. 11, 2019, Ultrasound Probe for Tissue Treatment.
U.S. Appl. No. 16/794,717, filed Feb. 19, 2020, Ultrasound Probe for Tissue Treatment.
U.S. Appl. No. 17/127,705, filed Dec. 18, 2020, Ultrasound Probe for Tissue Treatment.
U.S. Appl. No. 11/738,682, filed Apr. 23, 2007, Method and System for Non-Ablative Acne Treatment and Prevention.
U.S. Appl. No. 12/116,810, filed May 7, 2008, Methods and Systems for Modulating Medicants Using Acoustic Energy.
U.S. Appl. No. 12/116,828, filed May 7, 2008, Methods and Systems for Coupling and Focusing Acoustic Energy Using a Coupler Member.
U.S. Appl. No. 12/646,609, filed Dec. 23, 2009, Methods and System for Fat Reduction and/or Cellulite Treatment.
U.S. Appl. No. 14/192,520, filed Feb. 27, 2014, Energy Based Fat Reduction.
U.S. Appl. No. 14/550,772, filed Nov. 21, 2014, Energy Based Fat Reduction.
U.S. Appl. No. 15/401,804, filed Feb. 11, 2016, Energy Based Fat Reduction.
U.S. Appl. No. 15/380,267, filed Dec. 15, 2016, Energy Based Fat Reduction.
U.S. Appl. No. 15/650,525, filed Jul. 18, 2017, Energy Based Fat Reduction.
U.S. Appl. No. 15/829,175, filed Dec. 1, 2017, Energy Based Fat Reduction.
U.S. Appl. No. 15/996,249, filed Jun. 1, 2018, Energy Based Fat Reduction.
U.S. Appl. No. 16/272,427, filed Feb. 11, 2019, Energy Based Fat Reduction.
U.S. Appl. No. 16/794,701, filed Feb. 19, 2020, Energy Based Fat Reduction.
U.S. Appl. No. 17/127,691, filed Dec. 18, 2020, Energy Based Fat Reduction.
U.S. Appl. No. 13/291,312, filed Nov. 11, 2011, Devices and Methods for Acoustic Shielding.
U.S. Appl. No. 14/487,504, filed Sep. 16, 2014, Devices and Methods for Acoustic Shielding.
U.S. Appl. No. 13/136,538, filed Aug. 2, 2011, Systems and Methods for Treating Acute and/or Chronic Injuries in Soft Tissue.
U.S. Appl. No. 13/136,542, filed Aug. 2, 2011, System and Method for Treating Cartilage.
U.S. Appl. No. 13/163,541, filed Aug. 2, 2011, Methods and Systems for Treating Plantar Fascia.
U.S. Appl. No. 13/136,544, filed Aug. 2, 2011, Systems and Methods for Ultrasound Treatment.
U.S. Appl. No. 13/547,023, filed Jul. 11, 2012, Systems and Methods for Coupling an Ultrasound Source to Tissue.
U.S. Appl. No. 13/545,931, filed Jul. 10, 2012, Methods and Systems for Controlling Acoustic Energy Deposition Into a Medium.
U.S. Appl. No. 13/545,953, filed Jul. 10, 2012, Systems and Methods for Accelerating Healing of Implanted Material and/or Native Tissue.
U.S. Appl. No. 13/547,011, filed Jul. 11, 2012, Systems and Methods for Monitoring and Controlling Ultrasound Power Output and Stability.
U.S. Appl. No. 13/545,954, filed Jul. 10, 2012, Systems and Methods for Improving an Outside Appearance of Skin Using Ultrasound as an Energy Source.
U.S. Appl. No. 13/545,945, filed Jul. 10, 2012, Systems and Methods for Treating Injuries to Joints and Connective Tissue.
U.S. Appl. No. 13/545,929, filed Jul. 10, 2012, Methods and Systems for Ultrasound Treatment.
U.S. Appl. No. 13/863,249, filed Apr. 15, 2013, Systems for Cosmetic Treatment.
U.S. Appl. No. 13/863,281, filed Apr. 15, 2013, Methods for Non-invasive Cosmetic Treatment.
U.S. Appl. No. 14/847,626, filed Sep. 8, 2015, Systems for Cosmetic Treatment.
U.S. Appl. No. 13/863,362, filed Apr. 15, 2013, Thick Film Transducer Arrays.
U.S. Appl. No. 14/217,110, filed Mar. 17, 2014, Ultrasound Treatment Device and Method of Use.
U.S. Appl. No. 14/217,382, filed Mar. 17, 2014, Ultrasound Treatment Device and Method of Use.
U.S. Appl. No. 14/225,189, filed Mar. 25, 2014, Reflective Ultrasound Technology for Dermatological Treatments.
U.S. Appl. No. 15/345,908, filed Nov. 8, 2016, Reflective Ultrasound Technology for Dermatological Treatments.
U.S. Appl. No. 15/719,377, filed Sep. 28, 2017, Reflective Ultrasound Technology for Dermatological Treatments.
U.S. Appl. No. 14/270,859, filed May 6, 2014, Methods and Systems for Generating Thermal Bubbles for Improved Ultrasound Imaging and Therapy.
U.S. Appl. No. 14/679,494, filed Apr. 6, 2015, Methods and Systems for Generating Thermal Bubbles for Improved Ultrasound Imaging and Therapy.
U.S. Appl. No. 14/405,368, filed Dec. 3, 2014, Devices and Methods for Ultrasound Focal Depth Control.
U.S. Appl. No. 14/568,954, filed Dec. 12, 2014, System and Method for Cosmetic Enhancement of Lips.
U.S. Appl. No. 14/569,001, filed Dec. 12, 2014, System and Method for Non-Invasive Treatment With Improved Efficiency.
U.S. Appl. No. 14/600,782, filed Jan. 20, 2015, Methods and Systems for Controlling and Acoustic Energy Deposition in Various Media.
U.S. Appl. No. 14/738,420, filed Jun. 12, 2015, Systems and Methods for Fast Ultrasound Treatment.
U.S. Appl. No. 14/751,349, filed Jun. 26, 2015, Methods and Systems for Tattoo Removal.
U.S. Appl. No. 15/001,712, filed Jan. 20, 2016, Methods and Systems for Removal of a Targeted Tissue from a Body.
U.S. Appl. No. 15/001,621, filed Jan. 20, 2016, Methods and Systems for Removal of a Foreign Object from Tissue.
U.S. Appl. No. 15/059,773, filed Mar. 3, 2016, Methods and Systems for Material Transport Across an Impermeable or Semi-Permeable Membrane Via Artificially Created Microchannels.
U.S. Appl. No. 15/094,774, filed Apr. 8, 2016, System and Method for Increased Control of Ultrasound Treatments.
Gottlieb et al., Development of a high-frequency (> 50 MHz) copolymer annular-array, ultrasound transducer, IEEE Trans Ultrasonics, and Frequency Control, May 2006;53(5):1037-45.

(56) References Cited

OTHER PUBLICATIONS

Narayanasamy et al., "Spatial registration of temporally separated whole breast 3D ultrasound images" Med Phys. Sep. 2009;36(9):4288-300. doi: 10.1118/1.3193678. PMID: 19810503; PMCID: PMC2749445 (2009).

Pavicic et al., Microfocused ultrasound with visualization: Consensus on safety and review of energy-based devices, J Cosmet Dermatol Feb. 2022, vol. 21, Issue 2: pp. 636-647, published online Dec. 24, 2021.

* cited by examiner

SYSTEMS AND METHODS FOR ENHANCING EFFICACY OF ULTRASOUND TREATMENT

INCORPORATION BY REFERENCE

This application is a U.S. National Phase application of Intl. App. No. PCT/US2019/063095 filed Nov. 25, 2019, which claims the benefit from U.S. Provisional Patent Application Nos. 62/773,948 filed on Nov. 30, 2018, which is incorporated herein by reference in its entirety for all purposes. Any and all applications for which a foreign or domestic claim is identified in the Application Data Sheet as filed with the present application are hereby incorporated by reference under 37 CFR 1.57.

BACKGROUND

Field

Several embodiments described herein relate to the assembly and electrical interconnection of high power, high efficiency radio-frequency (RF) designs for complex voltage, current, and power measurement, calibration, and assurance for ultrasound transducers. Various embodiments described in this application are directed to electrical devices and systems that are configured to generate, monitor and deliver RF signals that power ultrasound energy-based noninvasive treatments. Several embodiments relate, for example, to energy-based noninvasive treatments for enhancing the efficacy of dermatological (e.g., cosmetic) ultrasound treatments.

Description of the Related Art

Ultrasound has been used in the past for both diagnostic and therapeutic applications. Ultrasound imaging and therapy has been described for various medical applications, including dermatology. Cosmetic treatments with ultrasound have also been described.

SUMMARY

Several embodiments described herein provide systems and methods that overcome certain shortcomings in using ultrasound for therapeutic purposes, including for example, excess variance, error production, and reduction in efficiency and effectiveness of the treatment. In some embodiments, several enhancements are described that reduce signal harmonics that can interfere with the signaling controls that feed into the ultrasound transducer. Such reductions (e.g., via monitoring and calibration techniques) can ultimately reduce undesired variability when using different ultrasound frequencies, powers and/or depths, thus enhancing the overall efficacy and efficacy of ultrasound therapy.

In several embodiments, high efficiency control systems are provided for directing power, voltage, current, and RF signals to one or more transducers included in the ultrasound therapy systems described in this application. The RF module can comprise electronic devices, sub-systems and/or assemblies integrated on one or more printed circuit board assemblies.

In several embodiments, an ultrasound therapy board comprises a power assurance system for high intensity focused ultrasound (HIFU) monitoring includes a power assurance measurement and calibration system for making accurate, phase-sensitive measurements of electrical drive power to a high-intensity focused ultrasound transducer. In several embodiments, an ultrasound therapy board comprises a HIFU switch-mode power amplifier incorporating one or more high efficiency transistors, such as III-V semiconductors (e.g., III-V compound semiconductors combining group III elements (e.g., Ga, In, Al) with group V elements (e.g., N, As, Sb, P), such as Gallium Nitride (GaN), Gallium arsenide (GaAs), Gallium antimonide (GaSb), Indium phosphide (InP), Indium arsenide (InAs), Indium antimonide (InSb), Indium gallium arsenide (InGaAs), Aluminium antimonide (AlSb), Aluminium gallium arsenide (AlGaAs), Aluminium gallium nitride (AlGaN), etc. field-effect transistors), wherein a radio-frequency (RF) therapy power amplifier that uses any of the III-V (e.g., gallium nitride (GaN), etc. field-effect transistors and a power transformer (e.g., Guanella transformer or other type of transformer) to deliver high-power RF energy to a high-intensity focused ultrasound transducer. In several embodiments, GaN transistors are described, though in other contemplated embodiments, any one, two, three or more of GaN, GaAs, GaSb, InP, InAs, InSb, InGaAs, AlSb, AlGaAs, and/or AlGaN transistors may be used. In various embodiments, one or more III-V semiconductor is not used, e.g., is excluded. In some embodiments, any one or more of GaN, GaAs, GaSb, InP, InAs, InSb, InGaAs, AlSb, AlGaAs, and/or AlGaN is not used. In several embodiments, an ultrasound therapy board comprises system and methods for predicting the output power into an arbitrary HIFU transducer load, wherein systems for using calibration information are stored with a power amplifier and with a transducer in order to predict the output power that will be delivered into the transducer by the amplifier prior to delivery of therapy. In several embodiments, an ultrasound therapy system comprises resistive current sense and voltage sense components, a demodulator capable of operating at arbitrary frequencies, a phase-shifting harmonic cancellation scheme, and/or a self-calibrating two-port compensation scheme.

In several embodiments, provided are systems and methods that successfully improve the safety, effectiveness and/or efficiency of an aesthetic effect using targeted and precise ultrasound to cause a visible and effective dermatological (e.g., cosmetic) result via a thermal pathway with ultrasound therapy producing one or more focal zones for performing various treatment and/or imaging procedures. Various embodiments of the ultrasound therapy board can include a variety of health monitoring systems configured to ensure patient safety during operation. Additionally, systems and methods that can suppress and/or reduce harmonics in the electrical signal output from the ultrasound therapy board to ensure patient safety are also contemplated in this application.

In various embodiments, the invention provides one or more advantages, such as, for example, reducing treatment time and/or errors, creating unique heating patterns, leveraging multiple channels for greater power, the option to treat the region at two or more depths with the same or different power levels, (e.g., a thermal coagulation, ablation, instant necrosis focus zone and another defocused energy, or other combinations), optional simultaneous or sequential treatment at different depths (e.g., such as at depths below a skin surface of 1.5 mm, 3 mm and/or 4.5 mm thermal coagulation points simultaneously or in an overlapping or sequential time period); and/or treatment with one, two, or more simultaneous point, linear or line foci, such as at different depths below a region or spaced apart. Several embodiments described herein, whether for dermatology or non-dermatology applications, are particularly advantageous because they include one, several or all of the following benefits: narrow bandwidth frequency ultrasound treatments at multiple depths with more efficient treatments, including one or more of (i) faster treatment time, (ii) less pain during treatment, (iii) less pain after treatment, (iv) shorter recovery time, (v) more efficient treatment, (vi) higher customer satisfaction, (vii) less energy to complete a treatment, and/or (viii) larger treatment area by focal regions. In some embodiments, advantages include modulation of the effective amplitude driving the transducer with a signal driving the field effect transistor that is generated by comparing the output sinusoid of a direct digital synthesis circuit to a DC voltage.

The electronic devices, sub-systems and/or assemblies of the RF module, in several embodiments, can be configured to generate and deliver about 0.1 W to 200 W (e.g., about 20-100 W) of RF power with high efficiency over a range of frequencies from 1 MHz to 20 MHz (e.g., about 1 MHz, 1.75 MHz, 1.75-12 MHz, 4-12 MHz, 4 MHz, 7 MHz, 10 MHz, 12 MHz) to the one or more ultrasound transducers. In particular, the RF module can comprise a power amplifier comprising III-V (e.g., Gallium Nitride (GaN) GaAs, GaSb, InP, InAs, InSb, InGaAs, AlSb, AlGaAs, and/or AlGaN) field-effect transistors (FETs) to generate one or more narrow band RF signals at a frequency 1.0 MHz to 12.0 MHz with high efficiency (e.g., greater than or equal to 75%, 50%-90%, 95%, 99%, or any value therein). Additionally, the RF module can include a power measurement system that is configured to monitor the amplitude and the phase of the one or more RF signals generated by the III-V (e.g., GaN or other) FETs. Furthermore, systems and methods of estimating the amount of power that will be delivered by the one or more ultrasound transducers when paired with a driving system comprising a power amplifier including III-V (e.g., GaN or other) FETs. In several embodiments, GaN transistors are described, though in other contemplated embodiments, any of the GaN, GaAs, GaSb, InP, InAs, InSb, InGaAs, AlSb, AlGaAs, and/or AlGaN transistors may be used.

In various embodiments, an ultrasound treatment system comprises an ultrasonic probe comprising an ultrasound therapy transducer adapted to apply ultrasonic therapy to tissue; and an electrical power system configured to provide electrical power to the ultrasound therapy transducer, the electrical power system comprising a power amplifier device and a circuit; wherein the power amplifier device comprises at least one semiconductor transistor, wherein the semiconductor transistor is a field effect transistor, wherein the field effect transistor is configured to operate with an efficiency of at least 75% at a radio frequency (RF) in a range between 200 kHz and 20 MHz. In one embodiment, the semiconductor transistor comprises a III-V compound. In one embodiment, the semiconductor transistor comprises Gallium Nitride (GaN).

In one embodiment, the power amplifier device includes a switch-mode amplifier design comprising at least semiconductor and a circuit configured to generate digital waveforms to drive the semiconductor to drive the ultrasound therapy transducer. In one embodiment, the power amplifier device includes: a switch-mode amplifier design comprising at least one semiconductor, wherein in one embodiment, each semiconductor comprises a plurality of gates (in another embodiment, each gallium nitride field effect transistor does not comprise a plurality of gates); and a circuit configured to generate digital waveforms to drive the semiconductors to drive the ultrasound therapy transducer. In one embodiment, the power amplifier device includes: a switch-mode amplifier design comprising at least one gallium nitride field effect transistor, wherein in one embodiment, each gallium nitride field effect transistor comprises a plurality of gates (in another embodiment, each gallium nitride field effect transistor does not comprise a plurality of gates); and a circuit configured to generate digital waveforms to drive the plurality of gates of the gallium nitride field effect transducers to drive the ultrasound therapy transducer, which in one embodiment is a piezoelectric ultrasound therapy transducer. In one embodiment, a signal driving the field effect transistor is generated by comparing the output of a sinusoidal direct digital synthesis circuit to a DC voltage. In one embodiment, the system includes a signal driving the field effect transistor is generated by comparing the output sinusoid of a direct digital synthesis circuit to a DC voltage, configured for modulation of the effective amplitude driving the transducer. The output power is in the range from 5 W to 50 W or 30 W to 100 W in one embodiment. In one embodiment, the circuit comprises four transistors configured in an H-bridge configuration. In one embodiment, the circuit comprises four gallium nitride transistors configured in an H-bridge configuration. In one embodiment, the circuit comprises two transistors configured in a half bridge configuration. In one embodiment, the circuit comprises two gallium nitride transistors configured in a half bridge configuration. In one embodiment, a gate drive signal has a variable duty cycle that is used to control a harmonic content and a power in the output signal. In one embodiment, a power amplifier converter supplies power to a radio frequency output signal power with an efficiency greater than 75%. In one embodiment, a supply voltage to the power amplifier is modulated using a switch-mode DC-DC converter that reduces a fixed high voltage input to a lower supply voltage. In one embodiment, the system includes two or more power amplifiers, wherein a single power amplifier is configured to drive at a single piezoelectric transduction element of a high-intensity focused ultrasound transducer. In one embodiment, the high-intensity focused ultrasound transducer is configured for driving by a separate power amplifier. In one embodiment, the high-intensity focused ultrasound transducer comprises a plurality of piezoelectric transduction elements, each of the plurality of piezoelectric transduction elements being configured for driving by a separate power amplifier. In one embodiment, the power amplifier is configured to drive output at two or more different amplitudes. In one embodiment, the power amplifier is configured to drive output at two or more different phases. In one embodiment, the amplifier is configured to drive output at two or more different frequencies. In one embodiment, a phase and a frequency are controlled by a direct digital synthesizer. In one embodiment, the system is configured to drive transducers with an impedance in the range from 20 ohms to 120 ohms and a phase angle from +45 degrees to −45 degrees.

In one embodiment, the power amplifier device includes: a switch-mode amplifier design comprising at least one field effect transistor; and a circuit configured to generate digital waveforms to drive the plurality of gates of the field effect transducers to drive a piezoelectric ultrasound transducer; wherein the circuit comprises four transistors configured in an H-bridge configuration.

In one embodiment, the power amplifier device includes a switch-mode amplifier design comprising at least one field effect transistor; and a circuit configured to generate digital waveforms to drive a plurality of gates of the field effect transducers to drive a piezoelectric ultrasound transducer; wherein a signal driving the field effect transistor is generated by comparing the output of a sinusoidal direct digital synthesis circuit to a DC voltage; wherein an output power is in the range from 30 W to 100 W; wherein the circuit comprises four transistors configured in an H-bridge configuration.

In one embodiment, the semiconductor is gallium nitride, wherein power amplifier device includes a switch-mode amplifier design comprising at least one gallium nitride field effect transistor, wherein each gallium nitride field effect transistor comprises a plurality of gates; and a circuit configured to generate digital waveforms to drive the plurality of gates of the gallium nitride field effect transducers to drive a piezoelectric ultrasound transducer; wherein a signal driving the field effect transistor is generated by comparing the output of a sinusoidal direct digital synthesis circuit to a DC voltage; wherein an output power is in the range from 30 W to 100 W; wherein the circuit comprises four gallium nitride transistors configured in an H-bridge configuration; wherein a gate drive signal has a variable duty cycle that is used to control a harmonic content and a power in the output signal; wherein a power amplifier converter supplies power to a radio frequency output signal power with an efficiency greater than 75%; wherein a supply voltage to the power amplifier is modulated using a switch-mode DC-DC converter that reduces a fixed high voltage input to a lower supply voltage; comprising two or more power amplifiers, wherein a single power amplifier is configured to drive at a single piezoelectric transduction element of a high-intensity focused ultrasound transducer; wherein the power amplifier is configured to drive output at two or more different amplitudes; wherein the power amplifier is configured to drive output at two or more different phases; wherein a phase and a frequency are controlled by a direct digital synthesizer; wherein the system is configured to drive transducers with an impedance in the range from 20 ohms to 120 ohms and a phase angle from +45 degrees to −45 degrees.

In various embodiments, a power amplifier device for driving high intensity ultrasound transducers comprising: a switch-mode amplifier design comprising at least one field effect transistor; and a circuit configured to generate digital waveforms to drive the at least one field effect transistor. In various embodiments, a power amplifier device for driving high intensity ultrasound transducers comprising: a switch-mode amplifier design comprising at least one gallium nitride field effect transistor; and a circuit configured to generate digital waveforms to drive the at least one gallium nitride field effect transistor.

In various embodiments, a power amplifier device for driving a high intensity ultrasound transducer comprising: a switch-mode amplifier design comprising at least one gallium nitride field effect transistor, wherein each gallium nitride field effect transistor comprises a plurality of gates; and a circuit configured to generate digital waveforms to drive the plurality of gates of the gallium nitride field effect transducers to drive a piezoelectric ultrasound transducer. In one embodiment, a power amplifier device for driving high intensity ultrasound transducers comprises a switch-mode amplifier design comprising a plurality of gallium nitride field effect transistors, and a circuit configured to generate digital waveforms to drive the plurality of gallium nitride field effect transducers to drive a piezoelectric ultrasound transducer.

In various embodiments, a power amplifier device includes one or more of the following features: wherein the power amplifier is configured to drive output at two or more different amplitudes, wherein the power amplifier is configured to drive output at two or more different phases. In one embodiment, the power amplifier is configured to drive output at two or more different frequencies.

In various embodiments, a method of controlling electrical power in an ultrasound system for delivering a desired amount of focused acoustic power by an ultrasound transducer, the method comprising: providing an electrical power control system comprising a circuit comprising a control system microprocessor, and a control system look-up table (LUT); providing an ultrasound transducer comprising a transducer controller, a transducer microprocessor, and a transducer LUT; determining with the transducer microprocessor, from the transducer LUT, an amount of electrical power delivered to a load equivalent to a desired amount of acoustic power delivered to a tissue by the ultrasound transducer; determining with the control system microprocessor, from the control system LUT, an amplitude of an electrical signal output from a power amplifier of the electrical power system that would deliver the equivalent amount of electrical power delivered to the load; and setting at least one parameter of the electrical power system output the determined amplitude of the electrical signal output. In various embodiments, the load is in a range of 10 to 100 ohms or 20 to 120 ohms (e.g., 10-40, 40-80, 80-120, and overlapping ranges therein) which permits a wider range of transducer impedances which may occur during phasing/focusing of transducers. In one embodiment, the load is 50 ohms.

In various embodiments, an ultrasound treatment system comprising: an ultrasonic probe comprising a housing containing a piezoelectrically active ultrasound therapy transducer adapted to focus acoustic ultrasonic waves a depth from the housing in a focal zone in a tissue; an electrical power system configured to provide electrical power to the ultrasound therapy transducer, the electrical power system comprising a power amplifier; and an electrical power measurement system configured to monitor electrical output power from an output signal from the power amplifier, wherein the electrical power measurement system comprises: a resistive current sensing circuit configured to monitor an electrical current output from the power amplifier; and a resistive voltage sensing circuit configured to monitor an electrical voltage output from the power amplifier, and wherein the electrical power measurement system is configured to monitor electrical output power from the power amplifier in a frequency range spanning at least two octaves for the ultrasound therapy transducer.

In various embodiments, a system for measuring a radio frequency (RF) electrical current and voltage of a drive circuit in a high-intensity focused ultrasound system, comprising: a current sense resistor in series with a load; a shunt voltage sense resistor network in parallel with the load; and an electrical power output voltage and current monitoring circuit (IQ demodulator circuit) with a local oscillator clock synchronized in a phase and a frequency to a signal driving a power amplifier and configured to demodulate an output signal to a carrier frequency lower than an ultrasound drive frequency.

In one embodiment, the measurement system is configured to take multiple measurements at different relative phase shifts between the local oscillator and the power amplifier. In one embodiment, the local oscillator clock is generated from an independently controlled direct digital synthesizer. In one embodiment, the measurement system is configured to take multiple measurements at local oscillator frequencies. In one embodiment, the number of phase measurements is six. In one embodiment, the system that uses the measurement system to modify a gate drive signal so as to achieve a desired harmonic content in the output signal.

In various embodiments, the method for determining the number of measurements adequately measures the harmonics by assessing a number of harmonics of the lowest frequency in the passband that exceed the system noise floor. In one embodiment, method to calculate the complex harmonic components of the voltage and current waveforms by forming linear combination of the multiple measurements.

In various embodiments, a method for calibrating high intensity ultrasound transducers comprising: calibrating an acoustic output power delivered by a transducer for a driver configuration corresponding to an electrical power delivered by a driver into one or more reference loads for the driver configuration where a calibration information is stored with the transducer; calibrating the electrical driver configuration against the electrical power delivered into one or more reference loads where the calibration information is stored with the driver; and calculating with a processor of a driver configuration to achieve a desired acoustic output power that uses the transducer calibration information to determine a power level into one or more reference loads for a desired acoustic power setting and that uses the driver calibration information to determine a driver configuration for the desired acoustic output power level into the reference load.

In one embodiment, the transducer calibration information also includes the electrical power delivered by the transducer at each acoustic power level, wherein the stored power information includes a complex power component or a real power component. In one embodiment, the dynamic measurements of electrical power delivered from the driver are made during tissue insonification and verified against electrical power stored in the transducer calibration for the desired acoustic power level.

In various embodiments, a method for tuning high intensity focused ultrasound transducers by sweeping the frequency while measuring the voltage standing wave ratio at the driver and selecting for operating frequency that frequency which minimizes the voltage standing wave ratio.

In one embodiment, the acoustic output power is generated by performing measurements using a force balance. In one embodiment, the transducer calibration is stored as a lookup table in a non-volatile memory chip inside the transducer. In one embodiment, at least one of the voltage or current measured at the driver is adjusted using a transfer matrix describing the two-port network between the therapy driving circuit output and the transducer. In one embodiment, the calibration information is stored in a look-up table (LUT). In one embodiment, a target electrical voltage is calculated from the calibration information and a desired acoustic power set in the clinic by interpolating the values in one or more look-up tables. In one embodiment, the storage within the transducer calibration information of electrical power thresholds at each acoustic power level defining an acceptable range of electrical drive power to achieve an acceptable range of acoustic output power.

In various embodiments, a system for confirming that dynamically measured electrical power is within the range specified comprising dynamically measuring the power delivered by the driver and comparing that power against the threshold values stored in the transducer. In one embodiment, the transfer matrix of a handpiece and cable assembly that can be interchanged between transducers and drivers is stored on a non-volatile memory chip inside the handpiece and cable assembly.

In various embodiments, a method for dynamically adjusting the power by: measuring the electrical power delivered from the driver; comparing the measured electrical power to the desired electrical power as determined from the calibration information and adjusting the driver configuration to reduce the error between the desired and measured electrical power.

In various embodiments, a method for dynamically adjusting the power by: measuring the electrical impedance of the load and calculating the transducer impedance based on known impedances of other system components; calculating the required electrical power from the driver to maintain the same amount of dissipated power across the real transducer impedance; and adjusting the driver configuration satisfy the electrical power required to reduce the error between the desired and measured electrical power. In one embodiment, the power is dynamically adjusted whenever therapy is delivered.

In one embodiment, the transducer calibration information also includes the electrical power delivered to the transducer at each acoustic power level, wherein the stored power information includes a complex power component or a real power component; wherein dynamic measurements of electrical power delivered from the driver are made during tissue insonification and verified against electrical power stored in the transducer calibration for the desired acoustic power level.

In one embodiment, the transducer calibration information also includes the electrical power delivered to the transducer at each acoustic power level, wherein the stored power information includes a complex power component or a real power component; wherein dynamic measurements of electrical power delivered from the driver are made during tissue insonification and verified against electrical power stored in the transducer calibration for the desired acoustic power level; wherein the acoustic output power is generated by performing measurements using a force balance; wherein the transducer calibration is stored as a lookup table in a non-volatile memory chip inside the transducer; wherein at least one of the voltage or current measured at the driver is adjusted using a transfer matrix describing the two-port network between the therapy driving circuit output and the transducer; wherein the calibration information is stored in a look-up table (LUT); wherein a target electrical voltage is calculated from the calibration information and a desired acoustic power set in the clinic by interpolating the values in one or more look-up tables.

In various embodiments, a method for detecting the quality of the acoustic coupling of a high intensity focused ultrasound transducer through a skin surface by measuring an amount of back reflected energy, comprising: measuring an amount of back reflected energy using a therapy transducer sensor; determining a distance between a piezoelectric therapy transduction bowl and a coupling surface; measuring a first power measurement before a reflection occurs off of the coupling surface; measuring a second power measurement after the reflection occurs off of the coupling surface; and calculating a difference calculation to determine the amount of back reflected power.

In one embodiment, an amount of back reflected energy is measured by a secondary transducer not used for therapy. In one embodiment, upon calculating a change in power (Forward minus Reverse), the therapy temporarily halts until a sufficient time passes to eliminate reflection off of the coupling surface as detected by either the secondary transducer or therapy transducer. In one embodiment, the therapy driver re-engages and excites the therapy transducer once the reflected energy subsides below a threshold. In one embodiment, the high intensity ultrasound transducer comprises a multiple element array transducer and the calibration information is stored for each element in the array.

In one embodiment, the drivers are housed in a system console and the transducers are interchangeable between system consoles. In one embodiment, transducers are interchangeable between handpieces and handpieces are interchangeable between consoles.

In various embodiments, a method for calibrating high intensity focused ultrasound transducers comprising: modeling a driver as a Thevenin-equivalent source with frequency-dependent source voltage and source impedance and storing calibration information comprising the source voltage and source impedance with the driver, measuring and storing the transducer impedance in calibration information on the transducer, and calculating the electrical power that will be delivered to transducer by the driver using the source voltage and source impedance stored in the driver calibration into the load impedance stored in the transducer calibration and treating the combined system as a voltage divider network.

In various embodiments, a method to measure the transducer impedance: calibrating the driver using one or more known reference impedances; measuring the transducer impedance at one or more frequencies and one or more amplitudes; fitting the measured transducer to a resonance circuit in order to calculate transducer parameters such as clamped capacitance, coupling coefficient, and radiation resistance; using the characterization to determine the transducer age, operating acceptability and required amplitude and phase.

In one embodiment, a fixed distance is between the transducer and intended treatment region. In one embodiment, the therapy beam is temporarily moved to an untreated region to determine the amount of backscatter from the treatment region using a difference method.

In various embodiments, an ultrasound treatment system includes an ultrasonic probe comprising an ultrasound therapy transducer adapted to apply ultrasonic therapy to tissue; and an electrical power system configured to provide electrical power to the ultrasound therapy transducer, the electrical power system comprising a power amplifier device and a circuit; wherein the power amplifier device comprises at least one III-V semiconductor power transistor configured to operate with an efficiency of at least 75% at a radio frequency (RF) in a range between 200 kHz and 20 MHz.

In one embodiment, the at least one III-V semiconductor power transistor is selected from the group consisting of: GaN, GaAs, GaSb, InP, InAs, InSb, InGaAs, AlSb, AlGaAs, and AlGaN. In one embodiment, the at least one III-V semiconductor power transistor is Gallium Nitride. In one embodiment, the at least one III-V semiconductor power transistor is not one of GaN, GaAs, GaSb, InP, InAs, InSb, InGaAs, AlSb, AlGaAs, and AlGaN. In one embodiment, the power amplifier device includes a switch-mode amplifier design comprising a plurality of III-V semiconductor power transistors; and a circuit configured to generate digital waveforms to drive the plurality of III-V semiconductor power transistors to drive a piezoelectric ultrasound transducer. In one embodiment, a signal driving the power transistor is generated by comparing the output of a sinusoidal direct digital synthesis circuit to a DC voltage. In one embodiment, an output power is in the range from 30 W to 100 W. In one embodiment, an output power is in the range from 5 W to 50 W. In one embodiment, the circuit comprises four power transistors configured in an H-bridge configuration. In one embodiment, a gate drive signal has a variable duty cycle that is used to control a harmonic content and a power in the output signal. In one embodiment, a power amplifier converter supplies power to a radio frequency output signal power with an efficiency greater than 75%. In one embodiment, a supply voltage to the power amplifier is modulated using a switch-mode DC-DC converter that reduces a fixed high voltage input to a lower supply voltage. In one embodiment, the system includes two or more power amplifiers, wherein a single power amplifier is configured to drive a single piezoelectric transduction element of a high-intensity focused ultrasound transducer. In one embodiment, the power amplifier is configured to drive output at two or more different amplitudes. In one embodiment, the power amplifier is configured to drive output at two or more different phases. In one embodiment, a phase and a frequency are controlled by a direct digital synthesizer. In one embodiment, the system is configured to drive transducers with an impedance in the range from 20 ohms to 120 ohms and a phase angle from +45 degrees to −45 degrees.

In various embodiments, a power amplifier device for driving high intensity ultrasound transducers includes a switch-mode amplifier design comprising at least one III-V semiconductor power transistor; and a circuit configured to generate digital waveforms to drive the at least one III-V semiconductor power transistor.

In various embodiments, a device with a plurality of power amplifiers for driving high intensity ultrasound transducers including a switch-mode amplifier design comprising a plurality of III-V semiconductor power transistors; and a circuit configured to generate digital waveforms to drive the plurality of III-V semiconductor power transistors to drive a piezoelectric ultrasound transducer.

In one embodiment, the III-V semiconductor power transistor is a gallium nitride field effect transistor. In one embodiment, the power amplifier is configured to drive output at two or more different amplitudes, and/or the power amplifier is configured to drive output at two or more different phases.

In various embodiments, a method of controlling electrical power in an ultrasound system for delivering a desired amount of focused acoustic power by an ultrasound transducer, the method including providing an electrical power control system comprising a circuit comprising a control system microprocessor, and a control system look-up table (LUT); providing an ultrasound transducer comprising a transducer controller, a transducer microprocessor, and a transducer LUT; determining with the transducer microprocessor, from the transducer LUT, an amount of electrical power delivered to a load equivalent to a desired amount of acoustic power delivered to a tissue by the ultrasound transducer; determining with the control system microprocessor, from the control system LUT, an amplitude of an electrical signal output from a power amplifier of the electrical power system that would deliver the equivalent amount of electrical power delivered to the load; and setting at least one parameter of the electrical power system output the determined amplitude of the electrical signal output, wherein the load is in a range of 20 to 120 ohms. In one embodiment the load is 50 ohms.

In various embodiments, an ultrasound treatment system includes an ultrasonic probe comprising a housing containing a piezoelectrically active ultrasound therapy transducer adapted to focus acoustic ultrasonic waves a depth from the housing in a focal zone in a tissue; an electrical power system configured to provide electrical power to the ultrasound therapy transducer, the electrical power system comprising a power amplifier; and an electrical power measurement system configured to monitor electrical output power from an output signal from the power amplifier, wherein the electrical power measurement system includes a resistive current sensing circuit configured to monitor an electrical current output from the power amplifier; and a resistive voltage sensing circuit configured to monitor an electrical voltage output from the power amplifier, and wherein the electrical power measurement system is configured to monitor electrical output power from the power amplifier in a frequency range spanning at least two octaves for the ultrasound therapy transducer.

In various embodiments, a system for measuring a radio frequency (RF) electrical current and voltage of a drive circuit in a high-intensity focused ultrasound system, including a current sense resistor in series with a load; a shunt voltage sense resistor network in parallel with the load; and an electrical power output voltage and current monitoring circuit (IQ demodulator circuit) with a local oscillator clock synchronized in a phase and a frequency to a signal driving a power amplifier and configured to demodulate an output signal to a carrier frequency lower than an ultrasound drive frequency.

In one embodiment, the measurement system is configured to take multiple measurements at different relative phase shifts between the local oscillator and the power amplifier. In one embodiment, the local oscillator clock is generated from an independently controlled direct digital synthesizer. In one embodiment, the number of phase measurements is six. In one embodiment, the measurement system is configured to modify a gate drive signal so as to achieve a desired harmonic content in the output signal. In one embodiment, the method for determining the number of measurements is configured to adequately measure the harmonics by assessing a number of harmonics of the lowest frequency in the passband that exceed the system noise floor.

In various embodiments, an ultrasound treatment system has one or more of the features described in the description. In various embodiments, a power amplifier device for driving a high intensity ultrasound transducer has one or more of the features described in the description. In various embodiments, a method of controlling electrical power in an ultrasound system has one or more of the features described in the description. In various embodiments, a system for measuring a radio frequency (RF) electrical current and voltage of a drive circuit in a high-intensity focused ultrasound system has one or more of the features described in the description. In various embodiments, a method for calibrating a high intensity ultrasound transducer has one or more of the features described in the description. In various embodiments, a method of method for detecting the quality of the acoustic coupling of a high intensity focused ultrasound transducer through a skin surface has one or more of the features described in the description.

Further, areas of applicability will become apparent from the description provided herein. It should be understood that the description and specific examples are intended for purposes of illustration only and are not intended to limit the scope of the embodiments disclosed herein. In some embodiments, the system comprises various features that are present as single features (as opposed to multiple features). For example, multiple features or components are provided in alternate embodiments. In various embodiments, the system comprises, consists essentially of, or consists of one, two, three, or more embodiments of any features or components disclosed herein. In some embodiments, a feature or component is not included and can be negatively disclaimed from a specific claim, such that the system is without such feature or component.

BRIEF DESCRIPTION OF THE DRAWINGS

The drawings described herein are for illustration purposes only and are not intended to limit the scope of the present disclosure in any way. Embodiments of the present invention will become more fully understood from the detailed description and the accompanying drawings wherein.

DETAILED DESCRIPTION

Figure 1A:
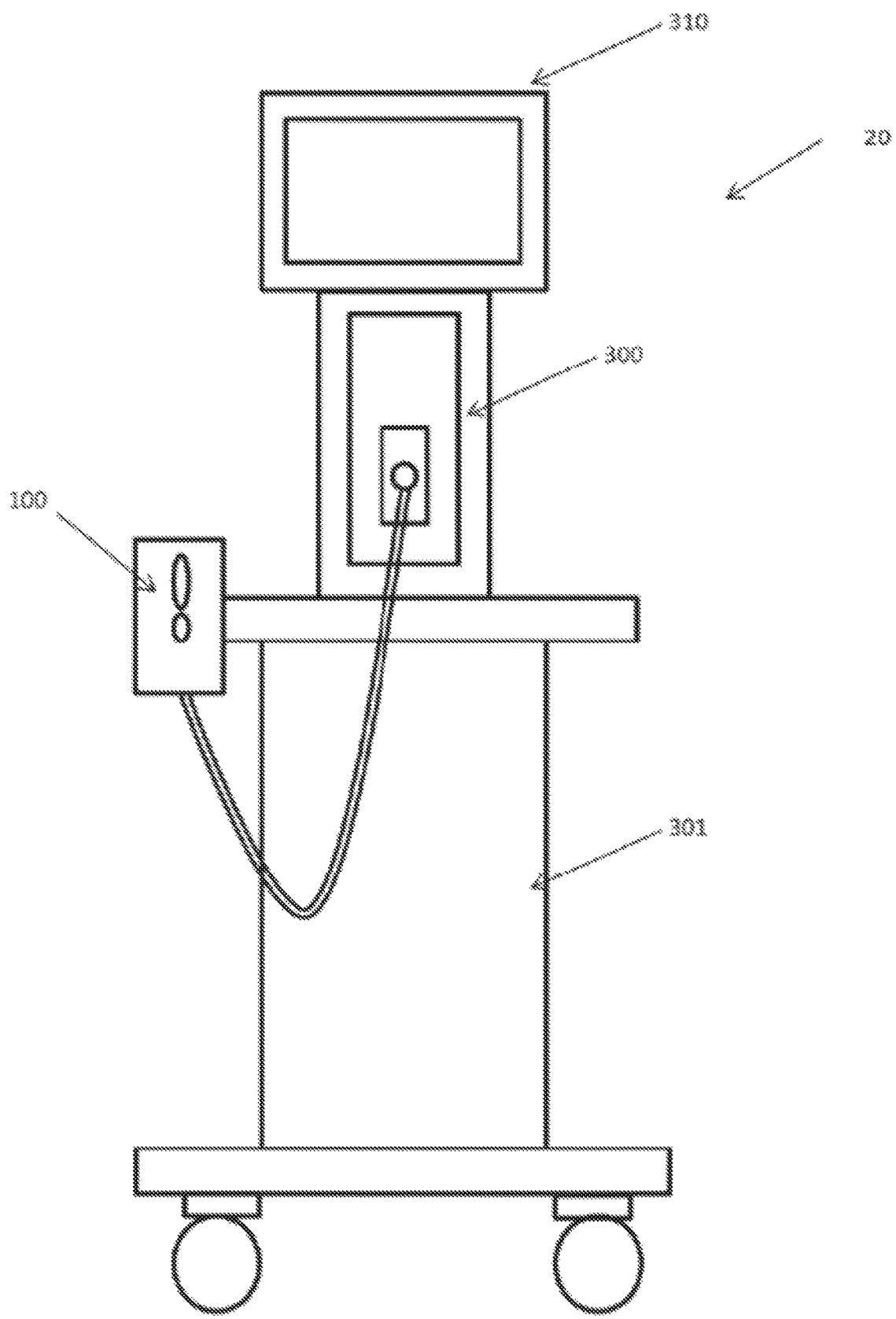
FIG. 1A is a schematic illustration of an ultrasound system according to various embodiments of the present invention.

The following description sets forth examples of embodiments, and is not intended to limit the present invention or its teachings, applications, or uses thereof. It should be understood that throughout the drawings, corresponding reference numerals indicate like or corresponding parts and features. The description of specific examples indicated in various embodiments of the present invention are intended for purposes of illustration only and are not intended to limit the scope of the invention disclosed herein. Moreover, recitation of multiple embodiments having stated features is not intended to exclude other embodiments having additional features or other embodiments incorporating different combinations of the stated features. Further, features in one embodiment (such as in one figure) may be combined with descriptions (and figures) of other embodiments.

Described herein are several embodiments for novel and inventive systems and methods that provide high efficiency controls for directing power, voltage, current, and radio-frequency (RF) signals to one or more focused energy-based systems. In various embodiments, control system comprises electronic devices, sub-systems and/or assemblies integrated on one or more printed circuit board assemblies. The system architecture, circuitry, modeling, design, implementation and validation is directed to improvements for providing high efficiency power, voltage, and current to direct ultrasound therapy systems. In various embodiments, an energy-based system includes interchangeable components (e.g., console, hand piece, transducer probe modules, etc.) calibrated to efficiently effectively, operate and communicate with each other to provide a desired treatment result. Efficient, effective focusing performance of ultrasound at specific distances from an ultrasound transducer are improved by reducing deviation, error, and harmonics that can interfere with optimal performance. In some embodiments, dermatological applications (including for example, cosmetic and non-cosmetic dermatological applications) are provided. In other embodiments, non-dermatological applications (such as, for example, orthopedic, neurological, cardiac, etc.).

Ultrasound Therapy System Overview

Figure 1B:
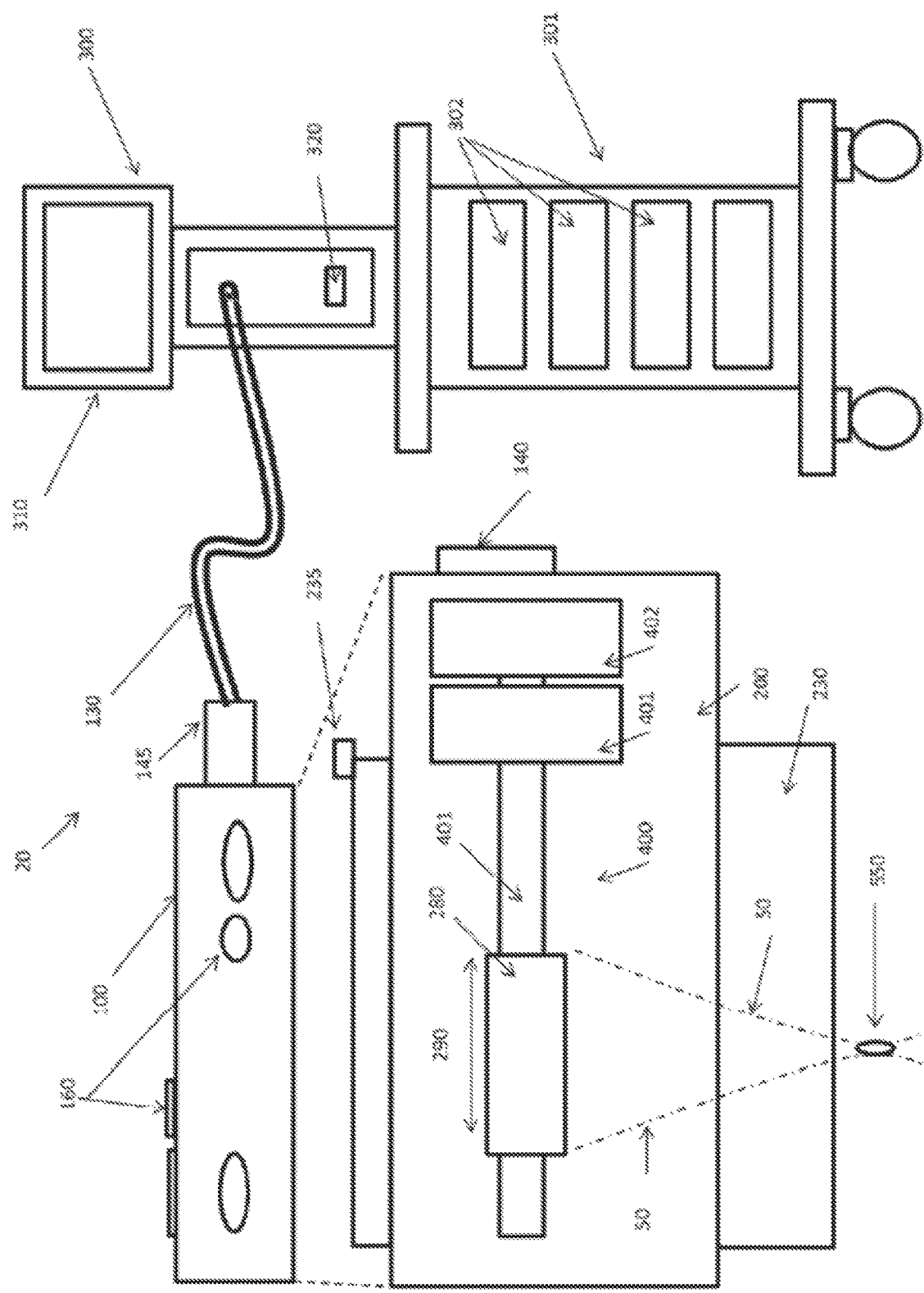
FIG. 1B is a schematic illustration of an ultrasound system according to various embodiments of the present invention.
Figure 1C:
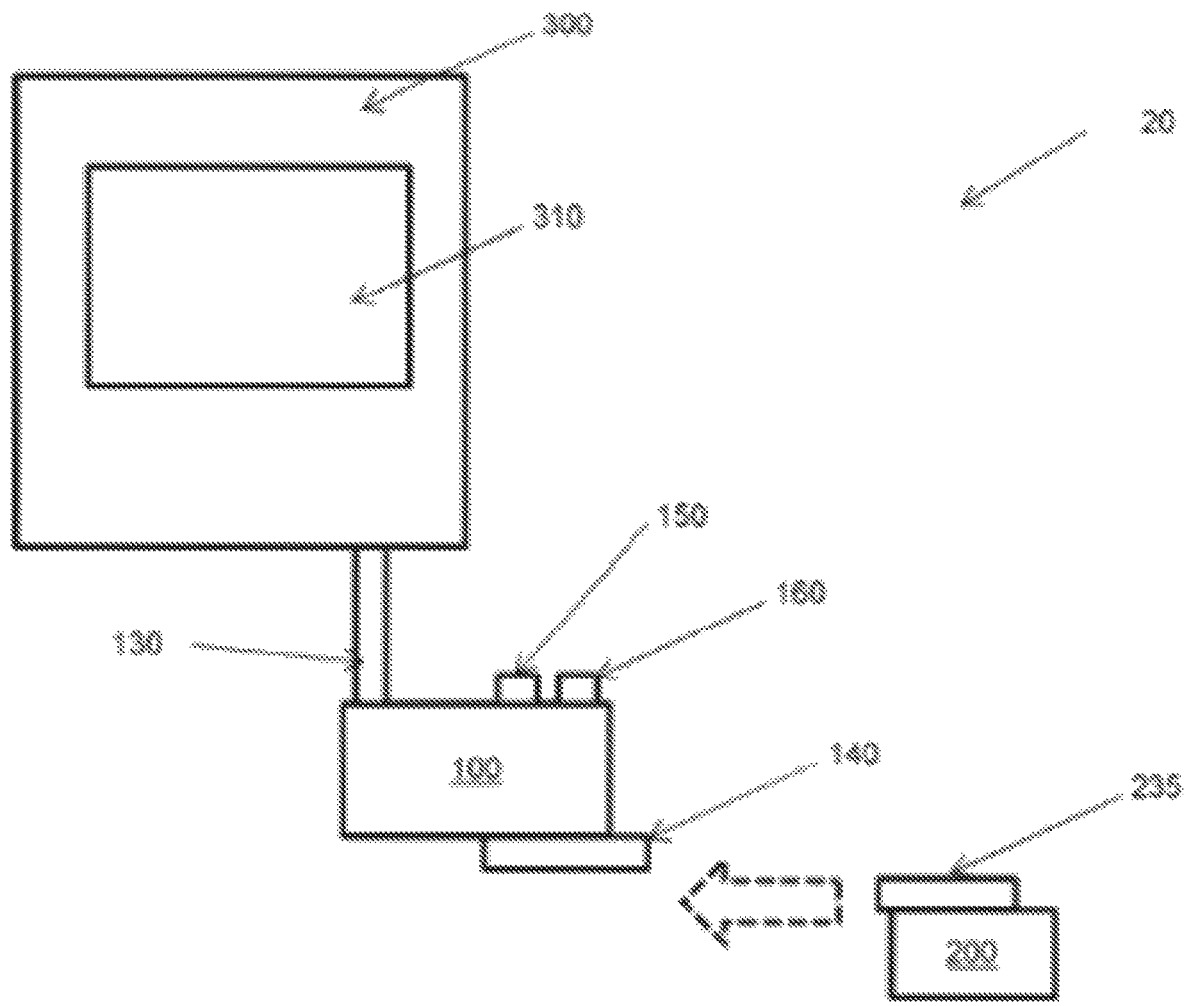
FIG. 1C is a schematic illustration of an ultrasound system according to various embodiments of the present invention.
Figure 2:
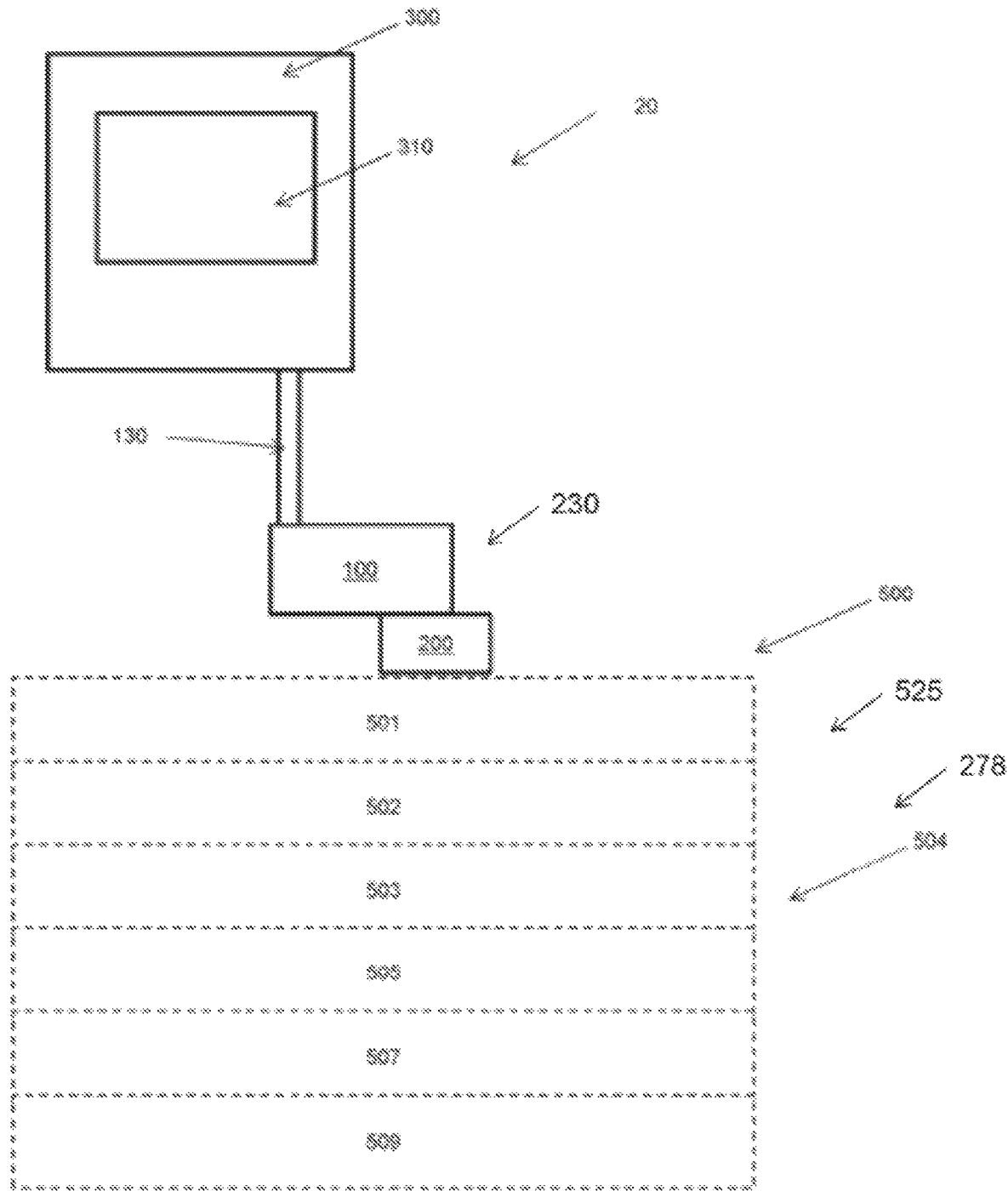
FIG. 2 is a schematic illustration of an ultrasound system coupled to a region of interest according to various embodiments of the present invention.

With reference to the illustration in FIGS. 1A, 1B, and 1C, various embodiments of an ultrasound therapy system 20 includes a hand wand (e.g., handpiece) 100, module (e.g., transducer module, cartridge, probe) 200, and a controller (e.g., console) 300. In some embodiments, a cart 301 provides mobility and/or position of the system 20, and can include wheels, surfaces to write on or place components, and/or compartments 302 (e.g., drawers, containers, shelves, etc.) to, for example, store or organize components. In various embodiments, the controller 300 can be adapted to and/or configured for operation with the hand wand 100 and the module 200, as well as the overall ultrasound system 20 functionality. In various embodiments, multiple controllers 300, 300', 300", etc. can be adapted to and/or configured for operation with multiple hand wands 100, 100', 100", etc. and or multiple modules 200, 200', 200", etc. In various embodiments, the controller 300 can include a system processor and various analog and/or digital control logic, such as one or more of microcontrollers, microprocessors, field-programmable gate arrays, computer boards, and associated components, including firmware and control software, which may be capable of interfacing with user controls and interfacing circuits as well as input/output circuits and systems for communications, displays, interfacing, storage, documentation, and other useful functions. System software running on the system process may be adapted to and/or configured to control all initialization, timing, level setting, monitoring, safety monitoring, and all other ultrasound system functions for accomplishing user-defined treatment objectives. Further, the controller 300 can include various input/output modules, such as switches, buttons, etc., that may also be suitably adapted to and/or configured to control operation of the ultrasound system 20. FIG. 2 is a schematic illustration of the ultrasound system 20 coupled to a region of interest 10 (not shown) of subject 500 (with a skin surface 501, an epidermal layer 502, a dermal layer 503, a fat layer 505, a superficial muscular aponeurotic system 507 (hereinafter "SMAS 507"), and a muscle layer 509).

Ultrasound Controller Overview

As discussed herein, in various embodiments, the controller 300 can be adapted to and/or configured to include, for example, a microprocessor with software and input/output devices, systems and devices for controlling electronic and/or mechanical scanning and/or multiplexing of transducers and/or multiplexing of transducer modules, a system for power delivery, systems for monitoring, systems for sensing the spatial position of the probe and/or transducers and/or multiplexing of transducer modules, and/or systems for handling user input and recording treatment results, among others. In various embodiments, the controller 300 can be configured to provide radio-frequency (RF) power to drive the one or more ultrasound transducers. In various embodiments, the controller 300 can comprise a RF therapy (RFTH) module comprising electronic devices and/or electronic sub-systems that are configured to generate RF power in a desired range of RF power and over a desired range of frequencies that can drive the one or more ultrasound transducers. The RFTH module can comprise a printed circuit board (PCB) assembly comprising subsystems for the delivery and monitoring the RF signals that drive the one or more ultrasound transducers. The PCB assembly can comprise one more RF signal generators, one or more RF power amplifiers, one or more oscillators, one or more temperature monitors, one or more power monitors, one or more power supplies, one or more timing circuits, and/or other electronic components that are configured to generate RF signals in a desired range of power and over a desired range of frequencies, systems that can measure the RF signal power and/or calibration systems that can predict the RF power that will be delivered to the one or more ultrasound transducers.

Figure 3:
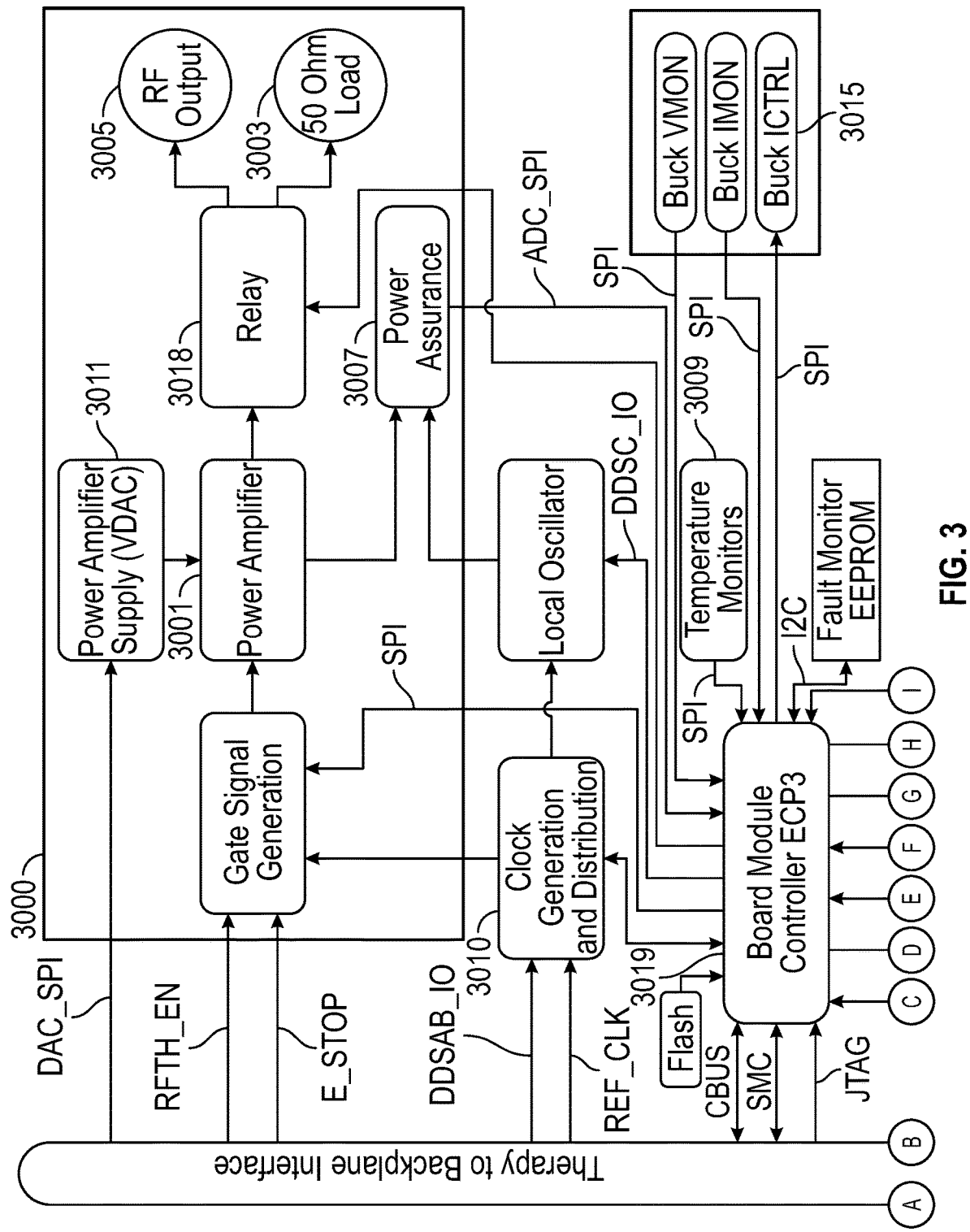
FIG. 3 illustrates a block diagram of an embodiment of a radio-frequency (RF) therapy (TH) module comprising a driving sub-system configured to generate RF signals at a desired RF power and over a desired frequency range to drive an ultrasound transducer.
Figure 3:
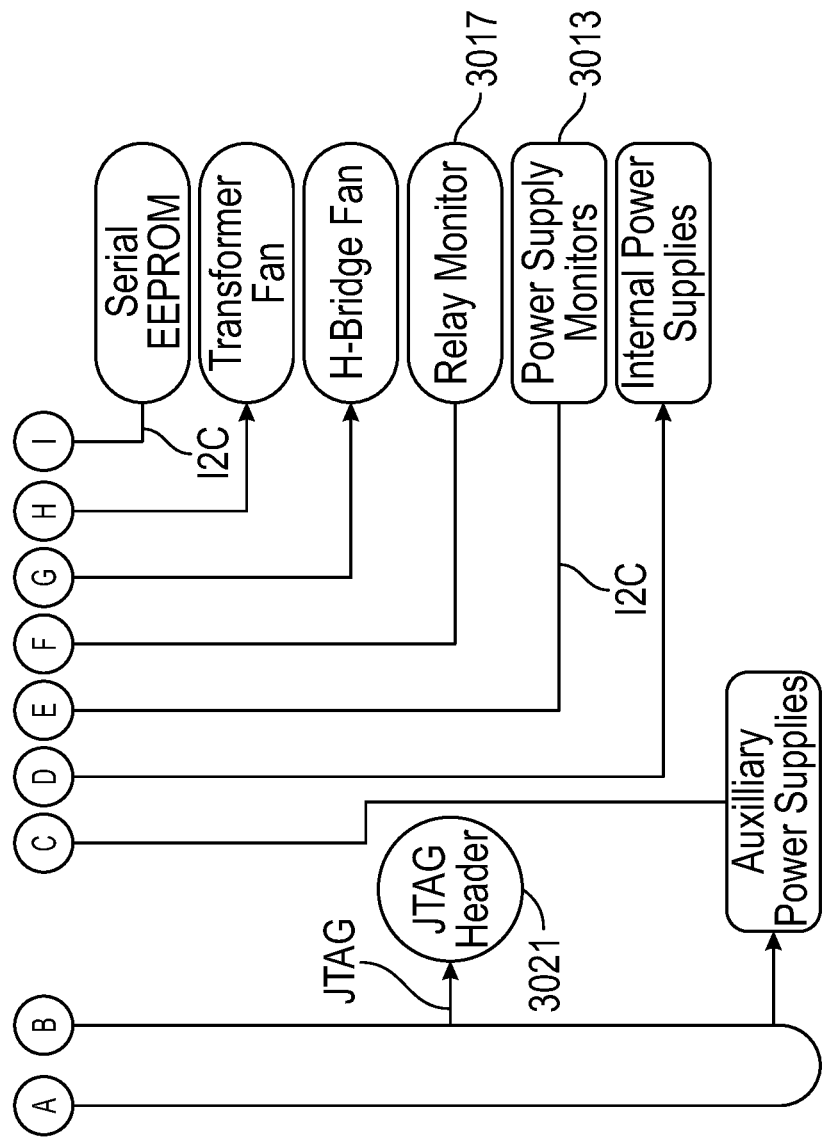

FIG. 3 illustrates a block diagram of an implementation embodiment of a RFTH module comprising a driving sub-system 3000 configured to generate RF signals at a desired RF power and over a desired frequency range to drive an ultrasound transducer. In one embodiment, the RFTH module can comprise eight (8) driving sub-systems that are configured to generate eight (8) RF signals at a desired RF power and over a desired frequency range to drive eight (8) ultrasound transducers. In other embodiments, the number of driving sub-systems of the RFTH module can be less than eight (e.g., 7, 6, 5, 4, 3, 2, 1) or greater than eight (e.g., 9, 10, 11, 12, 13, 15, 20, or more).

The driving sub-system 3000 comprises a power amplifier (PA) 3001 that generates a RF output signal at a desired frequency and phase and having a desired amount of RF power. The driving sub-system 3000 can further comprise a power supply system 3011 configured to supply power to the power amplifier 3001. The generated RF signal can be directed to an onboard 50Ω load 3003 for diagnostics and calibration or to the output connector 3005 connected to the hand wand 100 and/or an ultrasound transducer of the module 200. The driving sub-system 3000 further comprises a power measurement system 3007 that monitors the electrical output power from a power amplifier to an ultrasound transducer. The power measurement system 3007 can be configured to sample the complex voltage across and current into the output connector 3005. In various embodiments, an IQ demodulator is an electrical power output voltage and current monitoring circuit. The power measurement system 3007 comprises an IQ demodulator that demodulates the RF signal to baseband using a synchronous clock. This can help in real-time, high-resolution monitoring of the phase of the RF power output from the output connector 3005 and/or help in estimation of the thermal dose delivered to the patient.

Some embodiments of the RFTH module comprising a plurality of driving sub-systems 3000 may be configured to provide phase-locked drive signals with controllable frequency and phase to the plurality of driving sub-systems 3000. For example, a clock distribution circuit 3010 including three 4-channel dynamic digital synthesizer (DDS) integrated circuits (ICs) can be used to provide the phase-locked drive signals with controllable frequency and phase. Two of the three DDSs can provide drive signals to the power amplifier 3001 of the plurality of driving sub-systems 3000 while the third DDS provides reference clock signals to the demodulator ICs in the power measurement system 3007 for synchronous demodulation.

Because, the correct operation of the RFTH module is important for patient safety, the RFTH module can include a variety of health monitoring systems configured to ensure correct operation of the RFTH module. For example, the RFTH module can comprise one or more temperature monitors 3009 which monitors the temperature at various portions of the RFTH module. In one implementation of a RFTH module, the one or more temperature monitors can be configured to monitor temperature at thirty two (32) different locations around the RFTH module. In various embodiments, the one or more temperature monitors 3009 may be configured to receive temperature measurements from one or more sensors disposed at various locations of the RFTH module. The RFTH module can comprise one or more power supply monitors 3013 to monitor the voltage and/or current provided to the power amplifier 3001 by the power supply system 3011. In some embodiments, the RFTH module can comprise a controlled current limit (ICTRL) device 3015 that controls the maximum current supply provided to the power amplifier 3001. The RFTH module can comprise relay monitors 3017 that are configured to ensure that various relays (e.g., relay 3018) switch when commanded to switch. Monitors can be provided to monitor the current and/or voltage for different low voltage supplies as well to enable/disable controls and discharge circuits.

The RFTH module can comprise a Board Module Controller (BMC) 3019 that provides communication interfaces with a system real-time controller (RTC) and receives data from the power measurement system 3007, onboard health monitoring systems and power supply monitoring systems. The BMC 3019 can be configured to generate faults whenever it detects erroneous readings from the health monitoring system. These faults can be reported to the RTC and logged to an onboard EEPROM device. The BMC 3019 can be programmed either via a JTAG header 3021 or by a JTAG interface to the RTC.

The RFTH module can be configured to connect to the backplane of the controller 300 through a PCIe connector. Control of the power amplifier 3001 can be performed directly through the RTC over this PCIe connector. The RTC controls the amplitude of each channel and, through control of the DDSs, the frequency and phase. ICs on the board are powered by buck converter DC-DC supplies and Low-Dropout regulators that run off a 24 VDC master supply. In various embodiments, a separate 39 VDC supply can be included to provide power to the power amplifier. This separate power supply can be enabled and disabled separately in various embodiments. Various innovative aspects of the different components, circuits, and/or sub-systems of the RFTH module are described below in greater detail.

Power Amplifier

Various embodiments of the power amplifier contemplated in this application can be capable of providing up to 100 W of RF power with high efficiency over a range of frequencies from 1.0 MHz to 12.0 MHz. For example, various embodiments of the power amplifier included in the RFTH module can be configured to provide RF output power in a range between about 1 W and about 10 W, between about 5 W and about 15 W, between about 10 W and about 20 W, between about 25 W and about 35 W, between about 30 W and about 40 W, between about 35 W and about 45 W, between about 40 W and about 50 W, between about 45 W and about 55 W, between about 50 W and about 60 W, between about 55 W and about 65 W, between about 60 W and about 70 W, between about 65 W and about 75 W, between about 70 W and about 80 W, between about 75 W and about 85 W, between about 80 W and about 90 W, between about 85 W and about 95 W, between about 90 W and about 100 W, or any RF output power in any range/sub-range defined by any of these values over a range of frequencies from 1.0 MHz to 12.0 MHz. In some embodiments, the power amplifier can be configured to provide RF output power greater than about 100 W.

Various embodiments of the power amplifier 3001 included in the RFTH module can be configured for operation over a wide frequency tuning range. For example, various embodiments of the power amplifier can be configured to provide up to 100 W of RF output power over a frequency range spanning at least 2 octaves. For example, the power amplifier can be configured to provide RF output power in any range/sub-range defined by values between about 1 W and about 100 W over a wide range of frequencies between about 1.0 MHz and about 5 MHz, between about 2.5 MHz (e.g., 2.0 MHz, 2.2 MHz, 2.4 MHz, 2.6 MHz, 2.8 MHz, 3.0 MHz) and about 7.5 MHz (e.g., 7.0 MHz, 7.2 MHz, 7.4 MHz, 7.6 MHz, 7.8 MHz, 8.0 MHz), between about 3.0 MHz (e.g., 2.5 MHz, 2.7 MHz, 2.9 MHz, 3.1 MHz, 3.3 MHz, 3.5 MHz) and about 9.0 MHz (e.g., 8.0 MHz, 8.2 MHz, 8.4 MHz, 8.6 MHz, 8.8 MHz, 9.0 MHz), between about 3.5 MHz and about 10.5 MHz, between about 4.0 MHz and about 8.0 MHz, between about 5.0 MHz and about 10.0 MHz, between about 4.0 MHz and about 12.0 MHz, between about 6.0 MHz and about 12.0 MHz, or any frequency range/sub-range defined by any of these frequency values. In various embodiments, the power amplifier can be configured to operate with an efficiency of at least 75% at different frequencies in a frequency range/sub-range defined by values between about 1.0 MHz and about 12.0 MHz.

Various embodiments of the power amplifier 3001 included in the RFTH module can be configured to provide reliable operation by preventing short circuit and open-circuit conditions. Various embodiments of the power amplifier included in the RFTH module can be optimized to drive 50Ω loads. Various embodiments of the power amplifier included in the RFTH module can be configured to drive loads with impedance having a magnitude between about 20Ω and about 200Ω and a phase between about −60 degrees and about 60 degrees. For example, various embodiments of the power amplifier can be configured to drive transducers with an impedance in the range from 20Ω and 120Ω and a phase angle between +45 degrees and −45 degrees.

Semiconductor Material (e.g., Gallium Nitride) Field Effect Transistors

It is desirable for the power amplifier 3001 to achieve power efficiency greater than about 75% in the range of operating frequencies between 1.0 MHz and 12.0 MHz. Accordingly, various embodiments of the power amplifier 3001 can have a switch-mode design. Switch-mode amplifiers can be classified as either resonance devices with zero-voltage switching (e.g. Class E) or devices without zero-voltage switching (e.g. Class D). Many embodiments of the power amplifier 3001 described in this application that are configured to be operated in a frequency range between 1.0 MHz and 12.0 MHz employ a non-resonant switch-mode amplifier design. One implementation of a switch-mode amplifier comprises a switching circuit and a low pass filter. The output of the switch-mode amplifier is a square wave. After passing through the low-pass filter, the square wave becomes more sinusoidal as harmonics above the cut-off frequency of the low-pass filter are removed. Most conventional metal-oxide-semiconductor (MOS) field-effect transistor (FET) devices comprising silicon may not be capable of achieving power efficiency greater than 75% in the desired operation frequency range between 1.0 MHz and 12.0 MHz. However, electronic devices (e.g., transistors and/or FETs) comprising high efficiency transistors such as III-V semiconductor materials (e.g., III-V compound semiconductors obtained by combining group III elements (e.g., Al, Ga, In) with group V elements (e.g., N, P, As, Sb), such as Gallium Nitride (GaN), Gallium arsenide (GaAs), Gallium antimonide (GaSb), Indium phosphide (InP), Indium arsenide (InAs), Indium antimonide (InSb), Indium gallium arsenide (InGaAs), Aluminium antimonide (AlSb), Aluminium gallium arsenide (AlGaAs), Aluminium gallium nitride (AlGaN), etc.) have an output capacitance and a switching time at a given operating voltage that is about an order of magnitude lower than the output capacitance of silicon MOSFETs. In several embodiments, GaN transistors are described, though in other contemplated embodiments, any of the GaN, GaAs, GaSb, InP, InAs, InSb, InGaAs, AlSb, AlGaAs, and/or AlGaN transistors may be used. In one embodiment, only one semiconductor is used. Accordingly, GaN FETs are capable of achieving power efficiency greater than about 75% in a frequency range between about frequency range between 1.0 MHz and 12.0 MHz. GaN FETs comprise a thin layer of GaN grown on a silicon wafer. GaN FETs can have several advantages including but not limited to (i) high dielectric strength which can be attributed to GaN being a wide bandgap semiconductor; (ii) high operating temperature which can be attributed to GaN being a wide bandgap semiconductor and/or having a high potential barrier; (iii) high current density which can be attributed to high electron mobility; (iv) high speed switching which can be attributed to high electric field saturation speed and high electron mobility; (v) low on-resistance as compared to conventional silicon (Si) devices which can be attributed to high electron mobility; and (vi) low output capacitance as compared to conventional Si devices which can also be attributed to high electron mobility. For example, FETs made from GaN can exhibit about ten (10) times lower input and output capacitance for the same current handling capability as silicon FETs. This feature can allow GaN FETs to operate efficiently at much higher frequencies than silicon FETs. Thus, GaN FETs can be capable of achieving power efficiencies greater than about 75% in a switch-mode RF amplifier over a desired operation frequency range between 1.0 MHz and 12.0 MHz.

Transmission Line Transformer

Figure 4:
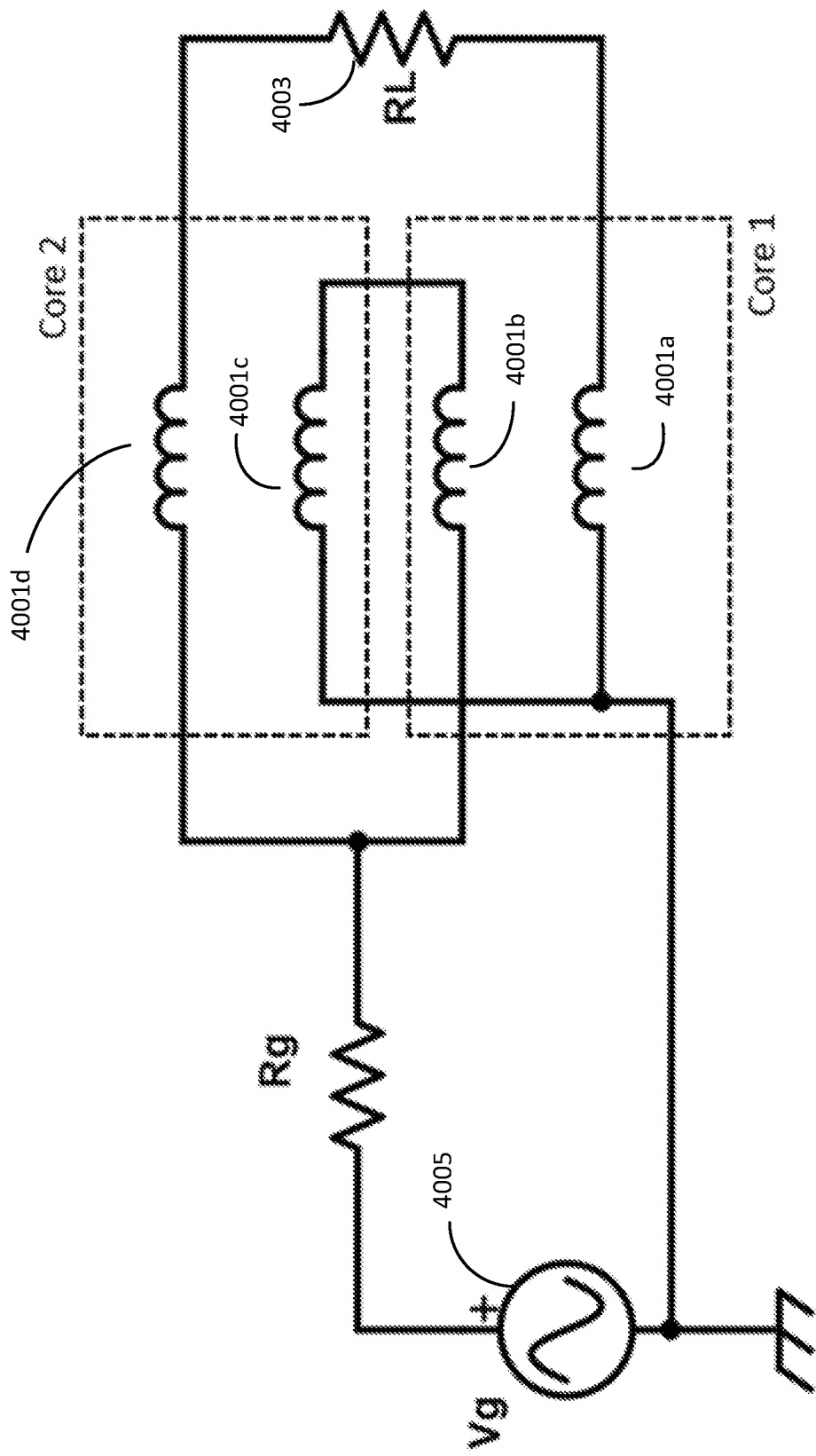
FIG. 4 depicts an embodiment of a transmission line transformer configured to convert the balanced H-bridge output to a Ground referenced source and act as an impedance matching stage from the low-impedance GaN FET to the impedance presented by one or more ultrasound transducers. In one embodiment, a transmission line transformer is configured to increase the source impedance seen by an ultrasound transducer when driven by a GaN FET to the impedance presented by one or more ultrasound transducers.

GaN FETs can have a low output impedance (e.g., less than 100 mΩ). The RFTH module comprising the GaN FETs is configured to drive one or more ultrasound transducers that present an impedance having a magnitude between 20Ω and 200Ω (e.g., 50Ω impedance) to the RFTH module. In various embodiments of the RFTH module, a transmission line transformer is used to match the input impedance of the GaN FET to the impedance presented by the one or more ultrasound transducers. FIG. 4 depicts an implementation of a transmission line transformer that can be used to match impedance of the GaN FET to the impedance presented by the one or more ultrasound transducers. The implementation of the transmission line transformer shown in FIG. 4 is a Guanella type transmission line with a 4:1 impedance ratio. The transmission line transformer comprises a set of common-mode chokes 4001a, 4001b, 4001c, and 4001d that are connected in parallel on the low impedance side (e.g., the side facing the GaN FET device 4005) and in series on the high-impedance side (e.g., the side facing the load 4003). The common-mode chokes 4001a-4001d can comprise wires wound on a ferrite core. A positive current 2I flowing out of the power amplifier 3001 having an output voltage $V_g$ branches into a current I through common-mode choke 4001d and a current I through common-mode choke 4001b. The common-mode chokes are configured to only allow differential signals to pass. Accordingly, the positive current in the common-mode choke 4001b creates a negative current −I in the common-mode choke 4001a that returns the current in the common-mode choke 4001d. Because a current 2I flows out into the left side of the transmission line transformer and a current I flows through the load 4003, by conservation of energy the voltage across the load 4003 must be $2V_g$. This is the basic principle of operation of the Guanella transmission line transformer.

The implementation of the Guanella transmission line transformer depicted in FIG. 4 provides a 2:1 turns ratio which results in a 4:1 impedance ratio. A higher impedance ratio can be achieved by adding more common-mode chokes in parallel on the left side and in series on the right. Furthermore, there is no need for the common-mode chokes to be on different cores. As long as proper attention is paid to the winding direction to ensure that the common-mode magnetic fields from different winding pairs do not cancel, the windings can all be wound on the same core. Various embodiment of the power amplifier 3001 comprise a Guanella transmission line transformer with three (3) pairs of windings on a single Amidon FT-87A-43 ferrite core. The three (3) pairs of windings can comprise bifilar windings which can advantageously minimize or reduce parasitics. Additionally, each pair of bifilar windings can present a large common-mode impedance and a small differential-mode impedance. Such an embodiment of the Guanella transmission line transformer can provide a 9:1 impedance ratio that transforms the 50Ω output impedance into a 5.6Ω impedance at the transistors. By transforming the nominally 50Ω load impedance to 5.6Ω on the side facing the GaN FET, the embodiment of the Guanella transmission line transformer can provide a load which the GaN FETs can drive more efficiently than they could drive a 50Ω load directly. This can be attributed to the quadratic increase in output capacitance charging losses experienced with voltage increases. Furthermore, by boosting output voltage, the embodiment of the Guanella transmission line transformer can allow large output voltages in excess of 200 Vpp to be generated from a low voltage supply (e.g., nominally 39 VDC).

Moreover, by providing balanced to unbalanced conversion, the Guanella transmission line transformer can allow a balanced H-bridge driver to be used to drive the ultrasound transducer with a ground referenced signal. The balanced H-bridge design provides an effective doubling of the drive voltage and eliminates even-order harmonics from the output waveform due to the left-right symmetry of the bridge. The balanced H-bridge driver design is discussed in detail below.

H-Bridge Driver

Figures 5A, 5B, 5C:
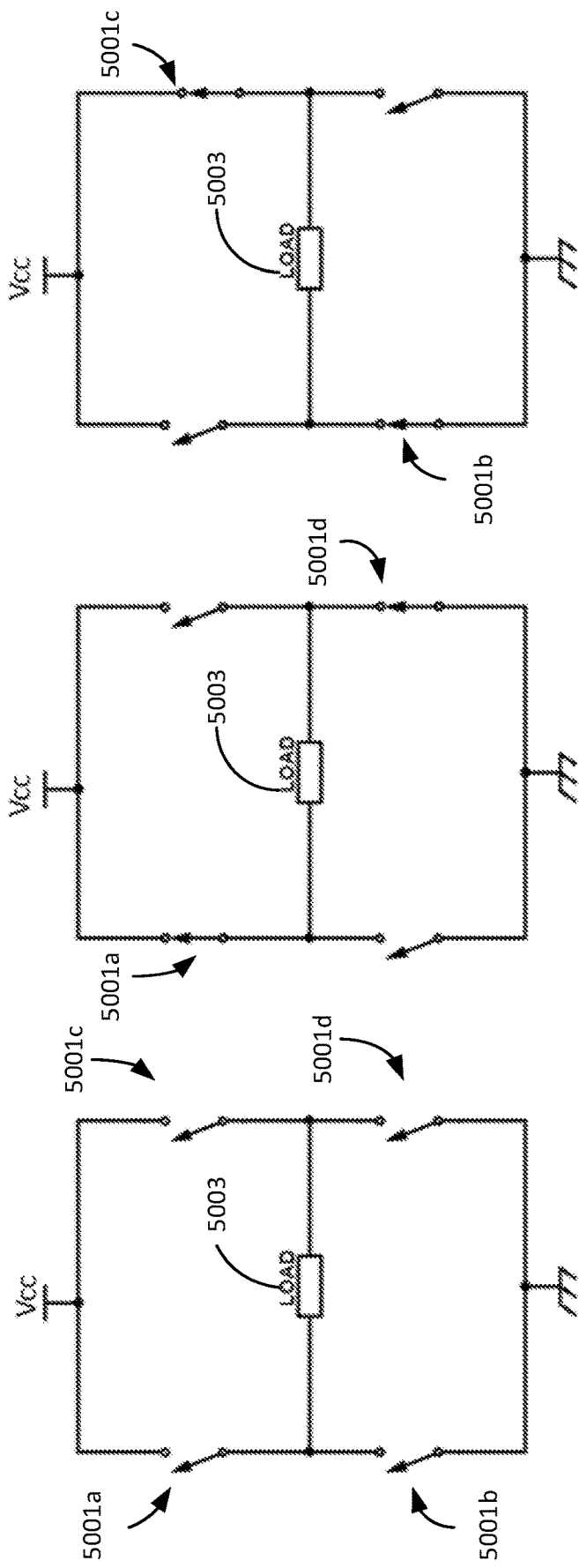
FIG. 5A illustrates an embodiment of an H-bridge design topology.
FIGS. 5B and 5C illustrate the operation of the H-bridge in two different configurations.

Various embodiments of the power amplifier 3001 comprising GaN FETs can be driven by a H-bridge driver. The H-bridge design topology is illustrated in FIG. 5A. The H-bridge operates by placing a load 5003 at the midpoint between a first pair of FETs 5001a and 5001b and a second pair of FETs 5001c and 5001d. Diagonally opposite FETs (e.g., 5001a and 5001d or 5001b and 5001c) on the bridge are configured to switch to the same state. In a first switching configuration, FETs 5001a and 5001d are configured to be in a closed configuration while FETs 5001b and 5001c are configured to be in an open configuration as shown in FIG. 3B. In the first switching configuration current is driven through the load 5003 from left to right. In the second switching configuration, FETs 5001b and 5001c are configured to be in a closed configuration while FETs 5001a and 5001d are configured to be in an open configuration as shown in FIG. 3C. In the second switching configuration current is driven through the load 5003 from right to left. Due to the left-right symmetry of the H-bridge design, the negative-going part of the signal can have substantially the same form as the positive-going part of the signal. This property can advantageously suppress even-order harmonics in the signal, leaving only odd-order harmonics.

The H-bridge driver design is optimized to achieve an average power efficiency greater than about 75% in a range of frequencies between about 1.0 MHz to 12.0 MHz. For example, the average power efficiency achieved by various embodiments of the power amplifier 3001 comprising a GaN FET can be greater than about 80%, greater than about 85%, greater than about 90%, greater than about 95% and/or less than about 100% in a range of frequencies between about 1.0 MHz to 12.0 MHz. The optimized H-bridge design can be configured to achieve a peak power efficiency greater than about 85% in a range of frequencies between about 1.0 MHz to 12.0 MHz. For example, the average power efficiency achieved by various embodiments of the power amplifier 3001 comprising GaN FET can be greater than about 90%, greater than about 95% and/or less than about 100% in a range of frequencies between about 1.0 MHz to 12.0 MHz.

A functional requirement of the ultrasound therapy system 20 described herein is to produce an output signal that is instantaneously narrow band but that can operate at any frequency within a wide range spanning at least 2 octaves (e.g., spanning at least 3-4 octaves.) For example, the ultrasound therapy system 20 described herein may be configured to produce an output signal at a fundamental frequency $f_0$ having a value in the frequency range between 1.0 MHz and 12.0 MHz and having a bandwidth (e.g., 3-dB bandwidth) of the output signal. Without relying on any particular theory, the output from the H-bridge driver is a filtered square wave which includes a signal component at the fundamental frequency $f_0$ and components at higher order harmonics. The higher order harmonics can distort the RF signal output from the power amplifier 3001 and/or also affect the accuracy of measurement of RF power of the output RF signal. Additionally, if the one or more ultrasound transducers were driven with a signal containing harmonics then the acoustic emission might also contain the harmonics. Because of the frequency-dependence of ultrasound absorption in tissue, this may result in heating proximal to the intended focus, possibly presenting a hazard to the patient. Furthermore, harmonics at frequencies in excess of 30 MHz may present a risk for generating radiated emissions in excess of the limits prescribed by the basic safety and performance of medical equipment.

Accordingly, it is desirable to reduce the amplitude of higher order harmonics in the signal output from the H-bridge driver below a threshold value. One approach to reduce the amplitude of higher order harmonics in the signal output from the H-bridge driver can include providing a low-pass filter to remove higher order harmonics. However, providing a low-pass filter that filters out the higher order harmonics for lower values of frequency $f_0$ (e.g., between 1.0 MHz and about 6.0 MHz) can result in reducing the amplitude of the output RF signal having a fundamental frequency $f_0$ greater than the cut-off frequency of the low-pass filter. Accordingly, to allow efficient operation of the power amplifier 3001 across the entire frequency range from 1.0 MHz to 12.0 MHz, the cut-off frequency of the low-pass filter should be greater than about 12.0 MHz, such as, for example 16.0 MHz. However, a low-pass filter having a cut-off frequency greater than about 12.0 MHz is not capable of attenuating the amplitude of higher-order harmonics for lower values of frequency $f_0$ (e.g., between 1.0 MHz and about 6.0 MHz). Accordingly, when the power amplifier 3001 is configured to operate at a fundamental frequency $f_0$ having a value between about 1.0 MHz and about 6.0 MHz, multiple higher-order harmonics may be present in the passband.

Figure 6:
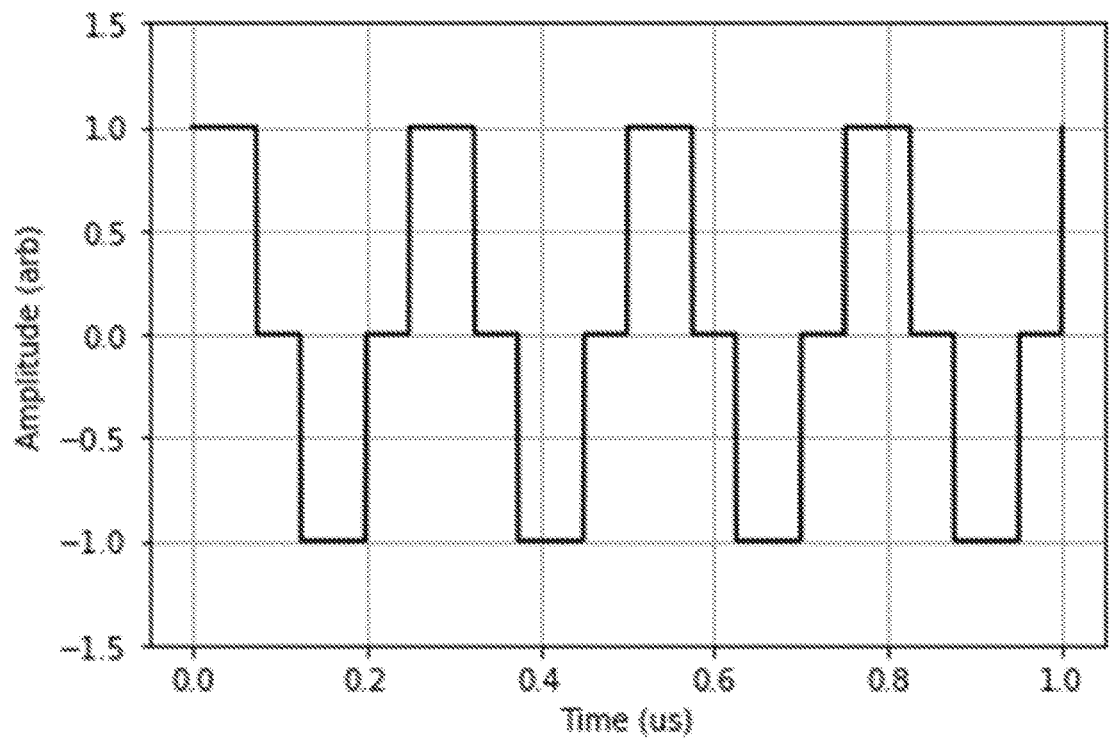
FIG. 6 shows a drive signal generated by the H-bridge when the duty cycle of the positive part of the waveform and the negative part of the waveform is set to 0.3 according to various embodiments of the present invention.
Figure 7:
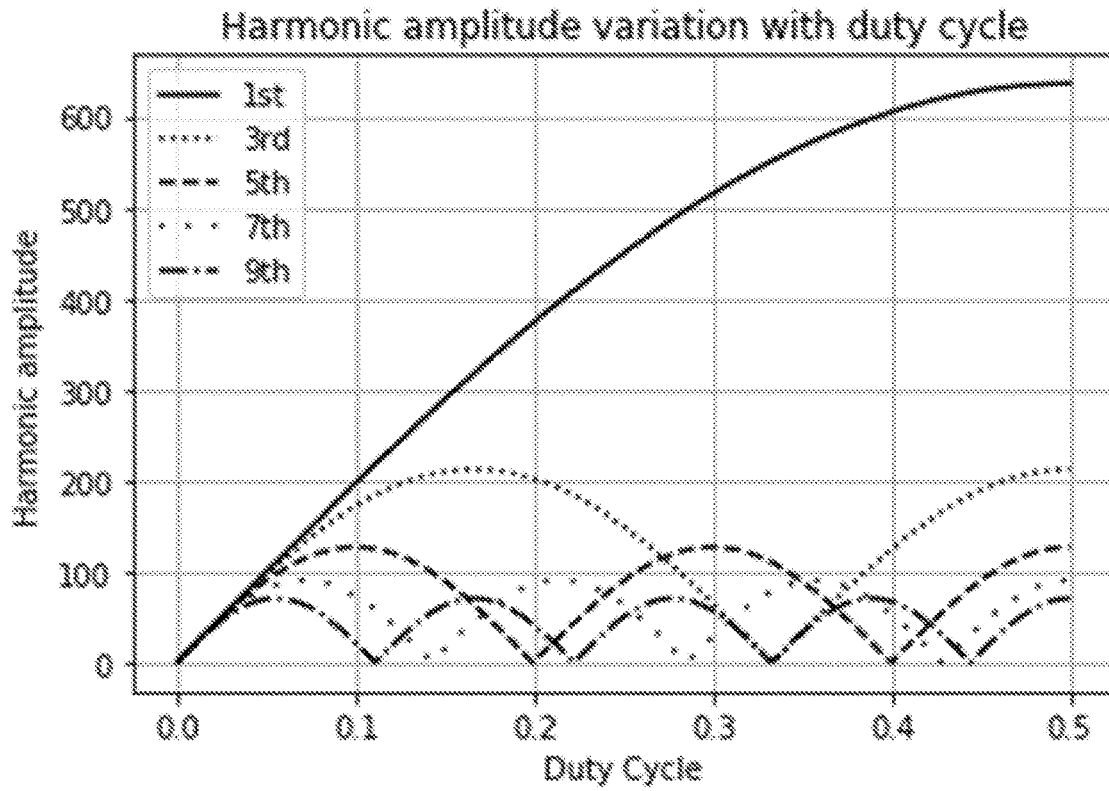
FIG. 7 shows the variation of the amplitude of higher odd-order harmonics for different duty cycles of the positive part of the waveform and the negative part of the waveform according to various embodiments of the present invention.

As discussed above, the H-bridge design employs waveforms that are symmetric under inversion—in which the negative part of the waveform looks like the positive part of the waveform—to eliminate higher even-order harmonics (e.g., signals at $2f_0$, $4f_0$, $6f_0$, or other higher even-order harmonics). To suppress the higher odd-order harmonics (e.g., signals at $3f_0$, $5f_0$, $7f_0$, or other higher odd-order harmonics), the H-bridge design uses a unique drive signal scheme in which the duty cycle of the positive part of the waveform and the negative part of the waveform is selected to suppress higher odd-order harmonics. FIG. 6 shows a drive signal generated by the H-bridge when the duty cycle of the positive part of the waveform and the negative part of the waveform is set to 0.3. FIG. 7 shows the variation of the amplitude of higher odd-order harmonics for different duty cycles of the positive part of the waveform and the negative part of the waveform. From FIG. 7 it is noted that the fundamental power increases with increasing duty cycle, reaching its peak value at a duty cycle of 50%. Accordingly, duty cycle can be used to modulate output power at the fundamental frequency. It is further noted from FIG. 7 that different harmonics reach their minimum value at different duty cycle values. Accordingly, if suppression of a particular harmonic is desired, there are one or more duty cycle values for which that harmonic is heavily suppressed. Moreover, at a duty cycle of 0.333 both the $3^{rd}$ and $9^{th}$ harmonics are suppressed. This is useful since the $3^{rd}$ harmonic is the lowest frequency non-zero harmonic and so is likely to be least suppressed by the low pass filter. Accordingly, selecting a duty cycle of about 0.3 can advantageously suppress the $3^{rd}$ order harmonic in the drive signal. Without any loss of generality, the duty cycle of the positive and negative parts of the waveform are selected to have the same value to suppress even-order harmonics. It is further noted from FIG. 7 that the minimum total harmonic content occurs at a duty cycle of 0.386. In addition to controlling the duty cycle of the positive part of the waveform and the negative part of the waveform output from the H-bridge to suppress higher odd-order harmonics, a low-pass filter having a cut-off frequency greater than or equal to about 80% of the maximum frequency of operation of the power amplifier can be provided to suppress higher odd-order harmonics. For example, in various embodiments of the ultrasound therapy system that is configured to operate at a highest frequency of about 12.0 MHz, a low-pass filter having a cut-off frequency greater than or equal to about 12.0 MHz (e.g., between about 10 MHz and about 16.0 MHz) can be employed to remove higher odd-order harmonics having a frequency greater than the cut-off frequency.

Figure 8A:
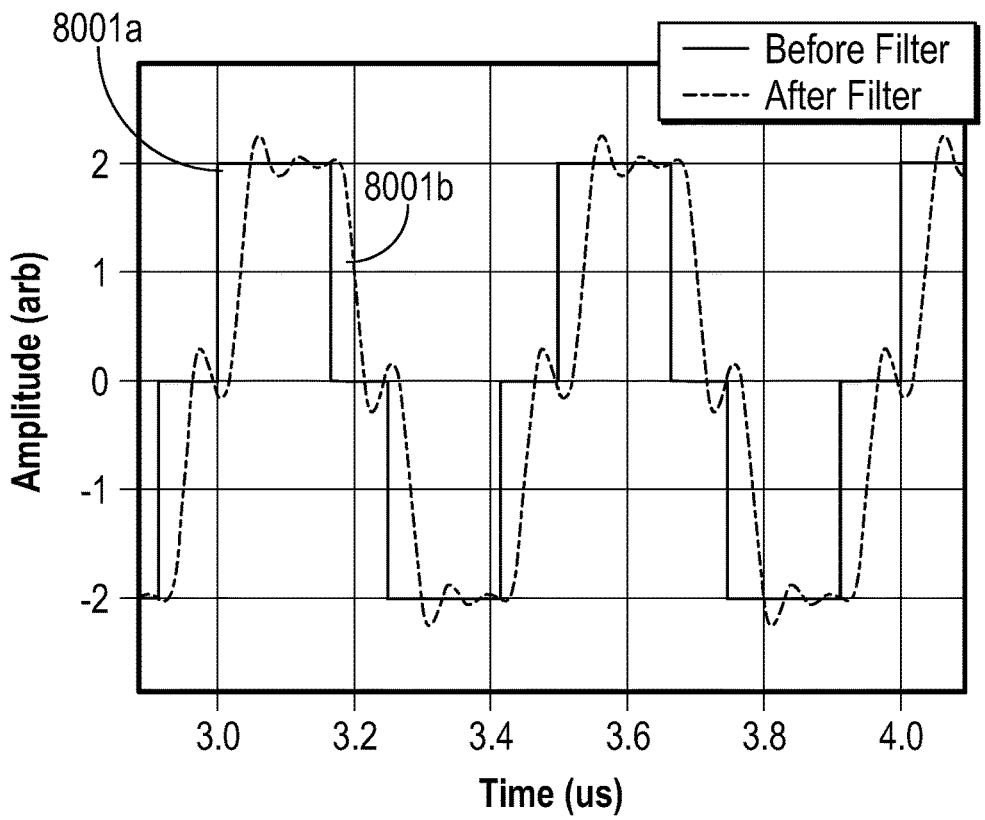
FIGS. 8A-8D show the signal output from an implementation of a power amplifier employing an H-bridge design at 2.0 MHz, 4.0 MHz, 7.0 MHz and 12.0 MHz respectively, according to various embodiments of the present invention.
Figure 8B:
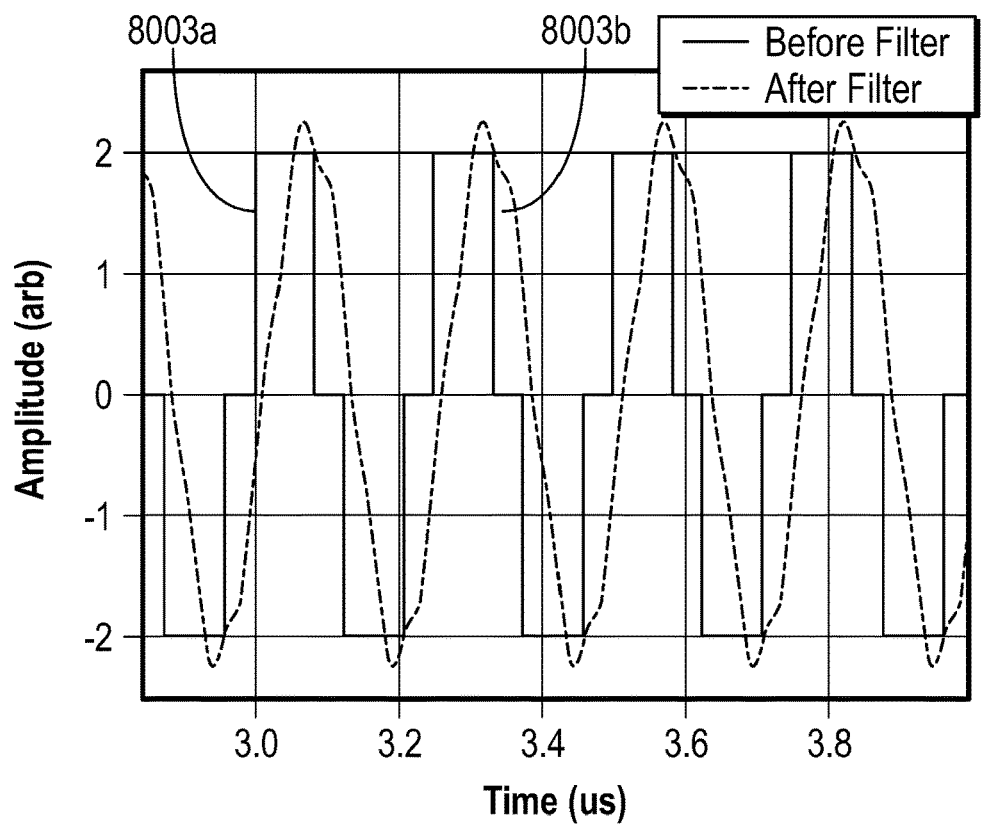
Figure 8D:
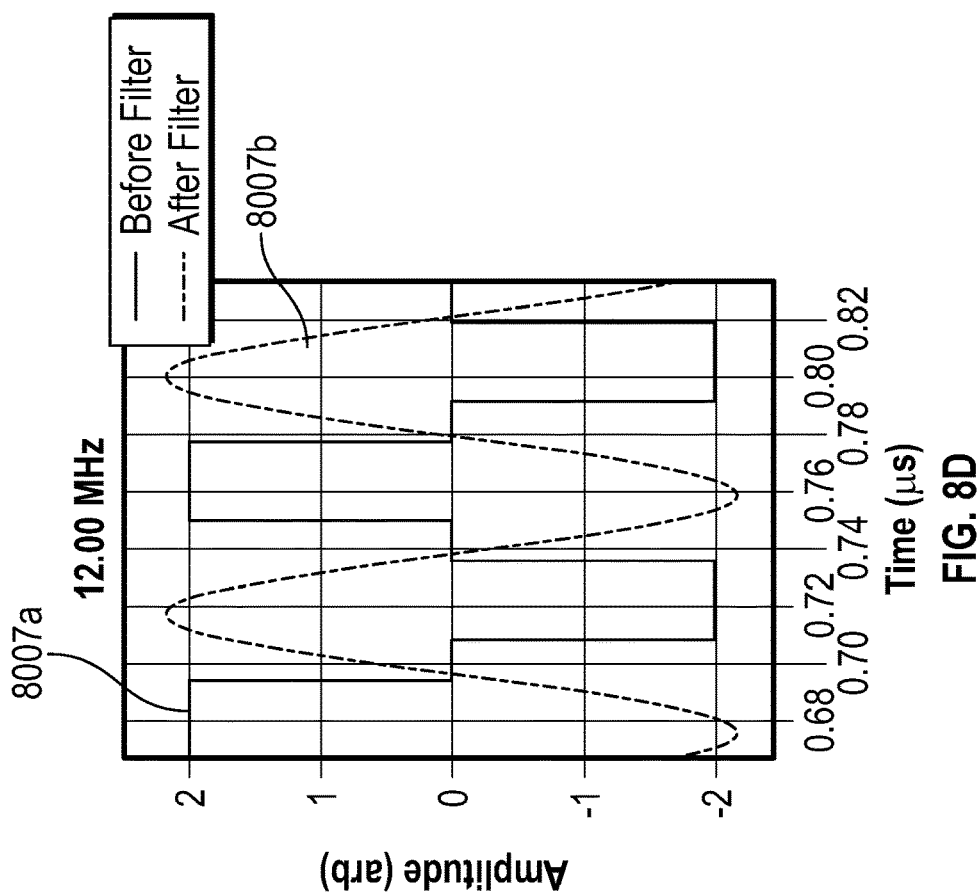
Figure 8C:
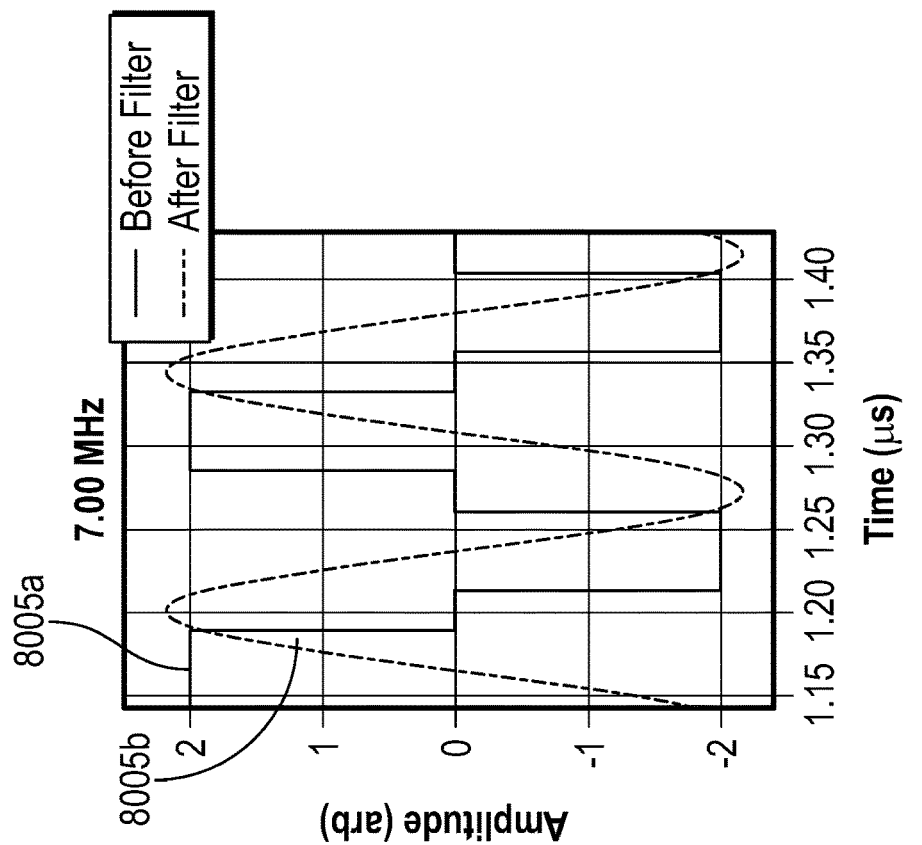

Consider an implementation of an ultrasound therapy system that is configured to operate in a frequency range from about 1.0 MHz to about 12.0 MHz. Additionally, consider that the GaN FETs in the power amplifier included in such an implementation of an ultrasound therapy system are driven by a H-bridge driver in which the duty cycle of the positive part of the waveform and the negative part of the waveform are selected to suppress the $3^{rd}$ order harmonic (e.g., duty cycle of about 0.33). Further consider that the power amplifier comprises a low-pass filter (e.g., a $5^{th}$ order Chebyshev filter with a 0.1 dB ripple) with a cut-off frequency of about 16 MHz. FIGS. 8A-8D show the signal output from such an implementation of the power amplifier at 2.0 MHz, 4.0 MHz, 7.0 MHz and 12.0 MHz. In FIGS. 8A-8D, references numerals 8001a, 8003a, 8005a and 8007a refer to the output signal before the low-pass filter and references numerals 8001b, 8003b, 8005b and 8007b refer to the output signal after the low-pass filter. It is noted that output signal after the low-pass filter in FIG. 8A is distorted from a sinusoidal shape indicating that the low-pass filter allows some higher odd-order harmonic in the passband at a frequency of 2.0 MHz. The contribution of the higher odd-order harmonic is significantly reduced at a frequency of 4.0 MHz as noted from the nearly sinusoidal signal output after the low-pass filter in FIG. 8B. At a frequency of 7.0 MHz and 12.0 MHz, the higher odd-order harmonics are nearly eliminated as noted from the sinusoidal nature of the signal output after the low-pass filter.

Accordingly, various embodiments of the H-bridge driver configured to drive the GaN FETs of the power amplifier 3001 are configured to be operated at a duty cycle that suppresses $3^{rd}$ order harmonics and has a low-pass filter having a cut-off frequency designed to suppress higher odd-order harmonics having a frequency greater than about 12.0 MHz.

Figure 9:
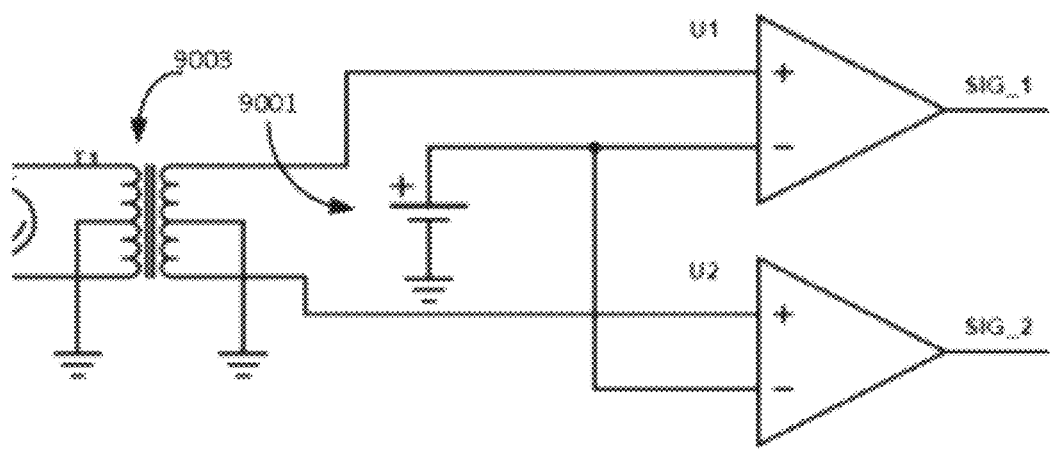
FIG. 9 shows a simplified schematic of a comparator circuit used to generate two drive waveforms that are 180 degrees out of phase with each other according to various embodiments of the present invention.

The H-bridge drive signal is generated from analog comparison between a DC signal set by a digital-to-analog converter (DAC) and a pair of out-of-phase sine wave signal from a balanced differential output stage of a direct-digital synthesizer (DDS). FIG. 9 shows, a simplified schematic of a comparator circuit used to generate the two drive waveforms. In FIG. 9, the battery 9001 represents the DC voltage supply and the transformer 9003 provides the balanced signal.

Figure 10:
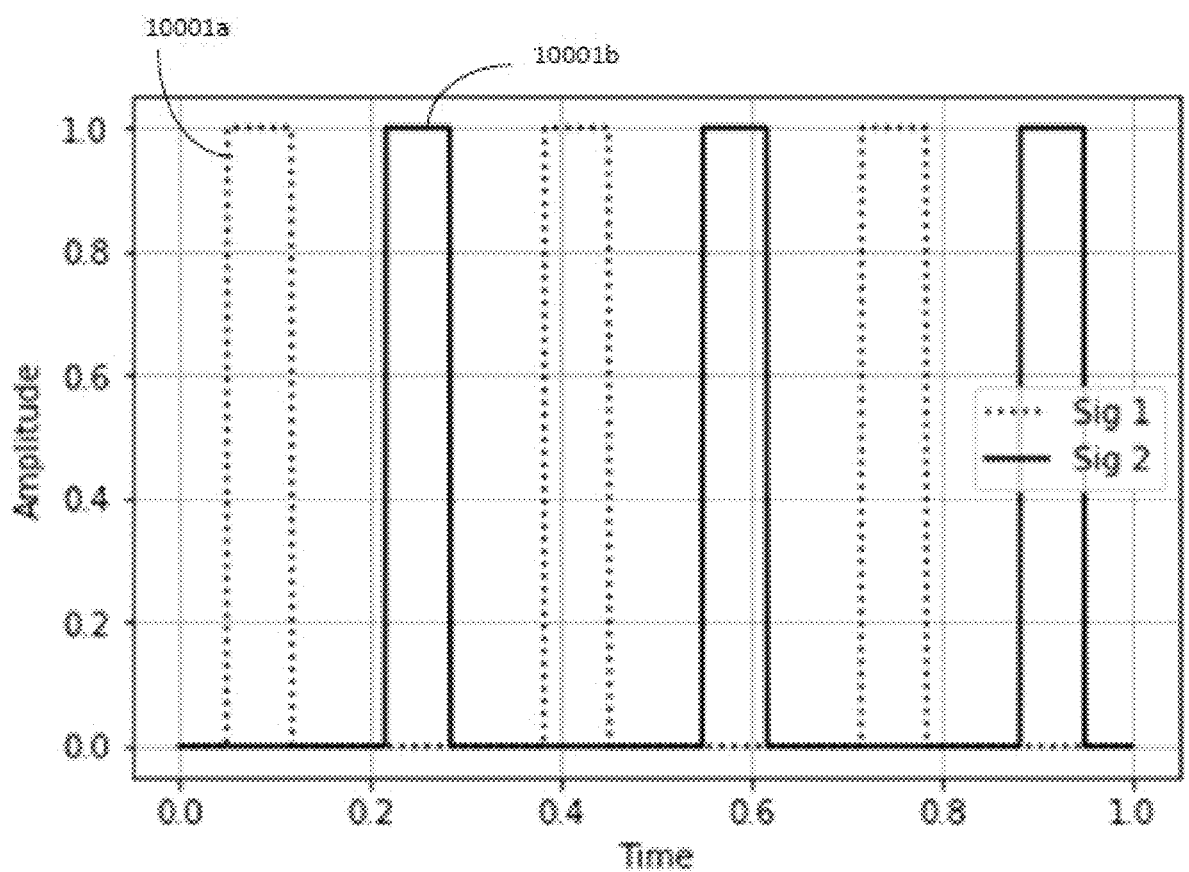
FIG. 10 graphically illustrates the two drive waveforms generated by the circuit of FIG. 9.

FIG. 10 graphically shows the H-bridge drive signals plotted on the same plot with waveform 10001a depicting the waveform produced by the in-phase sine wave and 10001b depicting the waveform produced by the out-of-phase sine wave. The two drive signals represented by waveforms 10001a and 10001b are delayed by 180 degrees.

An advantage of the H-bridge design represented by the circuit of FIG. 9 is that it can provide a convenient mechanism for modulating the gate drive duty cycle by changing the value of the DC signal which corresponds to the output from the battery 9001. In the RFTH module, this DC signal is controlled by a 12-bit DAC, and can modulate the duty cycle from 0% to 50%. As discussed above, control of duty cycle provides a number of advantages including but not limited to adjusting the power level of the fundamental frequency and suppressing amplitude of higher order harmonics. Additionally, setting the gate drive duty cycle to 0% or 100% can provide a convenient method to prevent switching off the H-bridge FETs during a TCP for measuring VSWR sensitivity. Additionally, setting the gate drive duty cycle to 0% or 100% can provide a mechanism for disabling unused channels during testing.

Protection Circuit

Figure 11A:
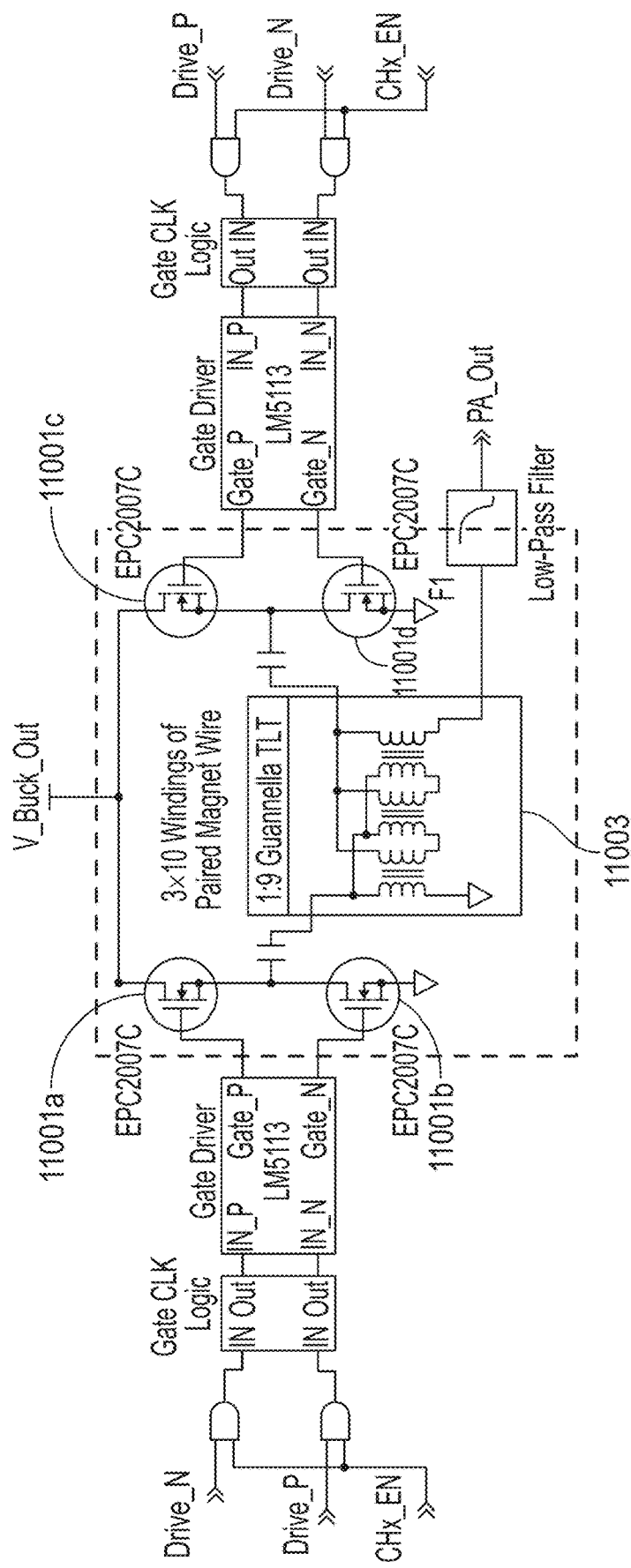
FIG. 11A illustrates a simplified circuit diagram of a switch-mode power amplifier comprising an H-bridge formed by four (4) GaN FETs driving the balanced side of a 1:9 Guanella transmission line transformer according to various embodiments of the present invention.
Figure 11B:
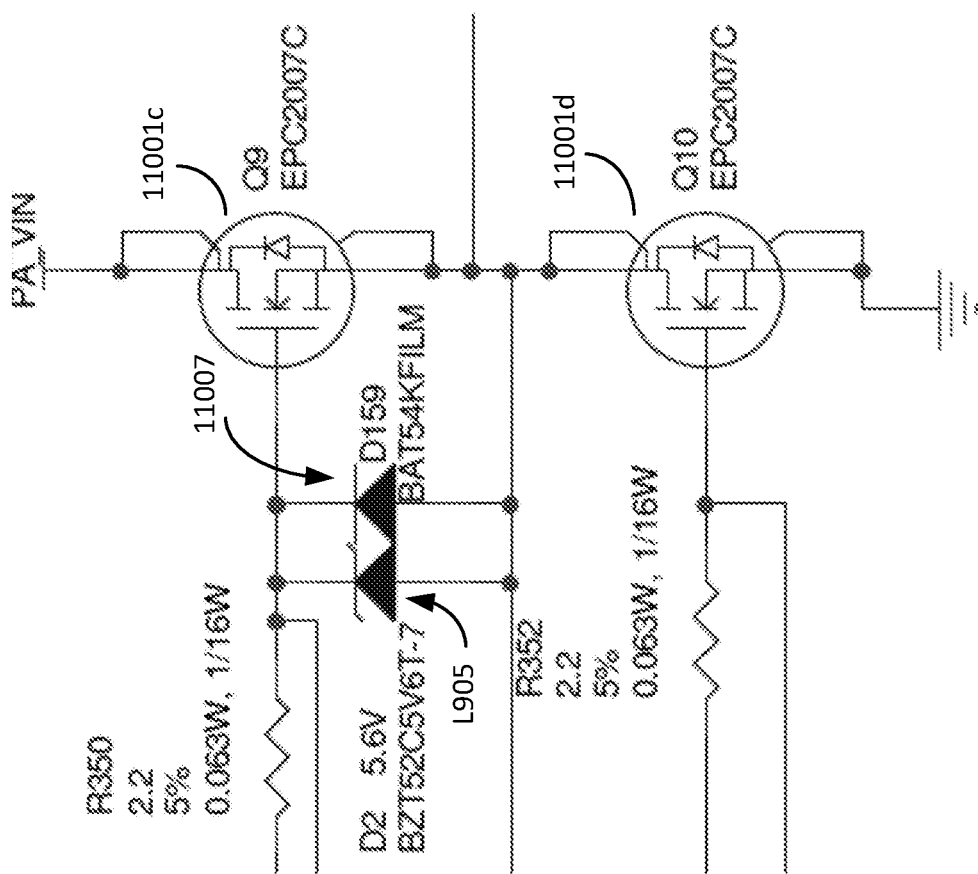
FIG. 11B depicts an implementation of a protection circuit included in various implementations of a switch-mode power amplifier according to various embodiments of the present invention.

FIG. 11A illustrates a simplified circuit diagram of a switch-mode power amplifier 3001 comprising an H-bridge formed by four (4) GaN FETs 11001a, 11001b, 11001c and 11001d driving the balanced side of a 1:9 Guanella transmission line transformer 11003. GaN FETs can be prone to damage from inductive spikes due to their relatively delicate gate-channel insulation layers and small range of the breakdown voltage. Accordingly, a protection circuit including a parallel 5.6V Zener diode 11005 and a fast Schottky diode 11007 on the H-bridge high-side FET gates 11001c and 11001d can ensure that the threshold turn-on voltage $V_{GS}$ does not exceed 5.6V on the positive side and that the gate does not go more than 0.3V below the source on the negative side. An implementation of such a protection circuit is shown in FIG. 11B. Such a protection circuit can protect GaN FETs against inductive spikes and short circuit surges (or discharges) in excess of 20 A can be tolerated for over 1 ms (e.g., 2 ms, 5 ms, 10 ms, or more). For example, the Schottky diode 11007 can ensure that in the event of an inductive spike that generates a negative $V_{GS}$, the gate voltage stays clamped to the source voltage. In some embodiments, without the presence of the Schottky diode 11007 current surges exceeding 8 A (as can be encountered in a short circuit event) could cause the GaN FETs to fail.

Amplitude Control

Figure 11C:
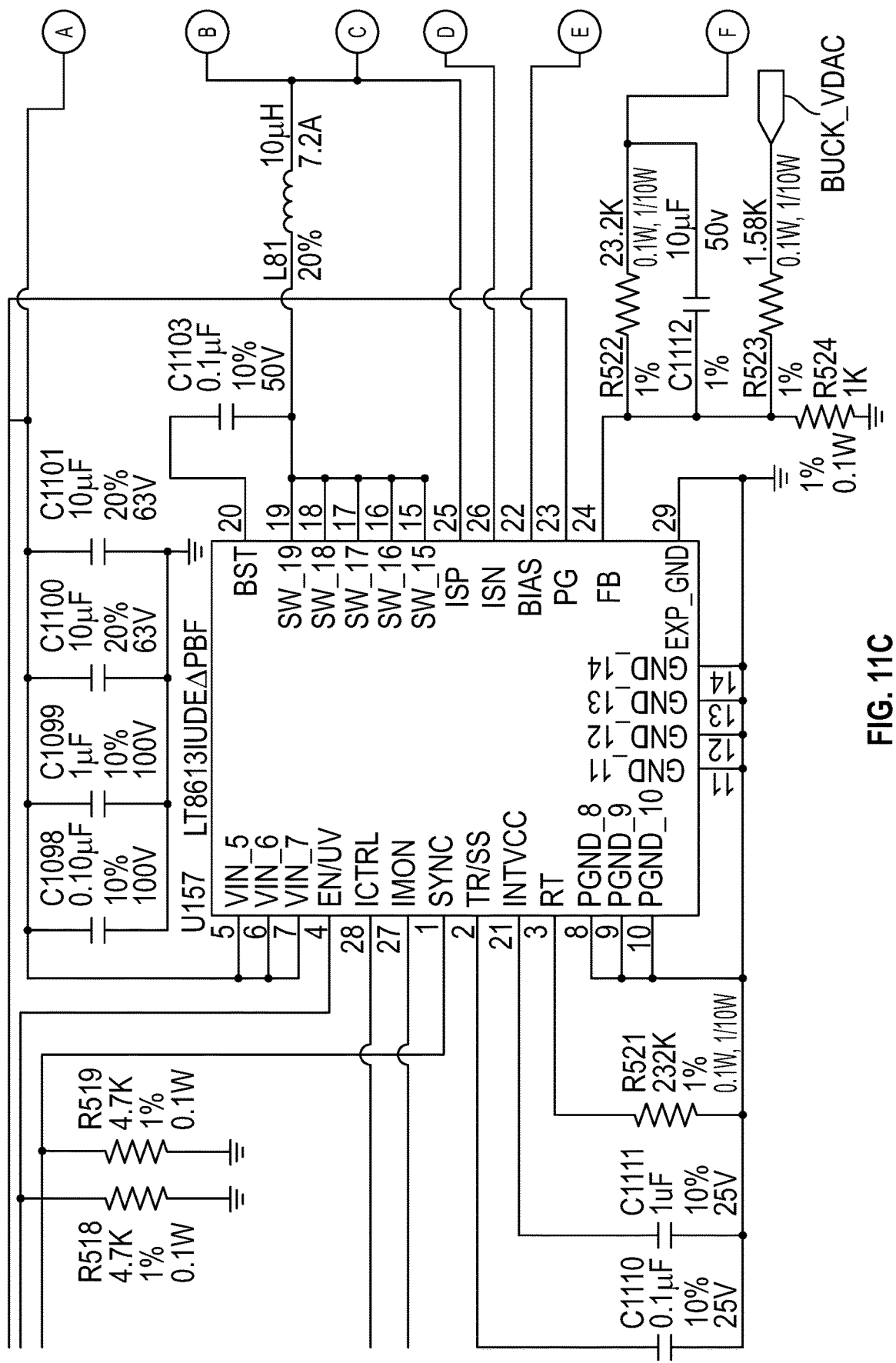
FIG. 11C illustrates an implementation of a voltage-controlled buck converter according to various embodiments of the present invention.
Figure 11C:
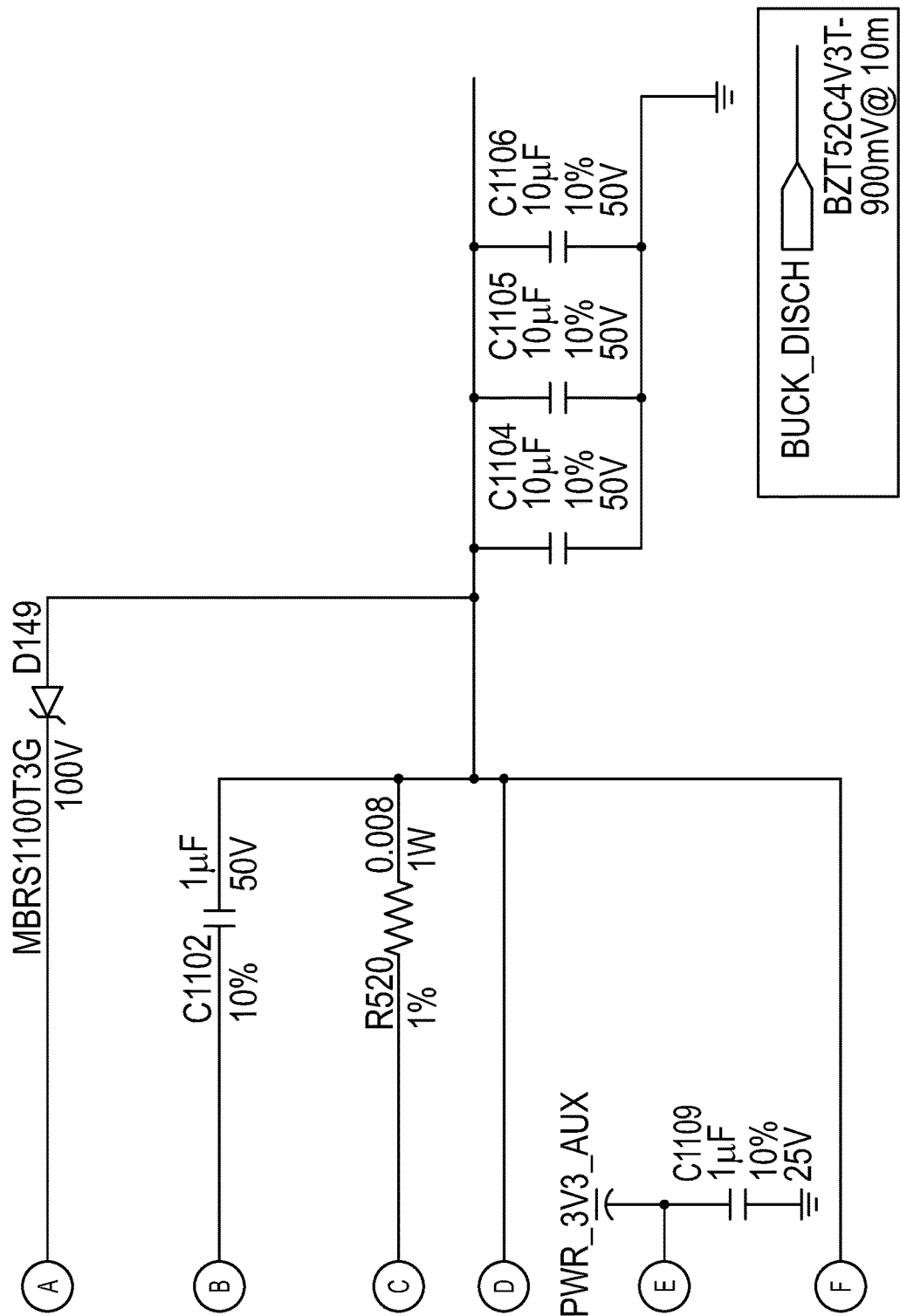

Various embodiments of the power amplifier 3001 can comprise a voltage controlled buck converter to provide amplitude control. An implementation of a voltage-controlled buck converter is shown in FIG. 11C. The voltage-controlled buck converter can also be referred to as a feedback-controlled buck converter. The amplitude can be controlled by injecting current into a summing node of the voltage-controlled buck converter which imparts a stepwise and/or low-bandwidth modulation (e.g., less than or equal to about 3 kHz) on the output of the voltage-controlled buck converter. In one embodiment, a deployed system uses discrete amplitude changes. In one embodiment, discrete amplitude changes are important to control power for any therapy mode-imaging mode scenarios. The low-bandwidth modulated output from the voltage-controlled buck converter is provided to the H-bridge which causes the RF power output from the power amplifier to have a low-bandwidth modulation. Without any loss of generality, the low low-bandwidth modulated output from the voltage-controlled buck converter can change the drive voltage provided to the FETs which can change the voltage applied to the load when the high side FETs are on. This is described in further detail below.

In one embodiment, the H-bridge output is modulated by changing the voltage supplied at the drain of the high-side FETs. that is delivered to the load when the high-side FETs are on. In one embodiment, the H-bridge output is modulated by changing the voltage supplied at the drain of the high-side FETs that is delivered to the load when the high-side FETs is closed. In some embodiments, this voltage is generated as the output from a step-down DC-DC buck converter capable of efficiently stepping the voltage down from a high voltage supply. The output voltage of a buck converter is controlled by the duty cycle and frequency of switching events. Some embodiments of the basic Buck converter circuit include a feedback loop in which the output is measured and compared against a threshold value. If the output drops below the threshold the buck converter modifies its switching behavior to deliver more power to the load. In some embodiments of power amplifiers using Buck converters to set the output amplitude, the output of the buck converter is controlled by injecting a current in the summing input of the feedback loop. As more current is delivered to the summing node, less current is provided by the output of the Buck converter which causes the output voltage to drop. Conversely as less current is delivered to the summing node, more current is provided by the output of the buck converter which causes the output voltage to rise. The voltage at the output of the buck converter can rise until the voltage at the summing node exceeds the threshold.

Power Measurement System

As discussed above, various embodiments of the RFTH module described herein comprises a power measurement system 3007 that is configured to monitor the electrical power output from the power amplifier 3001 to one or more ultrasound transducers. In various embodiments, the power measurement system 3007 can be configured to measure power of RF signal output from power amplifier in different driving sub-systems 3000 of the RFTH module. Additionally, the power measurement system 3007 can also be configured to measure the relative phase between the RF signal output from the power amplifier 3001 of different driving sub-systems 3000.

The power measurement system 3007 can be implemented as a high-density printed circuit board (PCB) design. The PCB design may be configured to have a small size and/or low thermal dissipation. Various embodiments of the power measurement system 3007 may be configured to measure the RF signal power output from the power amplifier 3001 delivered to a wide range of load impedance Z having a magnitude |Z| between 20Ω and 200Ω and a phase angle ∠Z between −60° and 60°. For example, various embodiments of the power measurement system 3007 may be configured to measure the RF signal power output from the power amplifier 3001 delivered to a wide range of load impedance Z having a magnitude |Z| between 20Ω and 120Ω and a phase ∠Z between +45 degrees and −45 degrees. Various embodiments of the power measurement system 3007 may be configured to measure the power of the RF signal output from power amplifier in different driving sub-systems 3000 with an accuracy of about ±0.5 dB. Various embodiments of the power measurement system 3007 may be configured to measure the power of the RF signal output from power amplifier in different driving sub-systems 3000 with an accuracy of about ±0.5 dB even in the presence of significant contribution to the RF signal power from higher order harmonics. Various embodiments of the power measurement system 3007 may be configured to operate over a wide frequency range. For example, the power measurement system 3007 may be configured to operate over at least the same frequency range as the power amplifier 3001. For example, the power measurement system 3007 may be configured to operate in a wide range of frequencies between about 1.0 MHz and about 12.0 MHz.

Various embodiments of the power measurement system 3007 may comprise resistive current sense and voltage sense components. For example, various embodiments of the power measurement system 3007 may employ small-signal transformers for common-mode rejection. Use of resistive current sense and voltage sense components can have several advantages compared to magnetic devices (e.g., RF directional couplers, RF circulators and other magnetic devices) more commonly used for monitoring RF power including but not limited to smaller circuit size, lower cost, lower thermal dissipation and/or improved interference immunity.

Figure 12:
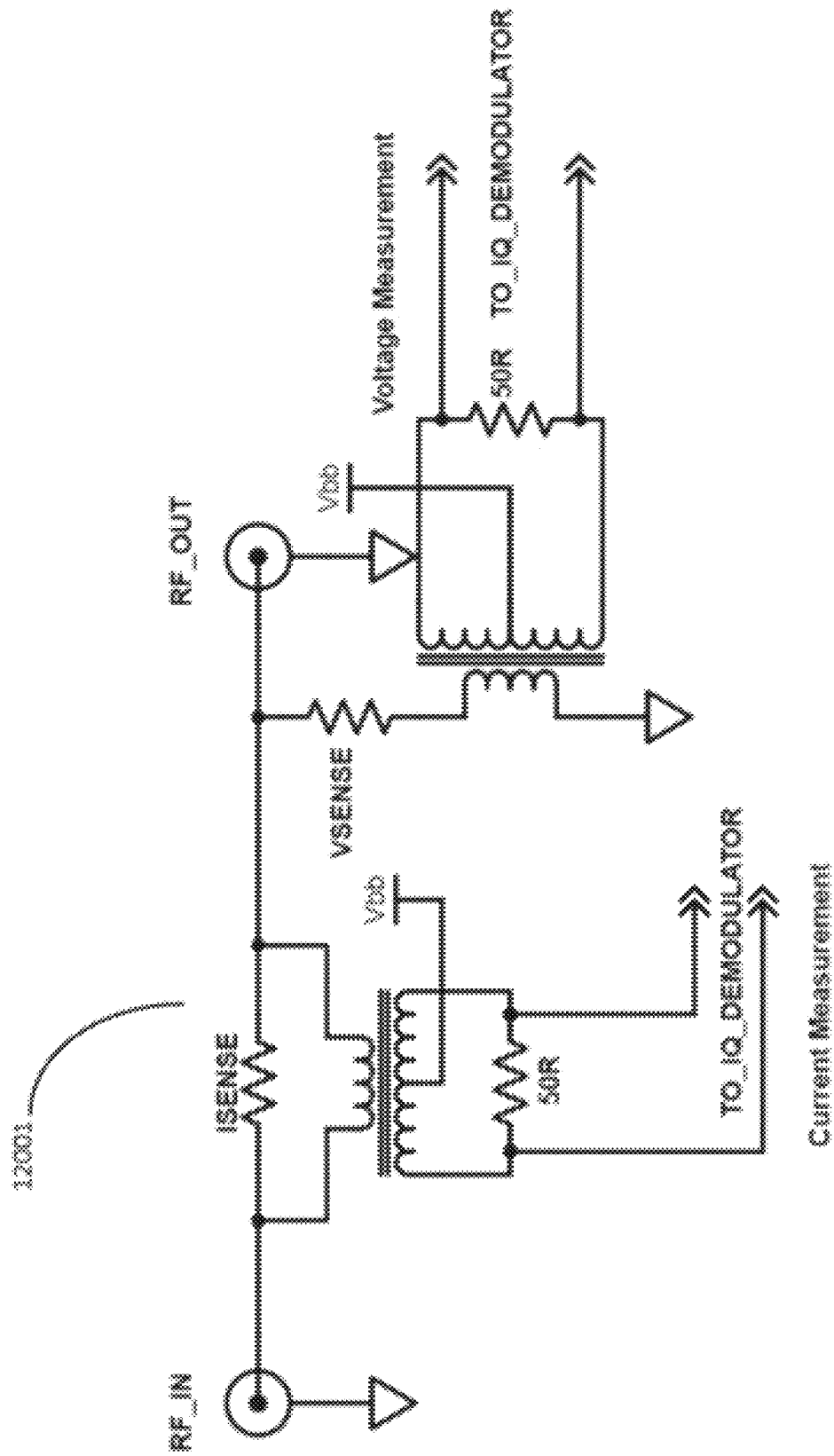
FIG. 12 illustrates a differential measurement scheme comprising wideband small-signal RF transformers according to various embodiments of the present invention.

Although, parasitic reactance effects can be significant in resistive current sense and voltage sense components, most parasitic reactance effects can be calibrated and removed from measurements. The power measurement system 3007 can comprise a differential measurement scheme comprising wideband small-signal RF transformers as shown in FIG. 12. The differential measurement scheme can remove the large common-mode component from a signal and can advantageously isolate the measurement circuitry from the current sense resistor 12001. The differential measurement scheme can provide immunity against interference arising from capacitive and magnetic coupling between components of the power measurement system 3007 and the components of the power amplifier 3001. In particular, magnetic fields radiated from the power transformer and parasitic mutual capacitance and inductance on the PCB can couple to the amplifier inputs. This interference is common-mode and will generate nearly identical couplings on the two inputs of the differential amplifier. Accordingly, employing a differential amplifier can advantageously subtract/remove the common-mode couplings at the two inputs of the differential amplifier while enhancing the differential current or voltage signal.

The power measurement system 3007 comprises a heterodyne IQ demodulator (e.g., demodulator AD8333 from Analog Devices). In various embodiments of the RFTH module, each driving sub-system 3000 can comprise a heterodyne IQ demodulator configured to accept sampled current and voltage waveforms of a portion of the RF signal output from the power amplifier included in that driving sub-system 3000.

Figure 13:
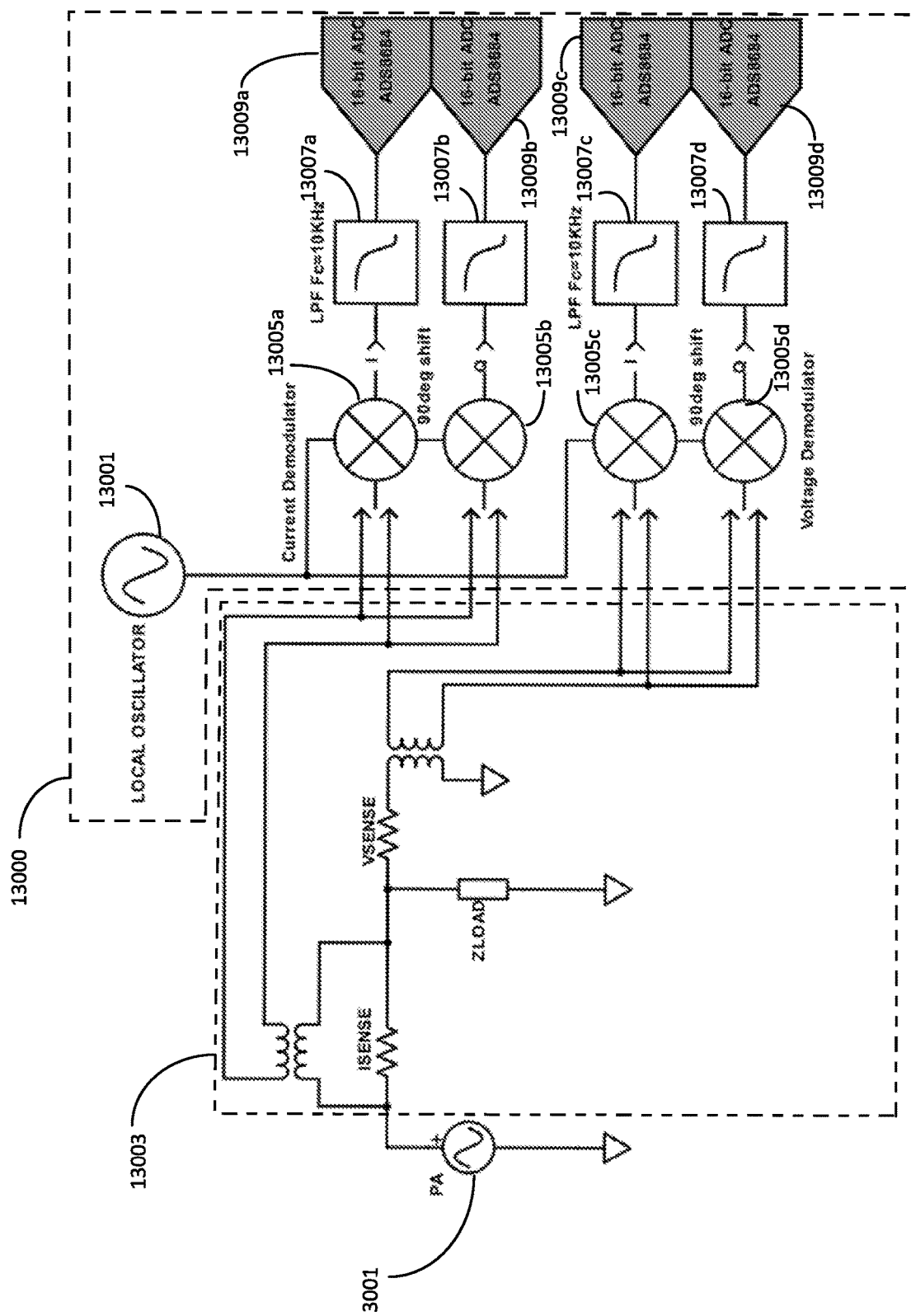
FIG. 13 shows an implementation of a power measurement circuit configured to measure the RF signal output from an implementation of a power amplifier according to various embodiments of the present invention.

FIG. 13 shows an implementation of power measurement system 3007. As shown in FIG. 13, portion of the output from the power amplifier 3001 are measured by resistive current sense and voltage sense components arranged in a differential measurement scheme shown in block 13003. The output from the resistive current sense and voltage sense components in block 13003 is input to a heterodyne IQ demodulator 13000. The heterodyne IQ demodulator 13000 comprises a local oscillator (LO) clock 13001; current demodulator elements 13005a and 13005b; voltage demodulator elements 13005c and 13005d; filtering elements 13007a, 13007b, 13007c, and 13007d; and analog to digital converters (ADCs) 13009a, 13009b, 13009c, and 13009d. The heterodyne IQ demodulator 13000 is configured to operate at arbitrary frequencies.

The heterodyne IQ demodulator 13000 can provide magnitude and phase measurements of the RF signal output from the power amplifier 3001. The heterodyne IQ demodulator 13000 can be configured to make measurements at baseband where the measurements may be immune to interferences. The heterodyne IQ demodulator 13000 can comprise high bit-depth and slow-sampling rate ADCs which can potentially lower cost, increase accuracy and permit multiplexing of different RF channels. The low-pass filters of the IQ demodulator 13000 can allow narrow-band filtering that can be independent of the frequency of the RF signal which can span a wide frequency range.

Figure 14:
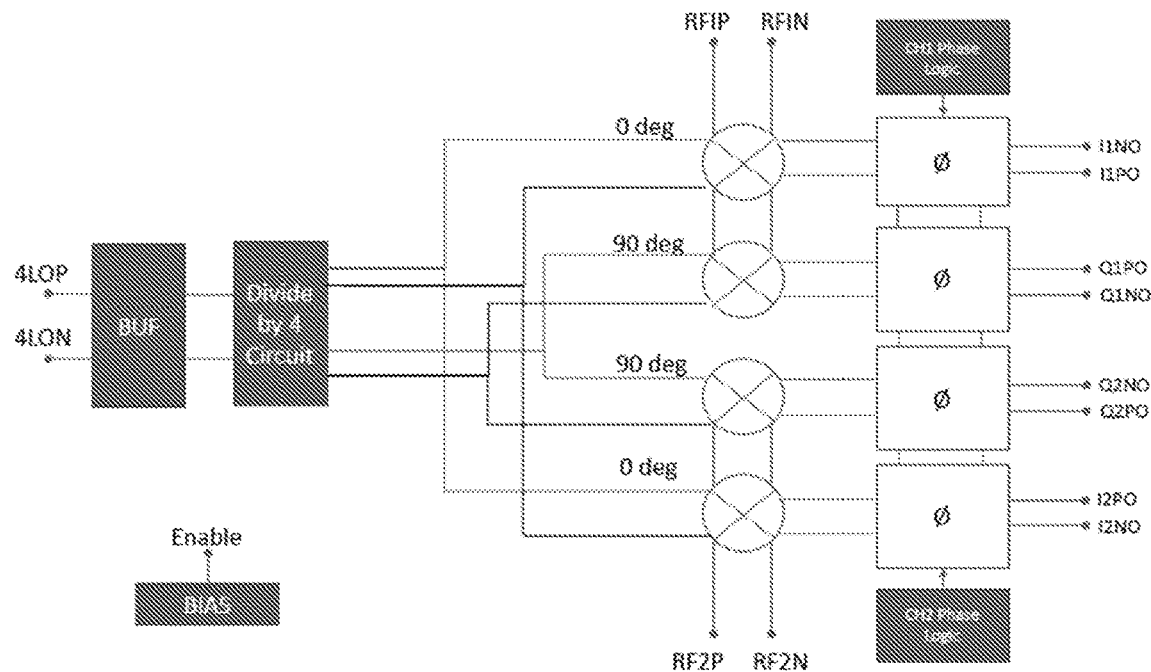
FIG. 14 shows a block diagram of an IQ demodulator according to various embodiments of the present invention.

FIG. 14 shows a block diagram of the AD8333 IQ demodulator from ANALOG DEVICES. The IQ demodulator 13000 is configured to mix the sampled current and voltage waveforms down to baseband so that they can be digitized with a high-resolution analog-to-digital converter (e.g., ADCs 13009a-13009d). The IQ demodulator can be configured to demodulate the input signal in a phase-sensitive manner so that the phase of the RF signal relative to a reference clock can be faithfully reproduced as the phase of an analytic signal whose real and imaginary components are the two outputs of the IQ demodulator in the narrowband limit.

The IQ demodulator 13000 is a two-channel device that accepts two input RF signals and an input from the local oscillator (LO) clock 13001. For demodulation to baseband, the LO 13001 is at a frequency four (4) times that of the RF signals. For example, if the power amplifier 3001 is running at a frequency $f_0$ having a value between 1.0 MHz and 12.0 MHz, then the frequency of the LO 13001 is at $4f_0$.

The IQ demodulator 13000 uses the input from the LO clock 13001 to generate two internal LO clocks running at $f_0$. The first internal clock can be referred to as the I clock and the second internal clock can be referred to as the Q clock. In one implementation, the two internal LO clocks can be obtained by digitizing the LO clock and using it to run two divide-by-four logic circuits each of which triggers on every fourth rising edge of the input LO clock, but with the Q clock delayed by one cycle of the input LO clock relative to the I clock.

Figure 15:
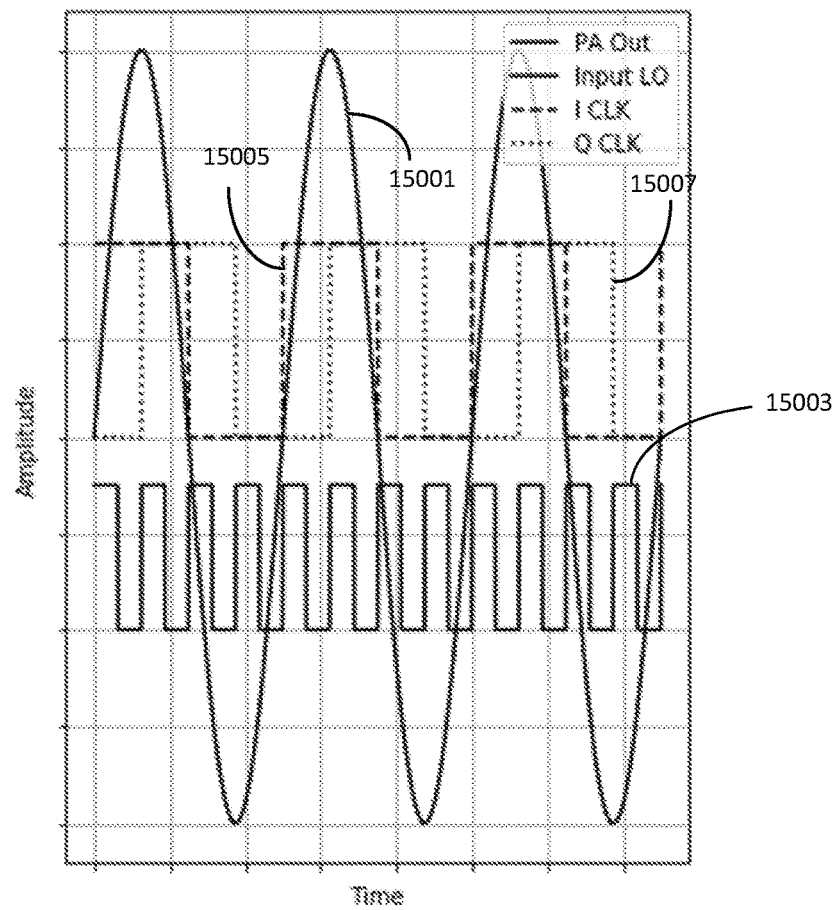
FIG. 15 shows two internal clocks generated by an embodiment of an IQ demodulator.

FIG. 15 shows the two internal clocks generated by an implementation of the demodulator 13000. In FIG. 15, waveform 15001 shows the signal output from the power amplifier 3001, waveform 15003 shows the output of the LO clock 13001, waveform 15005 shows the I clock and waveform 15007 shows the Q clock. The I clock and the Q clocks can be used to demodulate and reconstruct the signal output from the power amplifier 13000 as discussed below.

Figure 16:
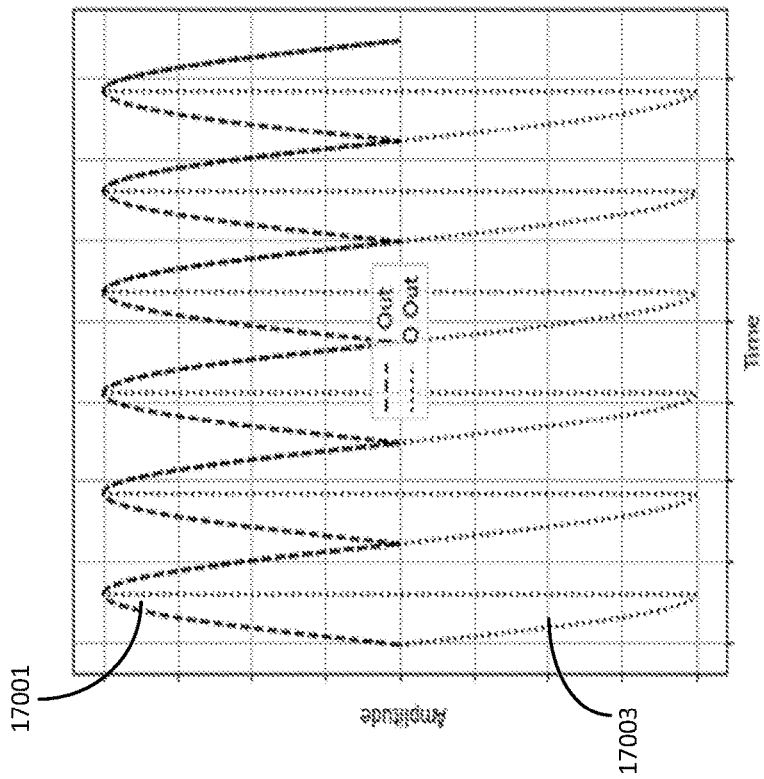
FIG. 16 illustrates a circuit operation of multiplying a RF signal by a square wave having a maximum value of 1 and a minimum value of −1 according to various embodiments of the present invention.
Figure 16:
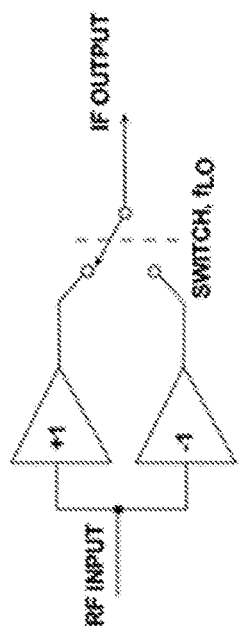

The demodulator works by having the I and Q clocks control whether the power amplifier 3001 amplifying the RF signal is inverting or not. This operation is equivalent to multiplying the RF signal output from the power amplifier 3001 by a square wave having a maximum value of 1 and a minimum value of −1 as shown in FIG. 16.

Figure 17:
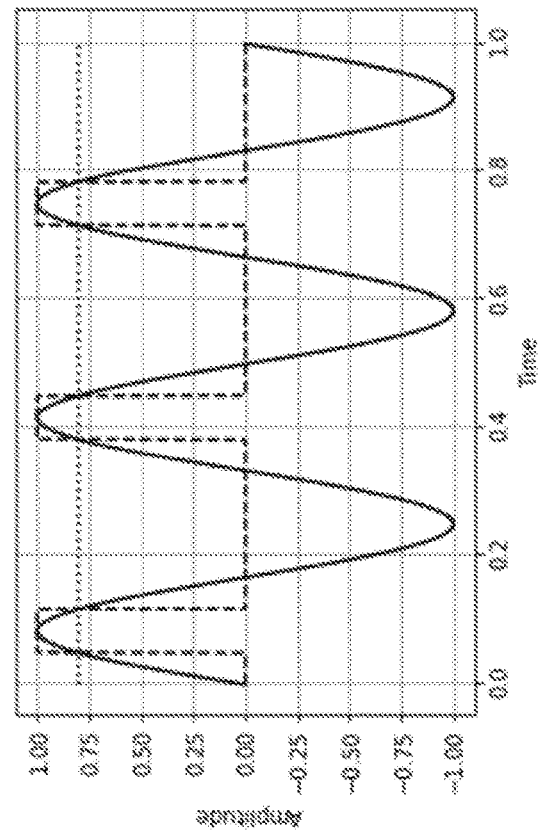
FIG. 17 shows the I and Q demodulation of a sinusoidal signal according to various embodiments of the present invention.

This operation produces two output signals, one for the I clock and another for the Q clock. For a sinusoidal signal that is in phase with the I clock, mixing with the I clock produces a signal with a positive mean value. Mixing with the Q clock, on the other hand produces a signal with a mean value of zero. FIG. 17 shows the I and Q demodulation of a sinusoidal signal. In FIG. 17, signal 17001 is the output of a sinusoidal signal mixed with the I clock and 17003 is the output of a sinusoidal signal mixed with the Q clock.

The mean values of the mixed signals are just their baseband values and can be extracted by low pass filtering. For the case of a narrowband signal like a sine wave, the I and Q output are the real and imaginary parts of an analytic signal whose phase $\phi = \arctan Q/I$ is the phase difference between the RF input signal and the local oscillator and its magnitude $\sqrt{I^2+Q^2}$ is proportional to the amplitude of the RF signal.

The IQ demodulator employs a phase-shifting harmonic cancellation scheme that allows the measurement of magnitude and phase of the fundamental frequency component in the presence of higher order harmonics. In the phase-shifting harmonic cancellation scheme, the heterodyne LO clock 13001 is discretely phase-shifted relative to the RF signal output from the power amplifier 3001 to produce a set of LO phase-dependent IQ samples. Samples are reconstructed into fundamental and harmonic power using linear inversion. This is described in greater detail below.

Figure 18A:
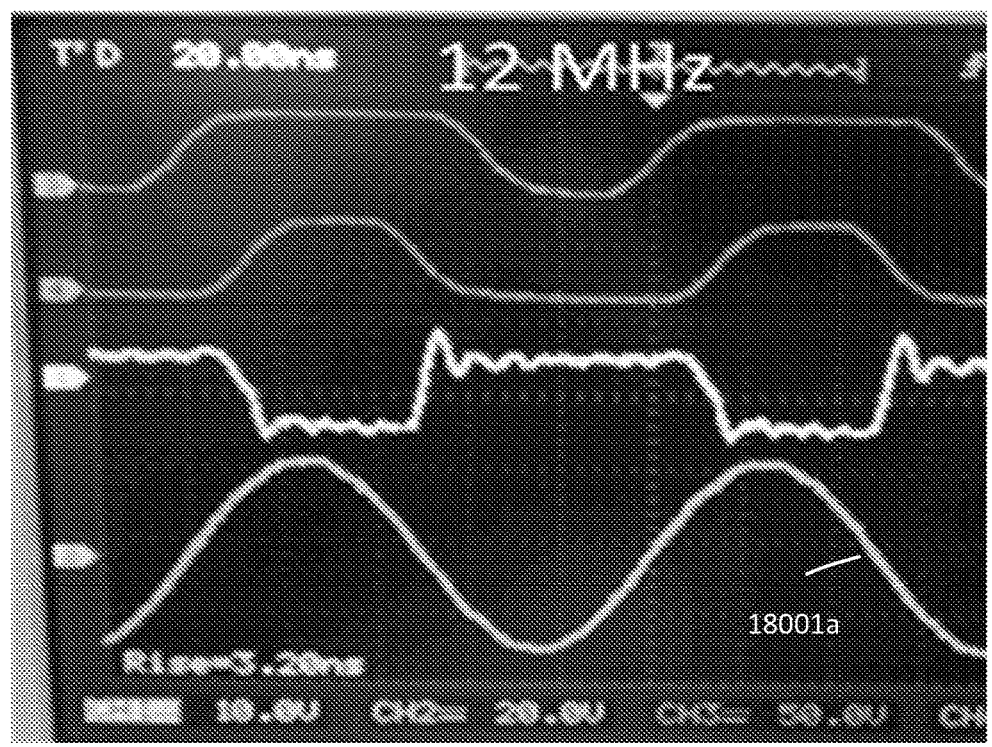
FIG. 18A shows the scope trace of the output from an implementation of a power amplifier into a 50 ohm load operating at an operating frequency of about 12.0 MHz.
Figure 18B:
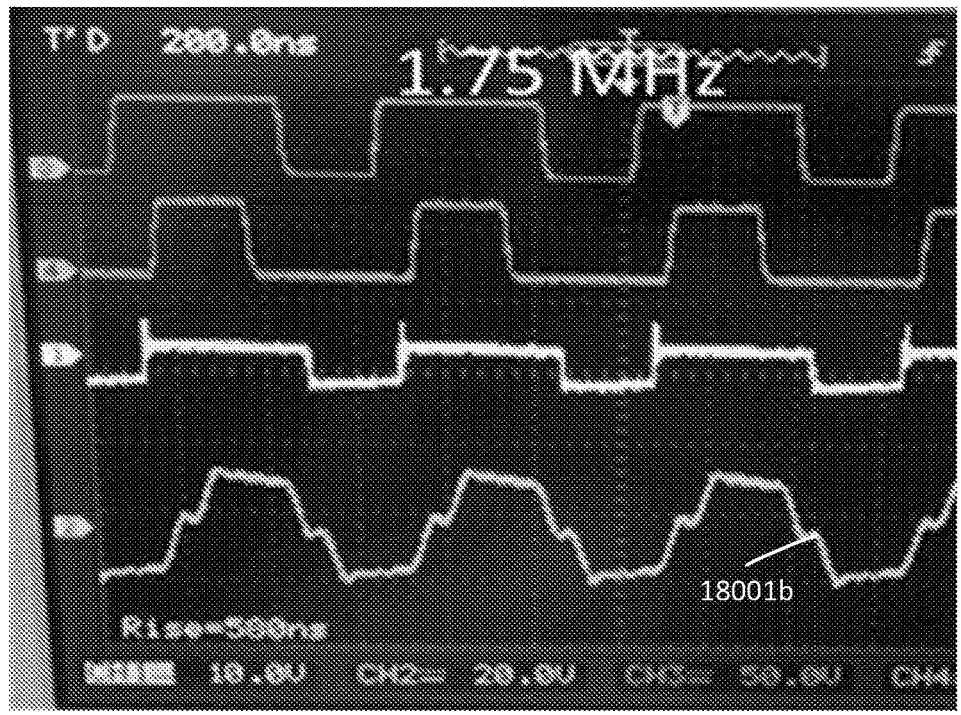
FIG. 18B shows the scope trace of the output from the implementation of the power amplifier into a 50 ohm load operating at an operating frequency of about 1.75 MHz according to various embodiments of the present invention. In various embodiments, on board calibration allows the system to modify drive circuit based on operating conditions (temperature) or aging of the device without requiring a factory calibration.
Figure 19A:
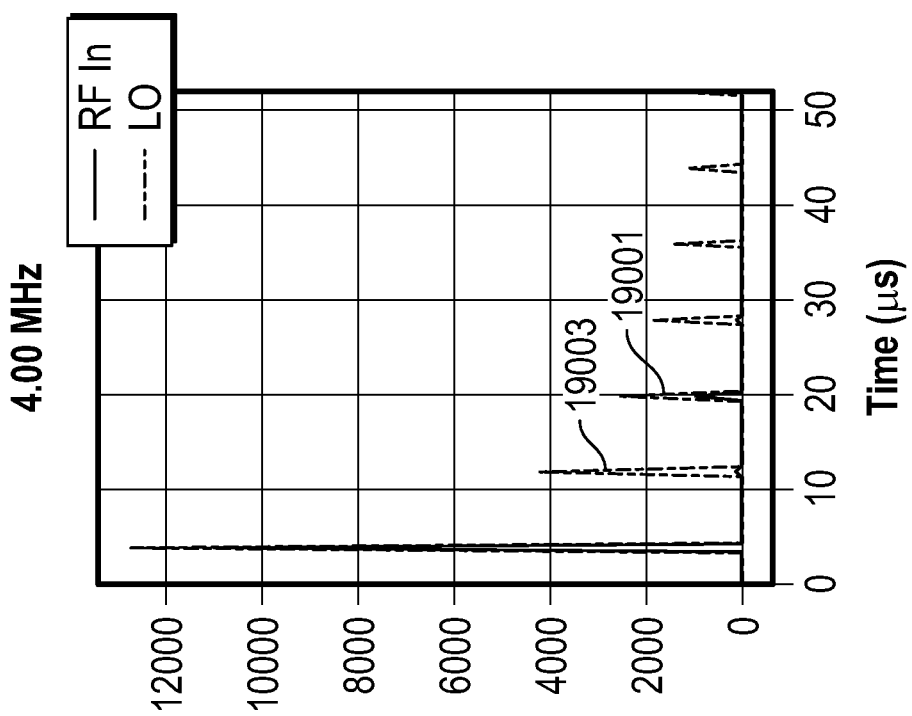
FIGS. 19A and 19B shows the magnitude of the fast Fourier transform (FFT) of a RF signal at the low-frequency end of the passband (normalized to a fundamental frequency of 1) and the magnitude of the fast Fourier transform (FFT) of a square wave according to various embodiments of the present invention.
Figure 19A:
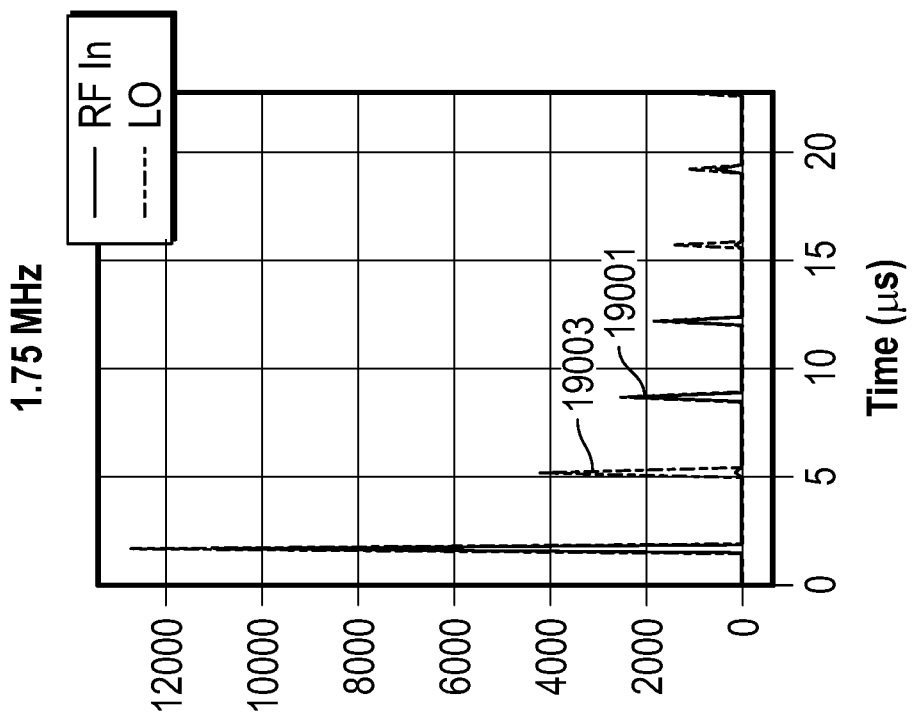
Figure 19B:
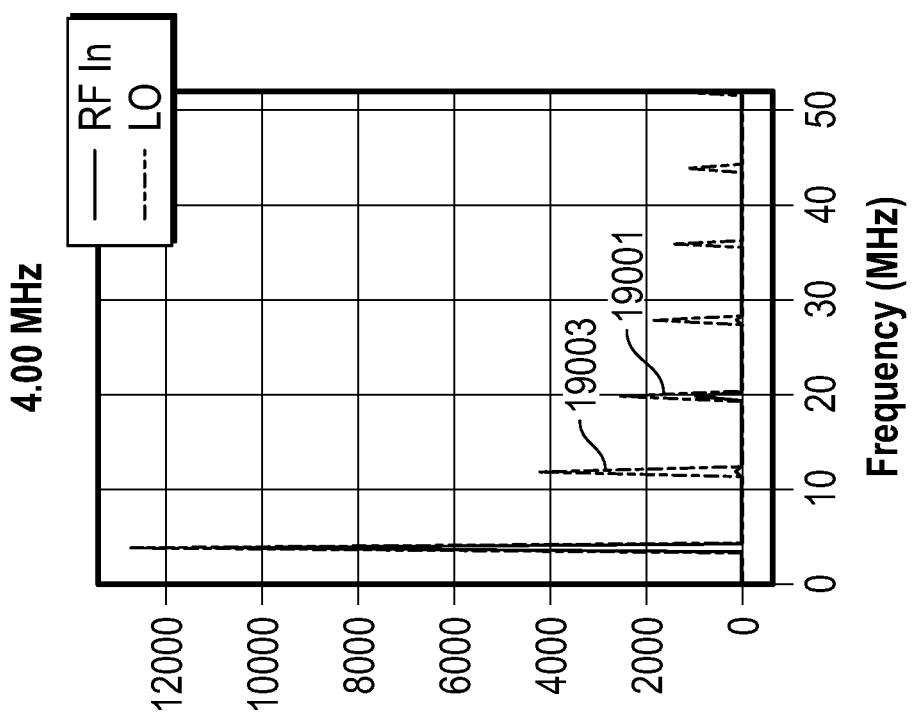
Figure 19B:
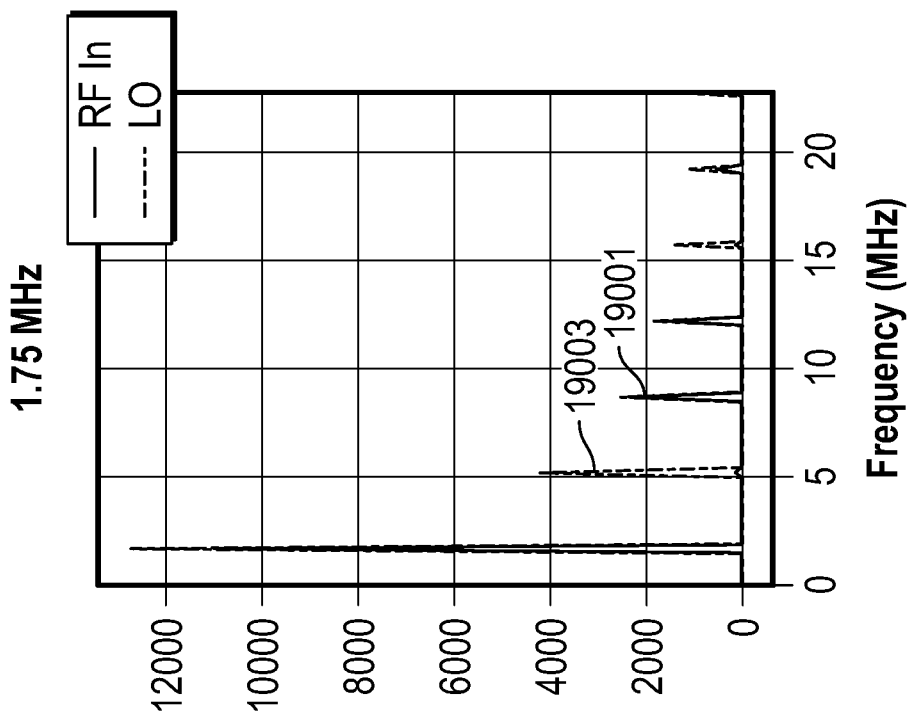

As discussed above, the power amplifier 3001 is configured to operate in a wide frequency range spanning at least two (2) octaves. For example, as discussed above, the power amplifier 3001 is configured to operate in a wide frequency range from about 1.0 MHz to about 12.0 MHz. To allow wideband operation of the power amplifier 3001, the low-pass filter may have a cut-off frequency greater than or equal to about 16 MHz. Accordingly, higher order harmonics of lower operating frequencies (e.g., operating frequencies between about 1.0 MHz and about 6 MHz) will be in the pass band of the low-pass filter and thus cannot be filtered out without affecting the frequency bandwidth of the power amplifier 3001. As an example of this, FIG. 18A shows the oscilloscope trace of the output from the power amplifier 3001 into a 10-100 ohm (e.g., 25 ohm, 50 ohm, 75 ohm) load operating at an operating frequency of about 1.0 MHz and FIG. 18B shows the scope trace of the output from the power amplifier 3001 into a 50 ohm load operating at an operating frequency of about 12.0 MHz. Traces 18001a and 18001b shows the output waveform at the two operating frequencies respectively. At 12.0 MHz all the higher order harmonics above the cutoff frequency (e.g., 16 MHz) of the low pass filter and so the output waveform is a clean sinusoid. However, at 1.0 MHz some of the harmonics are in the passband and so the waveform is non-sinusoidal. The presence of higher order harmonics can affect the accuracy with which the amplitude and the phase of the output RF signal is measured as discussed in detail below.

Because of the presence of the harmonics the output from the power amplifier 3001 cannot be considered narrowband. Instead, the output from the power amplifier 3001 is composed of a sum of several narrowband signals with frequencies centered at the harmonics $n \times \omega_0$ where n is an integer and $\omega_0$ is the fundamental frequency.

Accordingly, the RF signal at the output of the power amplifier 3001 can be described as a Fourier decomposition as given by equation (1) below:

$$s(t) = \sum_{i=n, i\ odd}^{N} A_n \cos nw_0 t + B_n \sin nw_0 t \quad (1)$$

where An and Bn are the in-phase and in-quadrature components of each of the harmonics of the signal.

As will be discussed in detail below, the power assurance circuit which is configured to measure the amplitude and the phase of the RF signal output from the power amplifier comprises an IQ demodulator. Without relying on any particular theory, the action of the IQ demodulator can be thought of as multiplication of the RF output from the power amplifier 3001 by a square wave followed by low pass filtering. A square wave comprises a signal component at a fundamental frequency and signal components at harmonics of the fundamental frequency and can be described as a Fourier decomposition given by equation (2) below:

$$i(t) = \sum_{n=1, n \in odd}^{N} \frac{1}{n} \cos n w_0 t \quad (2)$$

Whenever both the RF output from the power amplifier 3001 and the square wave signal have a harmonic component, the multiplication will mix the harmonic component to the baseband i.e. the difference frequency will be 0 Hz. FIG. 19 shows the magnitude of the fast Fourier transform (FFT) of a RF signal at the low-frequency end of the passband (normalized to a fundamental frequency of 1 MHz) and the magnitude of the fast Fourier transform (FFT) of a square wave. In FIG. 19, waveform 19001 shows the FFT of a RF signal and waveform 19003 shows the FFT of a square wave. It is noted from FIG. 19 that the fundamental, fifth and seventh harmonics of the RF signal are present. The square wave has significant components at all odd-order harmonics. The harmonics at which both the square wave and the RF signal have non-zero magnitude of the FFT will contribute to the measured baseband signal.

The IQ demodulator of the power assurance circuit can be considered to have I and Q local oscillators. The output from the I and Q local oscillators can be considered as square waves. Accordingly, the output from the I and Q local oscillators can be Fourier decomposed as presented in equations (3a) and (3b).

$$i(t) = \sum_{n=1, n \in odd}^{N} \frac{1}{n} \cos nw_0 t \quad (3a)$$

$$q(t) = \sum_{n=1, n \in odd}^{N} \frac{1}{n} \sin nw_0 t (-1)^{\frac{n-1}{2}} \quad (3b)$$

where the equation for q(t) is obtained by shifting i(t) by a quarter cycle, i.e. by replacing t with $$t - \frac{1}{4 f_0}$$

in equation (3a).

After mixing and low-pass filtering, harmonics in both the I and Q local oscillators and the RF signal will contribute to the I and Q baseband signals as presented in equations (4a)-(4d).

$$I_1 = \frac{1}{T} \int_0^T \left[ A_1 \cos w_0 t \cos w_0 t + \frac{1}{3} A_3 \cos 2w_0 t \cos 3w_0 t + \ldots \right] \quad (4a)$$

$$Q_1 = \frac{1}{T} \int_0^T \left[ B_1 \sin w_0 t \sin w_0 t + \frac{1}{3} B_3 \sin 2w_0 t \sin 3w_0 t + \ldots \right] \quad (4a)$$

$$I_1 = A_1 + \frac{1}{3} A_3 + \frac{1}{5} A_5 + \ldots \quad (4c)$$

$$Q_1 = B_1 - \frac{1}{3} B_3 + \frac{1}{5} B_5 + \ldots \quad (4d)$$

Accordingly, the baseband signals depend not only on the Fourier amplitudes at the fundamental frequency but also on all the non-zero odd-order harmonics in the RF signal.

Because of this, when harmonics are present, the measured I and Q values may not return the correct phase value or amplitudes. Moreover, because of the harmonics, the measured signal amplitude may be dependent on the phase between the I and Q local oscillators and the RF signal. This can introduce a systematic error that may change as beamforming delays are changed. The beamforming delays can comprise phase delays that are introduced between the different channels in order to obtain a desired focusing effect from a multi-element transducer. For example, the error associated with this effect can be as high as 6% in amplitude for voltage and current and +/−3 degrees for phase. This may result in significant inaccuracy in the measured voltage and/or phase.

For example, one method of reducing inaccuracies in the measured voltage and/or phase of the output RF signal from the power amplifier 3001 includes correcting the amplitudes and phases of the portion of the RF signal output from the power amplifier 3001 received at the power assurance circuit 3007 to remove the effect of the harmonics. The amplitudes and phases of the portion of the RF signal output from the power amplifier 3001 received at the power assurance circuit 3007 are corrected by acquiring I and Q data at multiple phase shifts of the I and Q clocks relative to the portion of the RF signal output from the power amplifier 3001 received at the power assurance circuit 3007. Collection of I and Q data measured at N different phase offsets is sufficient to disentangle the contributions of the first N harmonics, but more measurements may be useful in obtaining better estimates of the harmonics in the presence of noise. In many embodiments, the effect of the harmonics can be reduced to a level below the system noise floor if six (6) different phase offsets are measured.

Accordingly, one method of reducing the effect of harmonic includes measuring I and Q data for internal I and Q clock phases at 0°, 15°, 30°, 45°, 60° and 75° relative to the portion of the RF signal output from the power amplifier 3001 received at the power assurance circuit 3007. In some embodiments, the input local oscillator (LO) clock included in the power assurance circuit 3007 can have a frequency about four (4) times higher than the internal clocks. Accordingly, the phases for the input LO clock can be four times larger, than the I and Q clock phases. For example, the phases for the input LO clock can be 0°, 60°, 120°, 180°, 240° and 300° relative to the portion of the RF signal output from the power amplifier 3001 received at the power assurance circuit 3007 when the I and Q clock phases are 0°, 15°, 30°, 45°, 60° and 75° relative to the portion of the RF signal output from the power amplifier 3001 received at the power assurance circuit 3007.

Figure 20:
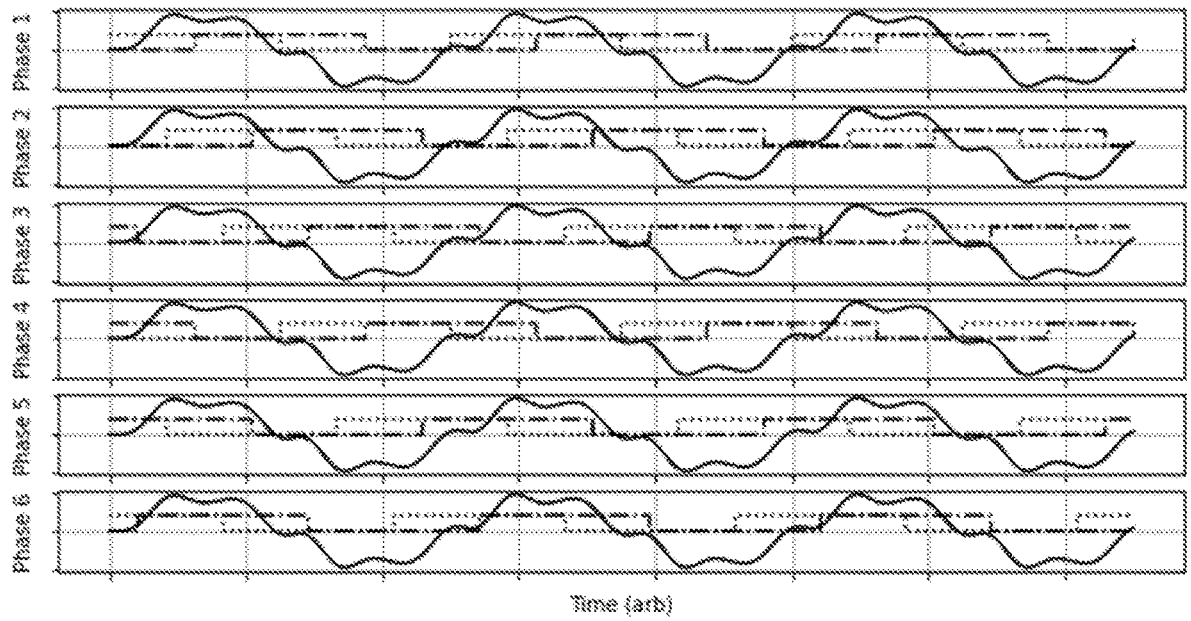
FIG. 20 illustrates a harmonic cancellation scheme using phase-shifted clocks according to various embodiments of the present invention.
Figure 21:
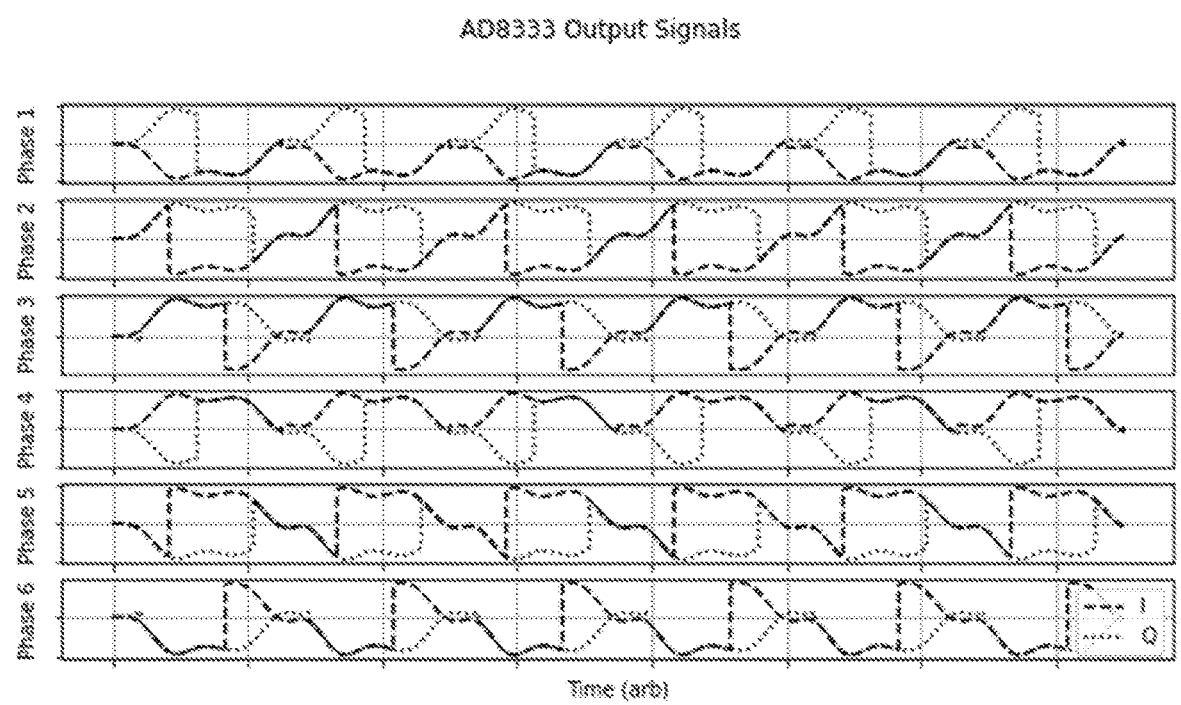
FIG. 21 shows the output signals from an implementation of a demodulator according to various embodiments of the present invention.

FIG. 20 illustrates the six (6) phase shifted sets of I and Q clocks that are used to demodulate a non-sinusoidal drive signal in accordance with the method discussed above. After mixing the demodulator outputs twelve (12) signals that can be used to reconstruct the RF signal output from the power amplifier 3001 as shown in FIG. 21.

The relationship between the measured I and Q values at these different phases and the correct Fourier amplitudes of the signal at each harmonic is linear and so the Fourier amplitudes of the RF input signal can be obtained from the measured I and Q samples at the six phases through a matrix multiplication.

Since I and Q are quadrature components, if the I samples are taken at a set of 6 phases equally distributed in a range between 0° and 75° in 15° steps (e.g., 0°, 15°, 30°, 45°, 60°, 75°), then the Q samples will be phase shifted from the I samples by 90°. For example, the Q samples will be at 90°, 105°, 120°, 135°, 150°, 165°.

Taking advantage of the signal's inversion symmetry, the signal output from the power amplifier 3001 can be described by equation (5) below.

$$s(t) = -s\left(t - \frac{T_0}{2}\right) \tag{5}$$

where, $T_0 = 1/f_0$ is the period. A full period of a signal can be expressed in terms of the I and Q phase shifted signals as:

$$\{I_0, I_{15}, \ldots, I_{75}, Q_0, Q_{15}, \ldots Q_{75}, -I_0, -I_{15}, \ldots, -I_{75}, -Q_0, -Q_{15}, \ldots -Q_{75}\}$$

where, $I_n$ is the I sample at a phase shift of n° and $Q_n$ is the Q sample at a phase shift of n°. It is noted that due to inversion symmetry $Q_{180}$ is equivalent to $Q_0$.

Accordingly, the six (6) phases spanning a range from 0° to 180° are adequate for reconstruction of the RF signal output from the power amplifier 3001.

In accordance with inversion symmetry only the odd Fourier components will be non-zero. Thus, the first, third, fifth, seventh, ninth and eleventh harmonics will be non-zero. Thus, to reconstruct the RF signal output from the power amplifier 3001, the discrete Fourier transform (DFT) coefficients for the non-zero odd harmonics are calculated. In one method of reconstructing the RF signal output from the power amplifier 3001, a matrix F that maps the twelve (12) measured I and Q sample values to the real and imaginary parts of the DFT of the RF signal output from the power amplifier 3001 is determined using the equation (6) presented below.

$$\begin{pmatrix} \text{Re } A_1 \\ \text{Re } A_3 \\ \vdots \\ \text{Re } A_{11} \\ \text{Im } A_1 \\ \text{Im } A_3 \\ \vdots \\ \text{Im } A_{11} \end{pmatrix} = \overline{F} \begin{pmatrix} I_{0°} \\ \vdots \\ I_{75°} \\ Q_{0°} \\ \vdots \\ Q_{75°} \end{pmatrix} \tag{6}$$

In equation (6), where $A_n$ is the complex Fourier coefficient of the $n^{th}$ harmonic.

The elements of the matrix F can be obtained by application of equations (3a) and (3b) for each phase value. Thus the elements of the matrix F can be obtained from equations (7a) and (7b) below:

$$F_{k,m} = m \times (-1)^{\frac{m-1}{2}} \cos\frac{\pi}{12} m\, k \tag{7a}$$

$$F_{k+12,m} = -m \times (-1)^{\frac{m-1}{2}} \sin\frac{\pi}{12} m\, k \tag{7b}$$

where the index k has values 1, 3, 5, 7, 9 and 11, and wherein m is a phase index having values 0, 1, 2, 3, 4, 5, 6, 7, 8, 9, 10 and 11. Thus, full matrix equation (6) can be rewritten as presented in equation (8) below:

$$\begin{pmatrix} \text{Re } A_1 \\ \text{Re } A_3 \\ \vdots \\ \text{Re } A_{11} \\ \text{Im } A_1 \\ \text{Im } A_3 \\ \vdots \\ \text{Im } A_{11} \end{pmatrix} = \qquad (8)$$

$$\frac{1}{6}\begin{pmatrix} \cos\frac{\pi}{12}1\times 0 & \cos\frac{\pi}{12}1\times 1 & \cdots & \cos\frac{\pi}{12}1\times 11 \\ -3\cos\frac{\pi}{12}3\times 0 & -3\cos\frac{\pi}{12}3\times 1 & \cdots & -3\cos\frac{\pi}{12}3\times 11 \\ \vdots & \vdots & \vdots & \vdots \\ -11\cos\frac{\pi}{12}11\times 0 & -11\cos\frac{\pi}{12}11\times 1 & \cdots & -11\cos\frac{\pi}{12}11\times 11 \\ -\sin\frac{\pi}{12}1\times 0 & -\sin\frac{\pi}{12}1\times 1 & \cdots & -\sin\frac{\pi}{12}1\times 11 \\ 3\sin\frac{\pi}{12}3\times 0 & 3\sin\frac{\pi}{12}3\times 1 & \cdots & 3\sin\frac{\pi}{12}3\times 11 \\ \vdots & \vdots & \vdots & \vdots \\ 11\sin\frac{\pi}{12}11\times 0 & 11\sin\frac{\pi}{12}11\times 1 & \cdots & 11\sin\frac{\pi}{12}11\times 11 \end{pmatrix}$$

$$\begin{pmatrix} I_{0°} \\ \vdots \\ I_{75°} \\ Q_{0°} \\ \vdots \\ Q_{75°} \end{pmatrix}$$

In many embodiments, the matrix $\overline{F}$ can be pre-computed and hard-coded into the Board Module Controller (BMC) 3019 since it depends only on the selected phases and harmonic orders.

Once the Fourier components $A_n$ are obtained, they can be used to reconstruct the waveform according to the equation (9) below:

$$y(t) = \text{Re}\{\Sigma_{n=1,3,5,\ldots}{}^N A_n e^{2\pi j n f_0 t}\} \qquad (9)$$

Figure 22A:
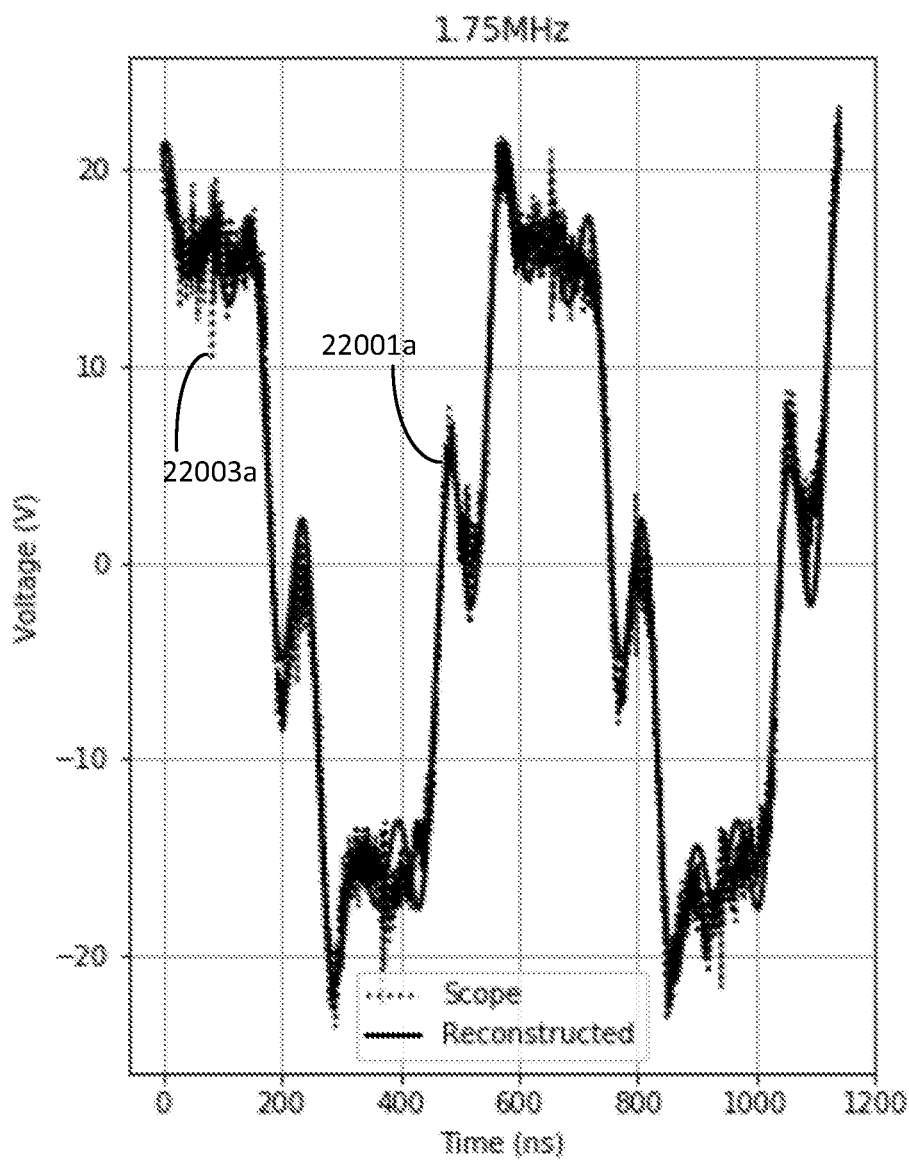
FIGS. 22A-22C show examples of reconstructing the RF signal at three different frequencies output from the power amplifier according to various embodiments of the present invention.
Figure 22B:
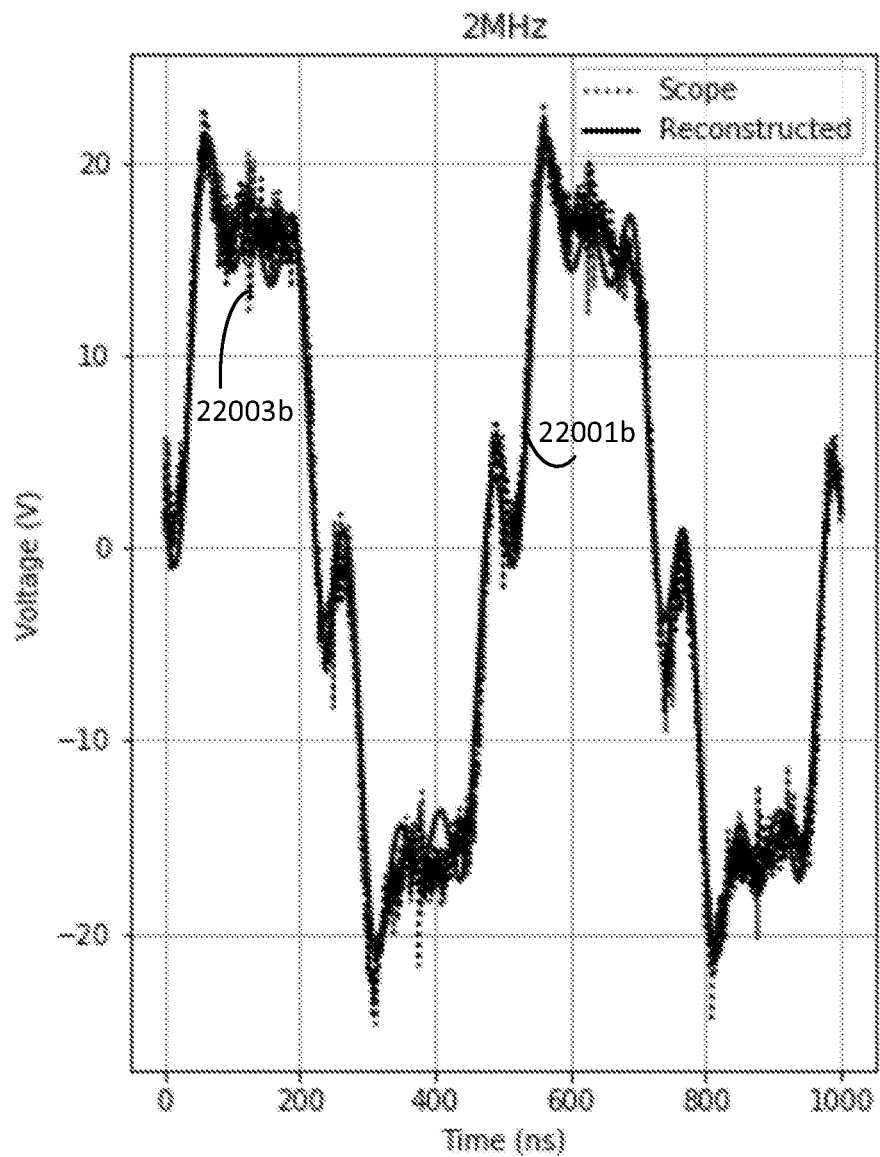
Figure 22C:
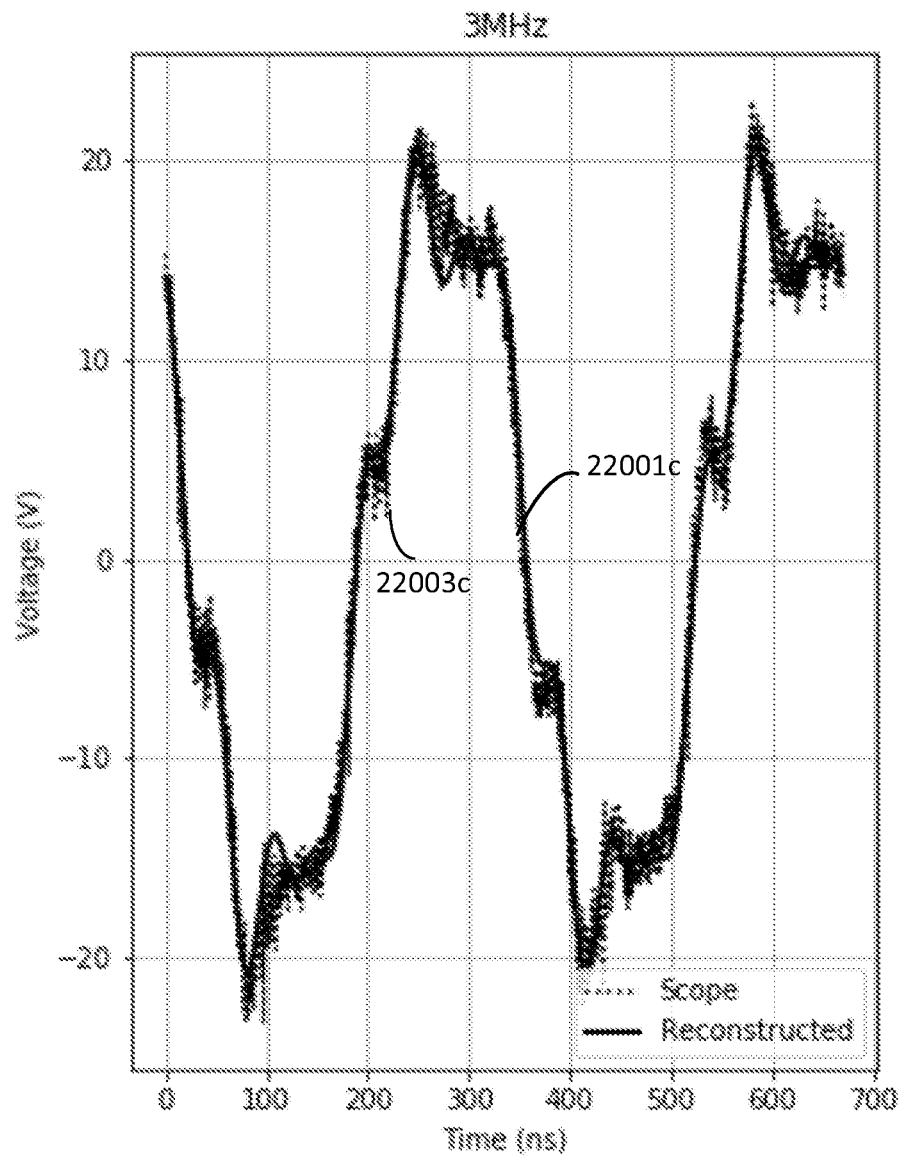

FIGS. 22A-22C show examples of reconstructing the RF signal at three different frequencies output from the power amplifier 3001 by the power assurance circuit by reducing the contribution from the higher order harmonics described herein. FIG. 22A shows the reconstruction of RF signal at a frequency of 1.0 MHz. FIG. 22B shows the reconstruction of RF signal at a frequency of 2.0 MHz. FIG. 22C shows the reconstruction of RF signal at a frequency of 3.0 MHz. With reference to FIG. 22A, waveform 22001a is the reconstructed waveform using equation (9) and waveform 22003a is the output of a differential oscilloscope probe that measured the signal input to the demodulator. With reference to FIG. 22B, waveform 22001b is the reconstructed waveform using equation (9) and waveform 22003b is the output of a differential oscilloscope probe that measured the signal input to the demodulator. With reference to FIG. 22C, waveform 22001c is the reconstructed waveform using equation (9) and waveform 22003c is the output of a differential oscilloscope probe that measured the signal input to the demodulator. It is noted from FIGS. 22A-22C that the reconstructed waveforms closely match the measured waveforms.

The above described embodiments of methods of multiple phase shifting employed by the power assurance circuit to reconstruct the RF signal output from the power amplifier 3001 can reduce the requirement on the frequency of operation of the LO clock requirement. In conventional methods, the operating frequency of the LO clock using the traditional method is to operate at a frequency corresponding to second, third, fourth, fifth, sixth or other higher harmonic frequencies. In such conventional methods, the clock frequency for the demodulator is then set to be about four (4) times the harmonic frequency at which the LO clock is operating. This setting can increase circuit complexity, noise and/or costs. The multiple phase shift method described herein can be applied to the higher order harmonic frequencies without increasing the operating frequency of the LO clock frequency and/or making any other changes to the electronic hardware.

Correction of Errors in Measurements Obtained by Power Measurement System

Figures 23A, 23B:
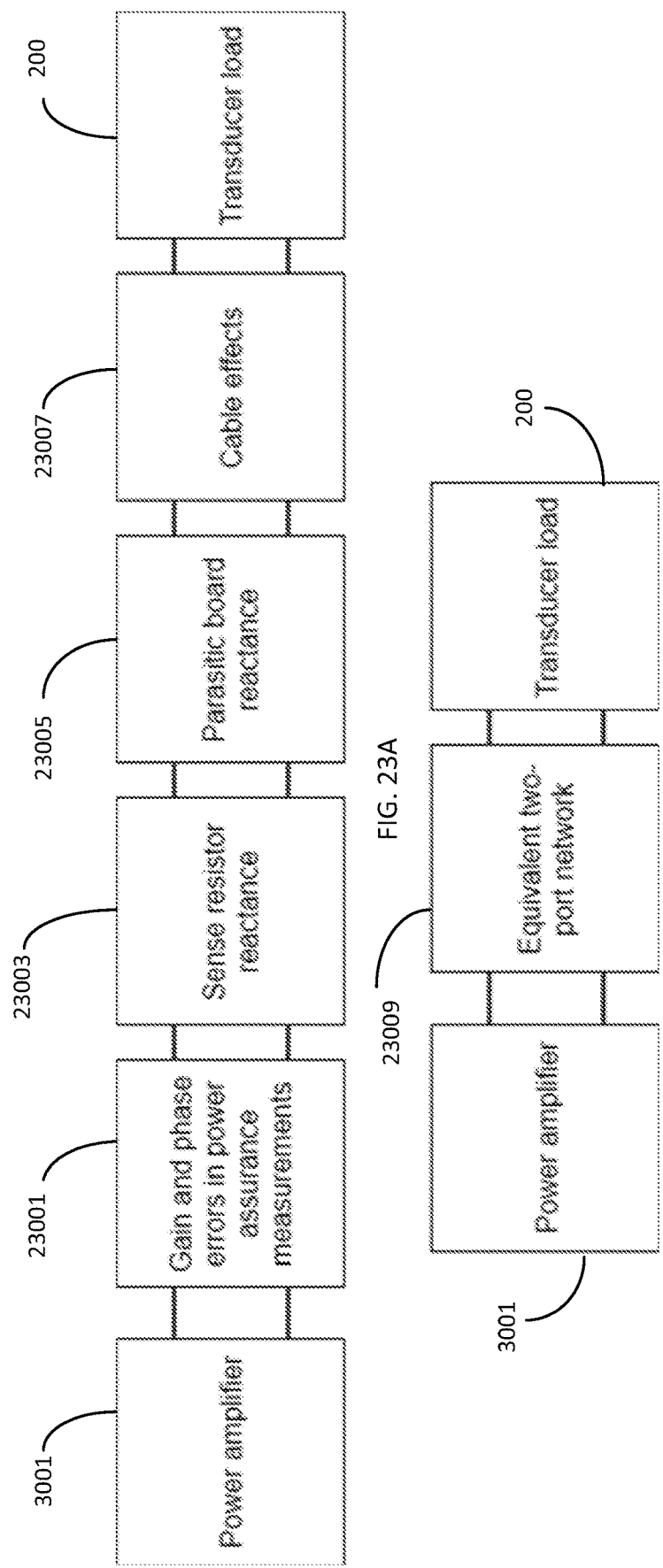
FIG. 23A schematically illustrates various mechanisms that effect RF signal propagation (e.g., RF signal loss that can reduce power of a RF signal output, phase change, etc.) from an implementation of a power amplifier delivered to an ultrasound transducer.
FIG. 23B shows an equivalent two-port network that takes into account the various mechanisms of RF signal propagation (e.g., loss, phase change, etc.) according to various embodiments of the present invention.

In various embodiments, the RF power that is delivered to an ultrasound transducer 200 can be different from the RF power that is output from the power amplifier 3001 as measured by the power measurement system 3007. The difference in the RF power delivered to the ultrasound transducer 200 and the RF output power measured by the power measurement system 3007 can be attributed to one or more of (i) errors due to parasitic reactances on the circuit board of the RFTH module; (ii) errors due to parasitic reactances in the current and voltage sense resistors used in the power measurement system 3007; (iii) deviations from nominal gain in the IQ demodulator of the power measurement system 3007 and/or the power amplifier 3001; (iv) insertion loss in the transformers used in the power measurement system 3007; (v) undesirable impedance-transformation effects in the cables connecting the RFTH module and the ultrasound transducer; and/or (vi) phase errors between the voltage and current measurement in the IQ demodulator. FIG. 23A illustrates the different sources of errors that can cause a difference between the RF power delivered to the ultrasound transducer 200 and the RF output power measured by the power measurement system 3007. In FIG. 23A, deviations from the nominal gain in IQ demodulator and amplifier are shown in block 23001, errors due to the parasitic reactances in current sense resistor and voltage sense components and the PCB are shown in blocks 23003 and 23005 and the errors due to undesirable cable effects are shown in block 23007. The different sources of errors can be modeled by an equivalent two-port network 23009 disposed between the power amplifier 3001 and the ultrasound transducer 200 as shown in FIG. 23B.

Figure 24:
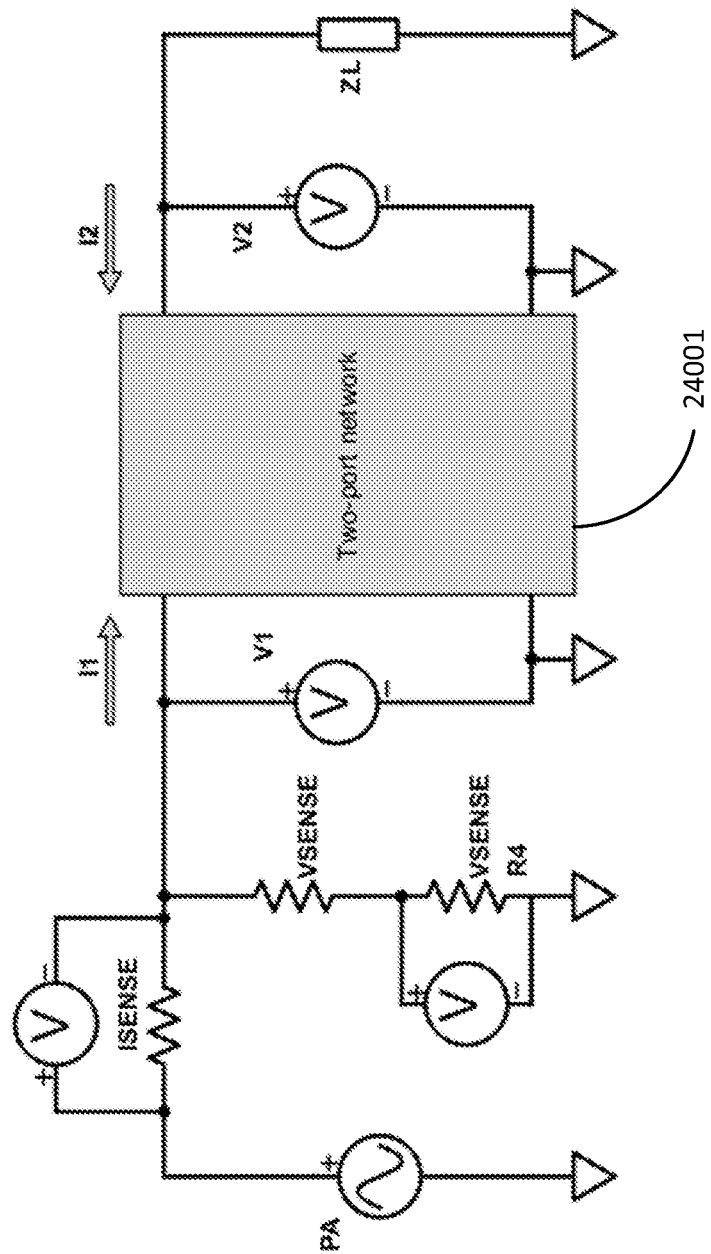
FIG. 24 shows an implementation of power measurement system comprising the equivalent two-port network that takes into account the various mechanisms of RF signal propagation (e.g., loss, phase change, etc.) according to various embodiments of the present invention. In one embodiment, a 2-port network is not necessarily 'loss', some components could just introduce a phase change, for example.

To reduce the difference between the RF power delivered to the ultrasound transducer 200 and the RF output power measured by the power measurement system 3007, the power measurement system 3007 can include a self-calibrating two-port network compensation module 24001 as shown in FIG. 24 which captures the different sources of error discussed above which leads to a difference between the RF power delivered to the ultrasound transducer 200 and the RF output power measured by the power measurement system 3007.

To correct for the various errors, the two-port network parameters of the two-port network compensation module 24001 are obtained using the following approach. A RF signal is delivered to a set of N known load impedances $Z_{L,N}$ in an impedance range having a magnitude $|Z|$ between 20Ω and 200Ω and a phase $\angle Z$ between −60° and 60°. The N known load impedances are attached to Port 2 of a two-port network and the power measurement system 3007 is attached to Port 1 of the two-port network. The voltage $V_{2,N}$ across each load $Z_{L,N}$ at Port 2 is measured (e.g., using an oscilloscope) while simultaneously measuring voltage $V_{1,N}$ and current $I_{1,N}$ with the power measurement system 3007 at Port 1. A least-squares fit is performed to obtain the two-port network parameters from the values of voltage $V_{1,N}$ and current $I_{1,N}$ measured by the power measurement system at Port 1 and the voltage $V_{2,N}$ across each load $Z_{L,N}$ and the corresponding current $I_{2,N}$ given by a ratio of $V_{2,N}$ and $Z_{L,N}$ for each of the N known loads. A series of mathematical operations are carried out to determine a set of estimated complex valued two-port network parameters that minimizes the discrepancy between the measurements obtained by the power measurement system 3007 and the measured voltages across the known impedances.

When the two-port network parameters are obtained with a set of N known loads that spans the intended operating impedance range, the resulting values of the two-port network parameters can be robust and predictive of impedances not lying in the set of N impedances used to obtain the estimates. Since the two-port network parameters can be frequency-dependent quantities, the calculation is performed at each frequency for which the correction is to be applied. If measurements of voltage and impedance are densely sampled in frequency, then linear interpolation of the two-port network parameters can be applied to obtain accurate estimates of values at frequencies in between the sampled frequencies. For example, measuring at a number of frequencies between 32 and 256 spanning the operating frequency range from 1.0 MHz to 12.0 MHz can provide smooth functions suitable for accurate linear interpolation. In various embodiments, the RFTH module can comprise a calibration EEPROM integrated circuit (IC) that can store the two-port network parameters. The stored two-port network parameters can be used to correct the measurements obtained by the power measurement system 3007 to reduce the difference between the RF power delivered to the ultrasound transducer 200 and the RF output power measured by the power measurement system 3007. In various embodiments, the plurality of N calibrated impedances $Z_L$ can be greater than or equal to 4.

Systems and Methods for Predicting Output Power Delivered by an Ultrasound Transducer In various embodiments, it may be advantageous to predict how much acoustic power will be delivered before the amplifier is turned on. Predicting how much acoustic power will be delivered before the amplifier is turned on can be difficult in systems in which a power amplifier is not dedicated for use with a particular transducer. For example, in many embodiments of the therapy system, different power amplifiers can be interchangeably used with different transducers. Additionally, in many embodiments of the therapy system, the transducers may need to be replaced more frequently than the driving sub-systems. In such embodiments, a power amplifier can be used to drive different transducers as they are replaced and/or upgraded.

Accordingly, some desirable requirements for the systems and methods for predicting output power can include (i) prediction of delivered electrical power with an error of less than 0.3 dB; (ii) any transducer can be paired with any power amplifier and the power delivered by the transducer is within a margin of error of a commanded power; and (iii) the power delivered by the transducer is within a margin of error of a commanded power for a wide range of transducer impedances In various systems and methods for predicting power separate calibration measurements can be stored with the transducer and with the power amplifier. Based on the calibration measurements stored in the power amplifier and the ultrasound transducer, the RF power output by the power amplifier can be selected to output a RF signal at a desired output power which when provided to the ultrasound transducer would deliver the desired acoustic energy. This application contemplates two different prediction methods. A first method assumes low variance in power amplifier output impedance. A second method is assumption-free but requires more complex calibration steps Example Method 1

In the first method, the ultrasound transducer is configured to access a first lookup table (LUT) which stores a correspondence between acoustic power output by the ultrasound transducer and electrical power delivered into a 50Ω load at same amplitude settings. The first LUT can be generated during factory calibration of ultrasound transducer with a reference power amplifier. The first LUT can be stored in the ultrasound transducer.

The power amplifier in the driving sub-system 3000 of the RFTH module can access a second LUT which stores a correspondence between the amplitude of the RF signal output from the power amplifier and power into 50Ω load obtained during factory calibration of the power amplifier. The second LUT can be stored in the power amplifier, the driving sub-system 3000 or the RFTH module.

Example Method 2

In the second method, a first lookup table (LUT) including correspondence between impedance and electrical to acoustic conversion efficiency is generated during factory calibration of the ultrasound transducer. The first LUT can be stored in the ultrasound transducer.

A second LUT including the power amplifier output impedance and the Thevenin-equivalent source voltage as a function of amplitude setting is generated. The second LUT can be stored in the power amplifier, the driving sub-system 3000 or the RFTH module.

An electronic processing system can be configured to calculate electrical power into transducer load impedance that would be required to generate a desired acoustic power. The electronic processing system can be further configured to calculate the amplitude setting for the power amplifier that would output the electrical power that generates the desired acoustic power.

Power Calibration and Assurance System

Transducers used for HIFU often exhibit a tolerance in their resonance frequency. For example, the tolerance on the resonance frequency across a large number of manufactured transducers may be +/7%. Transducer resonance frequency may also change as transducers age and with temperature. In order to ensure that the transducer is driven at its resonance frequency, the frequency of the drive signal may be swept over a range of frequencies that contains the resonance frequency while a measurement is made of the transducer reflected power or impedance. Proximity to the center frequency may be determined by finding the frequency that reduces/minimizes the deviation of the impedance phase from zero, reduces/minimizes or increases/maximizes the impedance amplitude, reduces/minimizes the voltage standing wave ratio, reduces/minimizes the reflected power or the minimizes reflection coefficient. In various embodiments, the range of frequency sweep can be set to +/−100 KHz around a nominal resonance frequency while monitoring the voltage standing wave ratio at each frequency and selecting the frequency at which the voltage standing wave ratio is lowest or minimal.

Because the transducer impedance seen at a fixed frequency can change as the resonance frequency changes due to, for example, aging and/or temperature, it is beneficial to be able to dynamically adjust the power to compensate for these changes. In some embodiments the power assurance measurements can be used to measure the electric power delivered to the transducer, compare the electric power to a desired electric power and adjust the driver amplitude or the drive frequency so as to reduce the error between the measured and desired power.

In some embodiments, the power assurance system can be used to the measure the load impedance. Prior knowledge of the impedance of other system components located between the power assurance system and the transducer can be used to transform the power assurance measurements through a two-port network representing the system to determine the impedance looking into the transducer. In some embodiments the transducer impedance obtained in this manner can be used to determine the electrical power required to achieve a desired acoustic power from the transducer. In some embodiments, measurement of the transducer impedance obtained during therapy delivery can be used to adjust the drive amplitude so as to achieve a desired electric power delivery to the transducer and hence a desired acoustic power output from the transducer.

The therapeutic efficacy of HIFU can depend on having an acoustically transparent coupling between the transducer and the tissue being treated. Usually this coupling can be achieved by using a gel placed between the transducer and the skin. However, poor seating of the transducer in the gel or bubbles in the gel can make the coupling poor. It is therefore desirable to measure the quality of coupling prior to initiating therapy delivery and to monitor the quality of the coupling throughout the treatment. A characteristic of well-coupled tissue is that the interface between the tissue and the coupling medium will create a small reflectance of the ultrasound energy. For example, a well-coupled ultrasound transducer will reflect less than 5% of the incident power at the tissue, gel interface.

In some embodiments, the quality of the coupling is monitored during delivery of therapy by monitoring the level of reflected ultrasound energy. In order to provide axial resolution on the location of the disruption in the coupling, the ultrasound used to observe the reflected energy may be pulsed rather than continuous in nature. Using a pulsed waveform allows the distance from the transducer to a reflecting surface to be measured. In some embodiments, the therapy transducer may be used in pulse-echo mode as a sensor to detect the reflection of the coupling. In other embodiments, the therapy transducer may be used to excite the coupling material and a secondary transducer may be used to measure the reflected signal. In some embodiments, a reflection from a reference surface in the power delivery pathway can be used as an amplitude reference and the reflection from the coupling surface is compared to it to determine if the coupling is acceptable. In some embodiments the system can cease to deliver therapy until the reflected power is lower than an acceptable threshold.

In some embodiments, a calibrated power assurance system can be used to measure the impedance of a transducer. The measured impedance is fit to a model of the transducer impedance. In some embodiments, the model of the transducer impedance can be a circuit model like, for example, a Butterworth-van Dyke model. In some embodiments, the model of the transducer impedance can be a transmission line model like a Krimholtz, Leedom, and Matthaei (KLM) model. In some embodiments, the model of the transducer impedance can comprise a clamped capacitance, coupling coefficient and radiation resistance as parameters. In some embodiments, changes to model parameters can be indicative of changes in the transducers characteristics due to aging. Accordingly, changes to model parameters can be used to track aging or temperature of the transducer over time. In some embodiments, model parameters can be used as an acceptability criterion. In some embodiments changes to model parameters can be used to estimate required drive power to obtain a desired acoustic power.

Additional System Overview

In some embodiments, a console 300 comprises a communication system (e.g., wifi, Bluetooth, modem, etc. to communicate with another party, a manufacturer, a supplier, a service provider, the Internet, and/or a cloud. In some embodiments, the cart 301 has a power supply, such as a power connection to a battery and/or one or more cords to connect power, communications (e.g., Ethernet) to the system 20. In some embodiments, the system 20 comprises a cart 301. In some embodiments, the system 20 does not comprise a cart 301. The hand wand 100 can be coupled to the controller 300 by an interface 130, which may be a wired or wireless interface. The interface 130 can be coupled to the hand wand 100 by a connector 145. The distal end of the interface 130 can be connected to a controller connector on a circuit 345 (not shown). In one embodiment, the interface 130 can transmit controllable power from the controller 300 to the hand wand 100. In an embodiment, the system 20 has multiple imaging channels (e.g., 8 channels) for ultra-clear HD (high definition) visualization of subcutaneous structures to improve imaging. In an embodiment, the system 20 multiple therapy channels (e.g., 8 channels) and a precision linear-drive motor that doubles treatment accuracy while increasing speed (e.g., by 25%, 40%, 50%, 60%, 75%, 100% or more). Together, these features establish one of the most versatile system platforms in the industry and provide a foundation for unprecedented future possibilities.

The controller 300 can include connectivity to one or more interactive graphical display 310, which can include a touchscreen monitor and Graphic User Interface (GUI) that allows the user to interact with the ultrasound system 20. In one embodiment, a second smaller, more mobile display that allows the user to more easily position and view the treatment screen. In one embodiment, a second display that allows the system user to view a treatment screen (e.g., on a wall, on a mobile device, large screen, remote screen). In one embodiment the graphical display 310 includes a touchscreen interface 315 (not shown). In various embodiments, the display 310 sets and displays the operating conditions, including equipment activation status, treatment parameters, system messages and prompts, and ultrasound images. In various embodiments, the controller 300 can be adapted to and/or configured to include, for example, a microprocessor with software and input/output devices, systems and devices for controlling electronic and/or mechanical scanning and/or multiplexing of transducers and/or multiplexing of transducer modules, a system for power delivery, systems for monitoring, systems for sensing the spatial position of the probe and/or transducers and/or multiplexing of transducer modules, and/or systems for handling user input and recording treatment results, among others.

In one embodiment, the hand wand 100 includes one or more finger activated controllers or switches, such as 150 and 160. In various embodiments, one or more thermal treatment controllers 160 (e.g., switch, button) activates and/or stops treatment. In various embodiments, one or more imaging controllers 150 (e.g., switch, button) activates and/or stops imaging. In one embodiment, the hand wand 100 can include a removable module 200. In other embodiments, the module 200 may be non-removable. In various embodiments, the module 200 can be mechanically coupled to the hand wand 100 using a latch or coupler 140. In various embodiments, an interface guide 235 or multiple interface guides 235 can be used for assisting the coupling of the module 200 to the hand wand 100. The module 200 can include one or more ultrasound transducers 280. In some embodiments, an ultrasound transducer 280 includes one or more ultrasound elements. The module 200 can include one or more ultrasound elements. The hand wand 100 can include imaging-only modules, treatment-only modules, imaging-and-treatment modules, and the like. In various embodiments, the ultrasound transducer 280 is movable in one or more directions 290 within the module 200. The transducer 280 is connected to a motion mechanism 400. In various embodiments, the motion mechanism comprises zero, one, or more bearings, shafts, rods, screws, lead screws 401, encoders 402 (e.g., optical encoder to measure position of the transducer 280), motors 403 (e.g., a step motor) to help ensure accurate and repeatable movement of the transducer 280 within the module 200. In various embodiments, module 200 can include a transducer 280 which can emit energy through an acoustically transparent member 230. In one embodiment, the control module 300 can be coupled to the hand wand 100 via the interface 130, and the graphic user interface 310 can be adapted to and/or configured for controlling the module 200. In one embodiment, the control module 300 can provide power to the hand wand 100. In one embodiment, the hand wand 100 can include a power source. In one embodiment, the switch 150 can be adapted to and/or configured for controlling a tissue imaging function and the switch 160 can be adapted to and/or configured for controlling a tissue treatment function. In various embodiments, delivery of emitted energy 50 at a suitable focal depth, distribution, timing, and energy level is provided by the module 200 through controlled operation by the control system 300 of the transducer 280 to achieve the desired therapeutic effect with a thermal coagulation zone 550.

In one embodiment, the module 200 can be coupled to the hand wand 100. The module 200 can emit and receive energy, such as ultrasonic energy. The module 200 can be electronically coupled to the hand wand 100 and such coupling may include an interface which is in communication with the controller 300. In one embodiment, the interface guide 235 can be adapted to and/or configured to provide electronic communication between the module 200 and the hand wand 100. The module 200 can comprise various probe and/or transducer configurations. For example, the module 200 can be adapted to and/or configured for a combined dual-mode imaging/therapy transducer, coupled or co-housed imaging/therapy transducers, separate therapy and imaging probes, and the like. In one embodiment, when the module 200 is inserted into or connected to the hand wand 100, the controller 300 automatically detects it and updates the interactive graphical display 310.

In some embodiments, an access key 320 (e.g., a secure USB drive, key) is removably connected to a system 20 to permit the system 20 to function. In various embodiments, the access key is programmed to be customer specific, and serves multiple functions, including system security, country/region specific access to treatment guidelines and functionality, software upgrades, support log transfers and/or credit transfer and/or storage. In various embodiments, the system 20 has internet and/or data connectivity. In an embodiment, connectivity provides a method by which data is transferred between the system 20 provider and the customer. In various embodiments, data includes credits, software updates and support logs. Connectivity is divided into different model embodiments, based on how a user's console is connected to the internet. In one embodiment, Disconnected Model connectivity comprises a console that is disconnected from the internet and customer doesn't have internet access. Credit transfers and software upgrades are conducted by shipping access key(s), (e.g., USB drives) to the customer. In one embodiment, Semi-Connected Model connectivity comprises a console that is disconnected from the internet but customer has internet access. Credit transfers, software upgrades and support log transfers are conducted using the customer's personal computer, smart phone, or other computing device in conjunction with the system access key to transfer data. In one embodiment, Fully-Connected Model connectivity comprises a console that is wirelessly connected to the internet using wifi, cellular modem, Bluetooth, or other protocol. Credit transfers, software upgrades and support log transfers are made directly between the console and the cloud. In various embodiments, the system 20 connects to an online portal, for streamlined inventory management, on-demand treatment purchases and business analytics insights to drive customer aesthetic treatment business to the next level.

FIG. 2 is a schematic illustration of the ultrasound system 20 coupled to a region of interest 10. In various embodiments, tissue below or even at a skin surface such as epidermis, dermis, hypodermis, fascia, and superficial muscular aponeurotic system ("SMAS"), and/or muscle are treated non-invasively with ultrasound energy. Tissue may also include blood vessels and/or nerves. The ultrasound energy can be focused, unfocused or defocused and applied to a region of interest containing at least one of epidermis, dermis, hypodermis, fascia, and SMAS to achieve a therapeutic effect. In various embodiments, tissue layers of the region of interest 10 can be at any part of the body of a subject. In one embodiment, the tissue layers are in the head and face region of the subject. The cross-sectional portion of the tissue of the region of interest 10 includes a skin surface 501, an epidermal layer 502, a dermal layer 503, a fat layer 505, a superficial muscular aponeurotic system 507 (hereinafter "SMAS 507"), and a muscle layer 509. The tissue can also include the hypodermis 504, which can include any tissue below the dermal layer 503. The combination of these layers in total may be known as subcutaneous tissue 510. Also illustrated in FIG. 2 is a treatment zone 525 which is below the surface 501. In one embodiment, the surface 501 can be a surface of the skin of a subject 500. Although an embodiment directed to therapy at a tissue layer may be used herein as an example, the system can be applied to any tissue in the body. In various embodiments, the system and/or methods may be used on tissue (including but not limited to one or a combination of muscles, fascia, SMAS, dermis, epidermis, fat, adipose cells, cellulite, which may be called gynoid lipodystrophy, (e.g., non-dimple type female gynoid lipodystrophy), collagen, skin, blood vessels, of the face, neck, head, arms, legs, or any other location on or in the body (including bodily cavities). In various embodiments, cellulite (e.g., non-dimple type female gynoid lipodystrophy) reduction is achieved in an amount of 2%, 5%, 10%, 15%, 20%, 25%, 30%, 40%, 50%, 75%, 80%, 90%, 95%, and any ranges therein.

With reference to the illustration in FIG. 2, an embodiment of the ultrasound system 20 includes the hand wand 100, the module 200, and the controller 300. In one embodiment, the module 200 includes a transducer 280. The transducer 280 of various embodiments of an ultrasound system 20 can be adapted to and/or configured to treat tissue at a focal depth which is a distance between the transducer 280 and the target tissue for treatment. In various embodiments, the focal depth can be fixed for a given transducer 280. In one embodiment, a focal depth is variable for a given transducer 280. In one embodiment, a transducer 280 is configured to treat simultaneously at multiple depths below a skin surface (e.g., 1.5 mm, 3.0 mm, 4.5 mm, or other depths).

As discussed above, the module 200 can include a transducer which can emit energy through an acoustically transparent member 230. In one embodiment, the transducer 280 can have an offset distance, which is the distance between the transducer 280 and a surface of the acoustically transparent member 230. In one embodiment, the focal depth of a transducer 280 is a fixed distance from the transducer. In one embodiment, a transducer 280 may have a fixed offset distance from the transducer to the acoustically transparent member 230. In one embodiment, an acoustically transparent member 230 is adapted to and/or configured at a position on the module 200 or the ultrasound system 20 for contacting the skin surface 501. In various embodiments, the focal depth exceeds the offset distance by an amount to correspond to treatment at a target area located at a tissue depth below a skin surface 501. In various embodiments, when the ultrasound system 20 placed in physical contact with the skin surface 501, the tissue depth is a distance between the acoustically transparent member 230 and the target area, measured as the distance from the portion of the hand wand 100 or module 200 surface that contacts skin (with or without an acoustic coupling gel, medium, etc.) and the depth in tissue from that skin surface contact point to the target area. In one embodiment, the focal depth can correspond to the sum of an offset distance (as measured to the surface of the acoustically transparent member 230 in contact with a coupling medium and/or skin 501) in addition to a tissue depth under the skin surface 501 to the target region. In various embodiments, the acoustically transparent member 230 is not used.

Coupling components can comprise various substances, materials, and/or devices to facilitate coupling of the transducer 280 or module 200 to a region of interest. For example, coupling components can comprise an acoustic coupling system adapted to and/or configured for acoustic coupling of ultrasound energy and signals. Acoustic coupling system with possible connections such as manifolds may be utilized to couple sound into the region of interest, provide liquid- or fluid-filled lens focusing. The coupling system may facilitate such coupling through use of one or more coupling media, including air, gases, water, liquids, fluids, gels, solids, non-gels, and/or any combination thereof, or any other medium that allows for signals to be transmitted between the transducer 280 and a region of interest. In one embodiment one or more coupling media is provided inside a transducer. In one embodiment a fluid-filled module 200 contains one or more coupling media inside a housing. In one embodiment a fluid-filled module 200 contains one or more coupling media inside a sealed housing, which is separable from a dry portion of an ultrasonic device. In various embodiments, a coupling medium is used to transmit ultrasound energy between one or more devices and tissue with a transmission efficiency of 100%, 99% or more, 98% or more, 95% or more, 90% or more, 80% or more, 75% or more, 60% or more, 50% or more, 40% or more, 30% or more, 25% or more, 20% or more, 10% or more, and/or 5% or more.

In various embodiments, the transducer 280 can image and treat a region of interest at any suitable tissue depths. In one embodiment, the transducer module 280 can provide an acoustic power in a range of about 1 W or less, between about 1 W to about 100 W, and more than about 100 W, e.g., 200 W, 300 W, 400 W, 500 W. In one embodiment, the transducer module 280 can provide an acoustic power at a frequency of about 1 MHz or less, between about 1 MHz to about 10 MHz (e.g., 3 MHz, 4 MHz, 4.5 MHz, 7 MHz, 10 MHz), and more than about 10 MHz. In one embodiment, the module 200 has a focal depth for a treatment at a tissue depth of about 4.5 mm below the skin surface 501. In one embodiment, the module 200 has a focal depth for a treatment at a tissue depth of about 3 mm below the skin surface 501. In one embodiment, the module 200 has a focal depth for a treatment at a tissue depth of about 1.5 mm below the skin surface 501. Some non-limiting embodiments of transducers 280 or modules 200 can be adapted to and/or configured for delivering ultrasonic energy at a tissue depth of 1.5 mm, 3 mm, 4.5 mm, 6 mm, 7 mm, less than 3 mm, between 3 mm and 4.5 mm, between 4.5 mm and 6 mm, more than more than 4.5 mm, more than 6 mm, etc., and anywhere in the ranges of 0-3 mm, 0-4.5 mm, 0-6 mm, 0-25 mm, 0-100 mm, etc. and any depths therein. In one embodiment, the ultrasound system 20 is provided with two or more transducer modules 280. For example, a first transducer module can apply treatment at a first tissue depth (e.g., about 4.5 mm) and a second transducer module can apply treatment at a second tissue depth (e.g., of about 3 mm), and a third transducer module can apply treatment at a third tissue depth (e.g., of about 1.5-2 mm). In one embodiment, at least some or all transducer modules can be adapted to and/or configured to apply treatment at substantially same depths.

In various embodiments, changing the number of focus point locations (e.g., such as with a tissue depth) for an ultrasonic procedure can be advantageous because it permits treatment of a patient at varied tissue depths even if the focal depth of a transducer 280 is fixed. This can provide synergistic results and maximizing the clinical results of a single treatment session. For example, treatment at multiple depths under a single surface region permits a larger overall volume of tissue treatment, which results in enhanced collagen formation and tightening. Additionally, treatment at different depths affects different types of tissue, thereby producing different clinical effects that together provide an enhanced overall cosmetic result. For example, superficial treatment may reduce the visibility of wrinkles and deeper treatment may induce formation of more collagen growth. Likewise, treatment at various locations at the same or different depths can improve a treatment.

Although treatment of a subject at different locations in one session may be advantageous in some embodiments, sequential treatment over time may be beneficial in other embodiments. For example, a subject may be treated under the same surface region at one depth in time one, a second depth in time two, etc. In various embodiments, the time can be on the order of nanoseconds, microseconds, milliseconds, seconds, minutes, hours, days, weeks, months, or other time periods. The new collagen produced by the first treatment may be more sensitive to subsequent treatments, which may be desired for some indications. Alternatively, multiple depth treatment under the same surface region in a single session may be advantageous because treatment at one depth may synergistically enhance or supplement treatment at another depth (due to, for example, enhanced blood flow, stimulation of growth factors, hormonal stimulation, etc.). In several embodiments, different transducer modules provide treatment at different depths. In one embodiment, a single transducer module can be adjusted or controlled for varied depths. Safety features to minimize the risk that an incorrect depth will be selected can be used in conjunction with the single module system.

In several embodiments, a method of treating the lower face and neck area (e.g., the submental area) is provided. In several embodiments, a method of treating (e.g., softening) mentolabial folds is provided. In other embodiments, a method of treating the eye region (e.g., malar bags, treat infraorbital laxity) is provided. Upper lid laxity improvement and periorbital lines and texture improvement will be achieved by several embodiments by treating at variable depths. By treating at varied locations in a single treatment session, optimal clinical effects (e.g., softening, tightening) can be achieved. In several embodiments, the treatment methods described herein are non-invasive cosmetic procedures. In some embodiments, the methods can be used in conjunction with invasive procedures, such as surgical facelifts or liposuction, where skin tightening is desired. In various embodiments, the methods can be applied to any part of the body.

In one embodiment, a transducer module 200 permits a treatment sequence at a fixed depth at or below the skin surface. In one embodiment, a transducer module permits a treatment sequence at one, two, or more variable or fixed depths below the dermal layer. In several embodiments, the transducer module comprises a movement mechanism adapted to and/or configured to direct ultrasonic treatment in a sequence of individual thermal lesions (hereinafter "thermal coagulation points" or "TCPs") at a fixed focal depth. In one embodiment, the sequence of individual TCPs has a treatment spacing in a range from about 0.01 mm to about 25 mm (e.g., 1 mm, 1.5 mm, 2 mm, 2.5 mm, 3 mm, 5 mm, 10 mm, 20 mm and any value ranges therein), with a dithering alteration of the spacing by 1-50% (e.g., 1%, 5%, 10%, 15%, 20%, 25%, 30%, 35%, 40%, 45%, 50% and any range therein). For example, the spacing can be 1.1 mm or less, 1.5 mm or more, between about 1.1 mm and about 1.5 mm, etc. In one embodiment, the individual TCPs are discrete. In one embodiment, the individual TCPs are overlapping. In one embodiment, the movement mechanism is adapted to and/or configured to be programmed to provide variable spacing between the individual TCPs. In one embodiment, the dithering can be adapted to and/or configured to provide variable spacing between the individual TCPs. In several embodiments, a transducer module comprises a movement mechanism adapted to and/or configured to direct ultrasonic treatment in a sequence so that TCPs are formed in linear or substantially linear sequences separated by a treatment distance. For example, a transducer module can be adapted to and/or configured to form TCPs along a first linear sequence and a second linear sequence separated by a treatment distance from the first linear sequence. In one embodiment, treatment distance between adjacent linear sequences of individual TCPs is in a range from about 0.01 mm to about 25 mm. In one embodiment, treatment distance between adjacent linear sequences of individual TCPs is in a range from about 0.01 mm to about 50 mm. For example, the treatment distance can be 2 mm or less, 3 mm or more, between about 2 mm and about 3 mm, etc. In several embodiments, a transducer module can comprise one or more movement mechanisms 400 adapted to and/or configured to direct ultrasonic treatment in a sequence so that TCPs are formed in linear or substantially linear sequences of individual thermal lesions separated by a treatment distance from other linear sequences. In one embodiment a treatment is applied in a first direction 290 (e.g., push). In one embodiment, a treatment is applied opposite the first direction 290 (e.g., pull). In one embodiment, treatment is applied in both a first direction 290 and opposite the first direction (e.g., push and pull). In one embodiment, the treatment distance separating linear or substantially linear TCPs sequences is the same or substantially the same. In one embodiment, the treatment distance separating linear or substantially linear TCPs sequences is different or substantially different for various adjacent pairs of linear TCPs sequences.

In one embodiment, first and second removable transducer modules are provided. In one embodiment, each of the first and second transducer modules are adapted to and/or configured for both ultrasonic imaging and ultrasonic treatment. In one embodiment, a transducer module is adapted to and/or configured for treatment only. In one embodiment, an imaging transducer may be attached to a handle of a probe or a hand wand. The first and second transducer modules are adapted to and/or configured for interchangeable coupling to a hand wand. The first transducer module is adapted to and/or configured to apply ultrasonic therapy to a first layer of tissue, while the second transducer module is adapted to and/or configured to apply ultrasonic therapy to a second layer of tissue. The second layer of tissue is at a different depth than the first layer of tissue.

In various embodiments, delivery of emitted energy at a suitable focal depth, distribution, timing, and energy level is provided by the module 200 through controlled operation by the control system 300 to achieve the desired therapeutic effect of controlled thermal injury to treat at least one of the epidermis layer 502, dermis layer 503, fat layer 505, the SMAS layer 507, the muscle layer 509, and/or the hypodermis 504. In various embodiments, the emitted energy can be focused at a depth that corresponds to a depth for treating muscle. In various embodiments, the depth can correspond to any tissue, tissue layer, skin, epidermis, dermis, hypodermis, fat, SMAS, muscle, blood vessel, nerve, or other tissue. During operation, the module 200 and/or the transducer 280 can also be mechanically and/or electronically scanned along the surface 501 to treat an extended area. Before, during, and after the delivery of ultrasound energy 50 to at least one of the epidermis layer 502, dermis layer 503, hypodermis 504, fat layer 505, the SMAS layer 507 and/or the muscle layer 509, monitoring of the treatment area and surrounding structures can be provided to plan and assess the results and/or provide feedback to the controller 300 and the user via a graphical interface 310.

In one embodiment, an ultrasound system 20 generates ultrasound energy which is directed to and focused below the surface 501. This controlled and focused ultrasound energy 50 creates the thermal coagulation point or zone (TCP) 550. In one embodiment, the ultrasound energy 50 creates a void in subcutaneous tissue 510. In various embodiments, the emitted energy 50 targets the tissue below the surface 501 which cuts, ablates, coagulates, microablates, manipulates, and/or causes a TCP 550 in the tissue portion 10 below the surface 501 at a specified focal depth. In one embodiment, during the treatment sequence, the transducer 280 can be moved in a direction denoted by the arrow marked 290 at specified intervals to create a series of treatment zones each of which receives an emitted energy 50 to create one or more TCPs 550. In one embodiment, the TCP's can be spaced orthogonally to the motion direction of the transducer 280. In some embodiments, an orientation of the spaced TCP's can be set at any angle 0-180 degrees from arrow 290. In some embodiments, an orientation of the spaced TCP's can be set at any angle 0-180 degrees based on the orientation of poled areas on the transducer 280.

In various embodiments, transducer modules can comprise one or more transduction elements. The transduction elements can comprise a piezoelectrically active material, such as lead zirconante titanate (PZT), or any other piezoelectrically active material, such as a piezoelectric ceramic, crystal, plastic, and/or composite materials, as well as lithium niobate, lead titanate, barium titanate, and/or lead metaniobate. In various embodiments, in addition to, or instead of, a piezoelectrically active material, transducer modules can comprise any other materials adapted to and/or configured for generating radiation and/or acoustical energy. In various embodiments, transducer modules can be adapted to and/or configured to operate at different frequencies and treatment depths. Transducer properties can be defined by an outer diameter ("OD") and focal length ($F_L$). In one embodiment, a transducer can be adapted to and/or configured to have OD=19 mm and $F_L$=15 mm. In other embodiments, other suitable values of OD and $F_L$ can be used, such as OD of less than about 19 mm, greater than about 19 mm, etc. and $F_L$ of less than about 15 mm, greater than about 15 mm, etc. Transducer modules can be adapted to and/or configured to apply ultrasonic energy at different target tissue depths. As described above, in several embodiments, transducer modules comprise movement mechanisms adapted to and/or configured to direct ultrasonic treatment in a linear or substantial linear sequence of individual TCPs with a treatment spacing between individual TCPs. For example, treatment spacing can be about 1.1 mm, 1.5 mm, etc. In several embodiments, transducer modules can further comprise movement mechanisms adapted to and/or configured to direct ultrasonic treatment in a sequence so that TCPs are formed in linear or substantially linear sequences separated by a treatment spacing. For example, a transducer module can be adapted to and/or configured to form TCPs along a first linear sequence and a second linear sequence separated by treatment spacing between about 2 mm and 3 mm from the first linear sequence. In one embodiment, a user can manually move the transducer modules across the surface of a treatment area so that adjacent linear sequences of TCPs are created. In one embodiment, a movement mechanism can automatically move the transducer modules across the surface of a treatment area so that adjacent linear sequences of TCPs are created.

Various embodiments relate to devices or methods of controlling the delivery of energy to a target region (such as tissue). In various embodiments, various forms of energy can include acoustic, ultrasound, light, laser, radio-frequency (RF), microwave, electromagnetic, radiation, thermal, cryogenic, electron beam, photon-based, magnetic, magnetic resonance, and/or other energy forms. Various embodiments relate to devices or methods of splitting an ultrasonic energy beam into multiple beams. In various embodiments, devices or methods can be used to alter the delivery of ultrasound acoustic energy in any procedures such as, but not limited to, therapeutic ultrasound, diagnostic ultrasound, ultrasonic welding, any application that involves coupling mechanical waves to an object, and other procedures. Generally, with therapeutic ultrasound, a tissue effect is achieved by concentrating the acoustic energy using focusing techniques from the aperture. In some instances, high intensity focused ultrasound (HIFU) is used for therapeutic purposes in this manner. In one embodiment, a tissue effect created by application of therapeutic ultrasound at a particular depth to can be referred to as creation of a thermal coagulation point (TCP). In some embodiments, a zone can include a point. In some embodiments, a zone is a line, plane, spherical, elliptical, cubical, or other one-, two-, or three-dimensional shape. It is through creation of TCPs at particular positions that thermal and/or mechanical ablation of tissue can occur non-invasively or remotely. In some embodiments, an ultrasound treatment does not include cavitation and/or shock waves. In some embodiments, an ultrasound treatment includes cavitation and/or shock waves.

In one embodiment, TCPs can be created in a linear or substantially linear, curved or substantially curved, zone or sequence, with each individual TCP separated from neighboring TCPs by a treatment spacing. In one embodiment, multiple sequences of TCPs can be created in a treatment region. For example, TCPs can be formed along a first sequence and a second sequence separated by a treatment distance from the first sequence. Although treatment with therapeutic ultrasound can be administered through creation of individual TCPs in a sequence and sequences of individual TCPs, it may be desirable to reduce treatment time and corresponding risk of pain and/or discomfort experienced by a patient. Therapy time can be reduced by forming multiple TCPs simultaneously, nearly simultaneously, or sequentially. In some embodiments, a treatment time can be reduced 10%, 20%, 25%, 30%, 35%, 40%, 45%, 50%, 55%, 60%, 65%, 70%, 75%, 80% or more by creating multiple TCPs.

For example, in some non-limiting embodiments power systems for transducers can be configured for focusing at a tissue depth of 0.5 mm, 1.0 mm, 1.5 mm, 2 mm, 3 mm, 4.5 mm, 6 mm, less than 3 mm, between 0.5 mm and 5 mm, between 1.5 mm and 4.5 mm, more than more than 4.5 mm, more than 6 mm, and anywhere in the ranges of 0.1 mm-3 mm, 0.1 mm-4.5 mm, 0.1 mm-25 mm, 0.1 mm-100 mm, and any depths therein (e.g., 6 mm, 10 mm, 13 mm, 15 mm). In several embodiments, tissue is treated at a depth below a skin surface and the skin surface is not impaired. Instead, the therapeutic effect achieved at the depth below the skin surface results in a favorable cosmetic appearance of the skin surface. In other embodiments, the skin surface is treated with ultrasound (e.g., at a depth less than 0.5 mm).

One benefit of a motion mechanism is that it can provide for a more efficient, accurate and precise use of an ultrasound transducer, for imaging and/or therapy purposes. One advantage this type of motion mechanism has over conventional fixed arrays of multiple transducers fixed in space in a housing is that the fixed arrays are a fixed distance apart. In one embodiment, the transducer module is configured to provide an acoustic power of the ultrasonic therapy in a range of between about 1 W to about 100 W (e.g., 3-30 W, 7-30 W, 21-33 W) and a frequency of about 1 MHz to about 10 MHz to thermally heat the tissue to cause coagulation. In one embodiment, the transducer module is configured to provide an acoustic power of the ultrasonic therapy in a range of between about 1 W to about 500 W for peak or average energy, (e.g., 3-30 W, 7-30 W, 21-33 W, 100 W, 220 W, or more) and a frequency of about 1 MHz to about 12 MHz to thermally heat the tissue to cause coagulation. In some embodiments, an instantaneous energy is delivered. In some embodiments, an average energy is delivered. In one embodiment, the acoustic power can be from a range of 1 W to about 100 W in a frequency range from about 1 MHz to about 12 MHz (e.g., 1 MHz, 3 MHz, 4 MHz, 4.5 MHz, 7 MHz, 10 MHz, 2-12 MHz), or from about 10 W to about 50 W at a frequency range from about 3 MHz to about 8 MHz (e.g., 3 MHz, 4 MHz, 4.5 MHz, 7 MHz). In one embodiment, the acoustic power can be from a range of 1 W to about 500 W in a frequency range from about 1 MHz to about 12 MHz (e.g., 1 MHz, 4 MHz, 7 MHz, 10 MHz, 2-12 MHz), or from about 10 W to about 220 W at a frequency range from about 3 MHz to about 8 MHz, or 3 MHz to 10 MHz. In one embodiment, the acoustic power and frequencies are about 40 W at about 4.3 MHz and about 30 W at about 7.5 MHz (e.g., 7.0 MHz, 7.2 MHz, 7.4 MHz, 7.6 MHz, 7.8 MHz, 8.0 MHz). An acoustic energy produced by this acoustic power can be between about 0.01 joule ("J") to about 10 J (e.g., 0.25 J, 0.45 J, 0.5 J, 1.0 J, 1.05 J, 1.20 J, 1.25 J, 1.50 J, 4 J, 6 J, 8 J, 9 J) or about 2 J to about 5 J. An acoustic energy produced by this acoustic power can be between about 0.01 J to about 60,000 J (e.g., via bulk heating, for body shaping, submental fat, abdomen and/or flanks, arms, inner thigh, outer thigh, buttocks, abdominal laxity, cellulite), about 10 J or about 2 J to about 5 J. In one embodiment, the acoustic energy is in a range less than about 3 J (e.g., 0.25 J, 0.45 J, 0.5 J, 1.0 J, 1.05 J, 1.20 J, 1.25 J, 1.50 J, 2.0 J, 2.5 J). In various embodiments, a treatment power intensity is 10 kW/cm$^2$ to 100 kW/cm$^2$, 15 kW/cm$^2$ to 70 kW/cm$^2$, 10 kW/cm$^2$ to 15 kW/cm$^2$, 15 kW/cm$^2$ to 20 kW/cm$^2$, 17 kW/cm$^2$ to 40 kW/cm$^2$, 15 kW/cm$^2$ to 50 kW/cm$^2$, 20 kW/cm$^2$ to 40 kW/cm$^2$, 15 kW/cm$^2$ to 35 kW/cm$^2$, 15 kW/cm$^2$ to 25 kW/cm$^2$, 25 kW/cm$^2$ to 70 kW/cm$^2$, and/or 40 kW/cm$^2$ to 80 kW/cm$^2$.

In several of the embodiments described herein, the procedure is entirely cosmetic and not a medical act. For example, in one embodiment, the methods described herein need not be performed by a doctor, but at a spa or other aesthetic institute. In some embodiments, a system can be used for the non-invasive cosmetic treatment of skin. In several embodiments, provided are systems and methods using targeted and precise ultrasound via a thermal pathway with a single ultrasound therapy beam, or by splitting an ultrasound therapy beam to two, three, four, or more simultaneous focal zones for performing various treatment and/or imaging procedures. In some embodiments, the ultrasound is used for diagnostic and/or therapeutic purposes in the medical field, including but not limited to dermatology.

In various embodiments, ultrasound imaging is employed to ensure sufficient acoustic coupling during delivery of an ultrasound therapy treatment. In various embodiments, ultrasound imaging is employed to prevent treatment at an undesired area in a body, such as a bone or an implant. Sound, unlike light, needs a medium for propagation. In an embodiment, an ultrasound treatment system acoustically couples ultrasound energy from the transducer to the body through an acoustic window using gel. In this embodiment, the gel is the medium which mimics the acoustic impedance properties of tissue so there is efficient transfer of energy from the device into tissue. Unfortunately, any pockets of air between the transducer and tissue prevent proper coupling in some situations, and can therefore cause an inadequate transfer of the ultrasound therapy energy. The ultrasound imaging checks this coupling. Inadequate coupling may show up as shadows or vertical stripes in the ultrasound images or a completely dark image. Even if there is sufficient coupling, tissues or objects, such as bone or an implant can cause challenges since these objects can have a different acoustic impedance and absorption characteristics than soft tissue (e.g. skin, muscle). Because of this, objects (such as bone or an implant) in between the device and intended therapy focus may cause significant reflection and the appearance heating at a shallower depth than intended. Objects (e.g., bone, etc.) slightly beyond the focus may also cause issues since the object reflects and readily absorbs the ultrasound from the soft tissue. The reflected energy may inadvertently add to the energy already at the therapy focus causing a higher temperature rise than intended. The absorbed energy at the bone may cause heating or discomfort in the bone.

In various embodiments, the invention improves safety characteristics, improves efficacy performance, provides a component of safety and efficacy for bulk heating devices (such as a band treatment, a linear focal treatment zone, a cylindrical focal line, a plane and/or a volume, etc.) for body shaping, submental fat, abdomen and/or flanks, arms, inner thigh, outer thigh, buttocks, laxity, abdominal laxity, etc., provides qualitative and/or quantitative assessment of coupling, provides for blending of high resolution image(s) with coupling image(s), is employed for assessing out-of-plane impediments post-focally (e.g. bone, intestine, implants), and/or can be used to reduce the need for sonographer equivalent skills.

In several embodiments disclosed herein, non-invasive ultrasound systems are adapted to be used in achieving one or more of the following beneficial aesthetic and/or cosmetic improvement effects: a face lift, a brow lift, a chin lift, an eye treatment (e.g., malar bags, treat infraorbital laxity), a wrinkle reduction, fat reduction (e.g., treatment of adipose and/or cellulite), cellulite (which may be called gynoid lipodystrophy) treatment (e.g., dimple or non-dimple type female gynoid lipodystrophy), décolletage improvement (e.g., upper chest), a buttock lift (e.g., buttock tightening), skin tightening (for example, treating laxity to cause tightening on the face or body, such as the face, neck, chest, arms, thighs, abdomen, buttocks, etc.), a scar reduction, a burn treatment, a tattoo removal, a vein removal, a vein reduction, a treatment on a sweat gland, a treatment of hyperhidrosis, a sun spot removal, an acne treatment, a pimple reduction. In one embodiment, a thermal coagulation zone is directed to a tissue below the skin, such as the superficial muscular aponeurotic system ("SMAS") and another defocused energy at the surface of the skin is provided. In various embodiments, an ultrasound system is configured for focusing ultrasound to produce localized, mechanical motion within tissues and cells for the purpose of producing either localized heating for tissue coagulation, ablation, and/or or for mechanical cellular membrane disruption. In various embodiments, an ultrasound system is configured for lifting a brow (e.g., an eyebrow). In various embodiments, an ultrasound system is configured for lifting lift lax tissue, such as submental (beneath the chin) and neck tissue. In various embodiments, an ultrasound system is configured for improving lines and wrinkles of the décolleté. In various embodiments, an ultrasound system is configured for reducing fat. In various embodiments, an ultrasound system is configured for reducing the appearance of cellulite. In various embodiments, tissue below or even at a skin surface such as epidermis, dermis, fascia, muscle, fat, and superficial muscular aponeurotic system ("SMAS"), are treated non-invasively with ultrasound energy. The ultrasound energy can be focused at one or more treatment points and/or zones, can be unfocused and/or defocused, and can be applied to a region of interest containing at least one of epidermis, dermis, hypodermis, fascia, muscle, fat, cellulite, and SMAS to achieve a cosmetic and/or therapeutic effect.

In various embodiments, systems and/or methods provide non-invasive dermatological treatment to tissue through thermal treatment, coagulation, ablation, and/or tightening. In one embodiment, fat reduction is achieved. In various embodiments, cellulite (e.g., dimple or non-dimple type gynoid lipodystrophy) reduction or amelioration of one or more characteristics (such as dimples, nodularity, "orange peel" appearance, etc., is achieved by about 10-20%, 20-40%, 40-60%, 60-80% or higher (as well as overlapping ranging therein) as compared to, for example, untreated tissue. In one embodiment, décolletage is treated. In some embodiments, two, three or more beneficial effects are achieved during the same treatment session, and may be achieved simultaneously.

Various embodiments of the present invention address potential challenges posed by administration of ultrasound therapy. In various embodiments, time for effecting the formation of TCPs for a desired cosmetic and/or therapeutic treatment for a desired clinical approach at a target tissue is reduced. In various embodiments, target tissue is, but is not limited to, any of skin, eyelids, eye lash, eye brow, caruncula lacrimalis, crow's feet, wrinkles, eye, nose, mouth (e.g., nasolabial fold, perioral wrinkles), tongue, teeth, gums, ears, brain, heart, lungs, ribs, abdomen (e.g., for abdominal laxity), stomach, liver, kidneys, uterus, breast, vagina, prostrate, testicles, glands, thyroid glands, internal organs, hair, muscle, bone, ligaments, cartilage, fat, fat labuli, adipose tissue, subcutaneous tissue, implanted tissue, an implanted organ, lymphoid, a tumor, a cyst, an abscess, or a portion of a nerve, or any combination thereof.

Various embodiments of ultrasound treatment and/or imaging devices are described in U.S. application Ser. No. 12/996,616, which published as U.S. Publication No. 2011-0112405 A1 on May 12, 2011, which is a U.S. National Phase under 35 U.S.C. § 371 of International Application No. PCT/US2009/046475, filed on Jun. 5, 2009 and published in English on Dec. 10, 2009, which claims the benefit of priority from U.S. Provisional No. 61/059,477 filed Jun. 6, 2008, each of which is incorporated in its entirety by reference, herein. Various embodiments of ultrasound treatment and/or imaging devices are described in U.S. application Ser. No. 14/193,234, which published as U.S. Publication No. 2014/0257145 on Sep. 11, 2014, which is incorporated in its entirety by reference, herein. Various embodiments of ultrasound treatment and/or imaging devices are described in International App. PCT/US15/25581, which published as WO 2015/160708 on Oct. 22, 2015 with a national phase U.S. application Ser. No. 15/302, 436, which published as U.S. Publication No. 2017/0028227 on Feb. 2, 2017, each of which is incorporated in its entirety by reference, herein. Various embodiments of ultrasound treatment and/or imaging devices are described in International App. PCT/US17/046703, which published as WO 2018/035012 on Feb. 22, 2018 with a national phase U.S. application Ser. No. 15/562,384, each of which is incorporated in its entirety by reference, herein.

Some embodiments and the examples described herein are examples and not intended to be limiting in describing the full scope of devices, systems, and methods of these embodiments. Equivalent changes, modifications and variations of some embodiments, materials, compositions and methods can be made within the scope of the embodiments described herein, with substantially similar results. Modifications, equivalents, and alternatives falling within the spirit and scope of the various embodiments described herein and the appended claims are included herein.

Any methods disclosed herein need not be performed in the order recited. The methods disclosed herein include certain actions taken by a practitioner; however, they can also include any third-party instruction of those actions, either expressly or by implication. For example, actions such as "coupling a transducer module with an ultrasonic probe" include "instructing the coupling of a transducer module with an ultrasonic probe." The ranges disclosed herein also encompass any and all overlap, sub-ranges, disclosed values, and combinations thereof. Language such as "up to," "at least," "greater than," "less than," "between," and the like includes the number recited. Numbers preceded by a term such as "about" or "approximately" include the recited numbers. For example, "about 25 mm" includes "25 mm." Titles and/or headings herein are provided for convenience and are not limiting to the claimed subject matter.

What is claimed is:

1. An ultrasound treatment system comprising:
an ultrasonic probe comprising an ultrasound therapy transducer adapted to apply ultrasonic therapy to tissue;
an electrical power system configured to provide electrical power to the ultrasound therapy transducer, the electrical power system comprising a power amplifier device;
wherein the power amplifier device comprises:
a switch-mode amplifier circuit configured to generate digital waveforms to drive semiconductor transistors configured in an H-bridge configuration to drive the ultrasound therapy transducer;
a comparator circuit to generate an H-bridge drive signal for modulation of a gate of each semiconductor transistor configured in the H-bridge configuration,
wherein the semiconductor transistors are field effect transistors,
configured to operate with an efficiency of at least 75% at a radio frequency (RF) in a range between 200 kHz and 20 MHz; and
wherein the H-bridge drive signal driving the field effect transistors is generated by the comparator circuit comparing an output of a sinusoidal direct digital synthesis circuit to a DC voltage wherein an output power is in the range from 0.1 W to 100 W.

2. The ultrasound treatment system of claim 1,
wherein the comparator circuit configured to generate digital waveforms to drive the semiconductor transistors to drive the ultrasound therapy transducer.

3. The ultrasound treatment system of claim 1,
wherein the switch-mode amplifier circuit comprises four semiconductor transistors configured in the H-bridge configuration.

4. The ultrasound treatment system of claim 1,
wherein the semiconductor transistors are gallium nitride,
wherein power amplifier device comprises:
the switch-mode amplifier circuit comprising at least one gallium nitride field effect transistor, wherein each gallium nitride field effect transistor comprises at least one gate; and
the comparator circuit configured to generate digital waveforms to drive the at least one gate of the at least one gallium nitride field effect transistors to drive a piezoelectric ultrasound transducer;
wherein the comparator circuit comprises four gallium nitride transistors configured in the H-bridge configuration;

wherein a gate drive signal has a variable duty cycle that is used to control a harmonic content and a power in the output signal;

wherein a power amplifier converter supplies power to a radio frequency output signal power with an efficiency greater than 75%;

wherein a supply voltage to the power amplifier device is modulated using a switch-mode DC-DC converter that reduces a fixed high voltage input to a lower supply voltage;

a power amplifier is configured to drive at a single piezoelectric transduction element of a high-intensity focused ultrasound transducer;

wherein the power amplifier is configured to drive the output signal at two or more different amplitudes;

wherein the power amplifier is configured to drive the output signal at two or more different phases;

wherein a phase and a frequency are controlled by a direct digital synthesizer;

wherein the system is configured to drive transducers with an impedance in the range from 20 ohms to 120 ohms and a phase angle from +45 degrees to −45 degrees.

5. The ultrasound treatment system of claim 1, wherein the semiconductor transistors comprise Gallium Nitride (GaN).

6. The ultrasound treatment system of claim 1, wherein the semiconductor transistors comprise a III-V compound.

7. An ultrasound treatment system comprising:
an ultrasonic probe comprising an ultrasound therapy transducer adapted to apply ultrasonic therapy to tissue; and
an electrical power system configured to provide electrical power to the ultrasound therapy transducer, the electrical power system comprising a power amplifier device;
wherein the power amplifier device comprises:
a switch-mode amplifier circuit configured to generate digital waveforms to drive semiconductor transistors configured in an H-bridge configuration to drive the ultrasound therapy transducer; and
a comparator circuit to generate an H-bridge drive signal for modulation of a gate of each semiconductor transistor configured in the H-bridge configuration,
wherein the semiconductor transistors are configured to operate with an efficiency of at least 50% at a radio frequency (RF) in a range between 1.0 MHz and 12.0 MHz,
wherein the H-bridge drive signal driving the semiconductor transistors are generated by comparing an output of a sinusoidal direct digital synthesis circuit to a DC voltage.

8. The system of claim 7, wherein power amplifier device comprises:
the comparator circuit configured to generate digital waveforms to drive the semiconductor transistors to drive a piezoelectric ultrasound transducer.

9. The ultrasound treatment system of claim 7, wherein an output power is in the range from 0.1 W to 100 W, and wherein the circuit comprises four power transistors configured in an H-bridge configuration.

10. The ultrasound treatment system of claim 7, wherein a power amplifier converter supplies power to a radio frequency output signal power with an efficiency greater than 90%.

11. The ultrasound treatment system of claim 7, comprising two or more power amplifiers, wherein a single power amplifier is configured to drive a single piezoelectric transduction element of a high-intensity focused ultrasound transducer.

12. The ultrasound treatment system of claim 7, wherein the power amplifier is configured to drive output at two or more different amplitudes.

13. The ultrasound treatment system of claim 7, wherein the power amplifier is configured to drive output at two or more different phases.

14. An ultrasound treatment system comprising:
an ultrasonic probe comprising a housing containing a piezoelectrically active ultrasound therapy transducer adapted to focus acoustic ultrasonic waves a depth from the housing in a focal zone in a tissue;
an electrical power system configured to provide electrical power to the ultrasound therapy transducer, the electrical power system comprising a power amplifier, wherein a signal driving at least one semiconductor transistor of the power amplifier is generated by comparing an output of a sinusoidal direct digital synthesis circuit to a DC voltage; and
an electrical power measurement system configured to monitor electrical output power from an output signal from the power amplifier,
wherein the power amplifier comprises:
a switch-mode amplifier circuit configured to generate digital waveforms to drive the at least one semiconductor transistor configured in an H-bridge configuration to drive the ultrasound therapy transducer;
a comparator circuit to generate an H-bridge drive signal for modulation of a gate of the at least one semiconductor transistor configured in the H-bridge configuration,
wherein the electrical power measurement system comprises:
a resistive current sensing circuit configured to monitor an electrical current output from the power amplifier; and
a resistive voltage sensing circuit configured to monitor an electrical voltage output from the power amplifier, and
wherein the electrical power measurement system is configured to monitor electrical output power from the power amplifier in a frequency range spanning at least two octaves for the ultrasound therapy transducer.

15. The ultrasound treatment system of claim 14, wherein the measurement system is configured to take multiple measurements at different relative phase shifts between the local oscillator and the power amplifier.

16. The ultrasound treatment system of claim 14, wherein the local oscillator clock is generated from an independently controlled direct digital synthesizer.

17. The ultrasound treatment system of claim 14, wherein the number of phase measurements is six.

18. The ultrasound treatment system of claim 14, wherein the measurement system is configured to take multiple measurements at local oscillator frequencies.

19. The ultrasound treatment system of claim 14, configured to modify a gate drive signal so as to achieve a desired harmonic content in the output signal.

* * * * *